United States Patent
Anderson et al.

(10) Patent No.: US 11,281,464 B2
(45) Date of Patent: Mar. 22, 2022

(54) METHOD AND APPARATUS TO SORT A VECTOR FOR A BITONIC SORTING ALGORITHM

(71) Applicant: Texas Instruments Incorporated, Dallas, TX (US)

(72) Inventors: Timothy David Anderson, University Park, TX (US); Mujibur Rahman, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/589,133

(22) Filed: Sep. 30, 2019

(65) Prior Publication Data

US 2020/0372099 A1 Nov. 26, 2020

Related U.S. Application Data

(60) Provisional application No. 62/852,870, filed on May 24, 2019.

(51) Int. Cl.
| | |
|---|---|
| *G06F 9/30* | (2018.01) |
| *G06F 7/24* | (2006.01) |
| *G06F 7/487* | (2006.01) |
| *G06F 7/499* | (2006.01) |
| *G06F 7/53* | (2006.01) |

(Continued)

(52) U.S. Cl.
CPC ............ *G06F 9/30036* (2013.01); *G06F 7/24* (2013.01); *G06F 7/487* (2013.01); *G06F 7/4876* (2013.01); *G06F 7/49915* (2013.01); *G06F 7/53* (2013.01); *G06F 7/57* (2013.01); *G06F 9/3001* (2013.01); *G06F 9/30021* (2013.01); *G06F 9/30032* (2013.01); *G06F 9/30145* (2013.01); *G06F 9/30149* (2013.01); *G06F 9/3818* (2013.01); *G06F 9/3836* (2013.01); *G06F 9/3851* (2013.01); *G06F 9/48* (2013.01); *G06F 17/16* (2013.01); *H03H 17/0664* (2013.01)

(58) Field of Classification Search
CPC .... G06F 9/30032; G06F 7/24; G06F 9/30021; G06F 9/30036; G06F 17/16
USPC ........................................................ 712/222
See application file for complete search history.

(56) References Cited

U.S. PATENT DOCUMENTS

| | | | |
|---|---|---|---|
| 3,428,946 A * | 2/1969 | Batcher ..................... | G06F 7/32 340/146.2 |
| 4,734,877 A * | 3/1988 | Sakata ................ | G06F 15/8053 708/441 |

(Continued)

OTHER PUBLICATIONS

Bitonic sorter. Wikipedia [online]. Jul. 2018 [retrieved Apr. 14, 2021]. Retrieved from the Internet: <https://web.archive.org/web/20180720070432/https://en.wikipedia.org/wiki/Bitonic_sorter>.*

(Continued)

*Primary Examiner* — Shawn Doman
(74) *Attorney, Agent, or Firm* — Charles F. Koch; Charles A. Brill; Frank D. Cimino

(57) ABSTRACT

A method is provided that includes performing, by a processor in response to a vector sort instruction, sorting of values stored in lanes of the vector to generate a sorted vector, wherein the values in a first portion of the lanes are sorted in a first order indicated by the vector sort instruction and the values in a second portion of the lanes are sorted in a second order indicated by the vector sort instruction; and storing the sorted vector in a storage location.

18 Claims, 37 Drawing Sheets

(51) Int. Cl.
*G06F 7/57* (2006.01)
*G06F 9/38* (2018.01)
*G06F 17/16* (2006.01)
*H03H 17/06* (2006.01)
*G06F 9/48* (2006.01)

(56) References Cited

U.S. PATENT DOCUMENTS

| | | | |
|---|---|---|---|
| 5,621,908 | A | 4/1997 | Akaboshi et al. |
| 6,088,353 | A * | 7/2000 | Even .................. G06F 7/24 340/2.21 |
| 6,606,686 | B1 | 8/2003 | Agarwala et al. |
| 9,788,011 | B2 | 10/2017 | Rahman et al. |
| 9,904,645 | B2 | 2/2018 | Thompson et al. |
| 2007/0156685 | A1 | 7/2007 | Inoue et al. |
| 2010/0312995 | A1* | 12/2010 | Sung .................. H04L 67/38 712/220 |
| 2011/0052059 | A1* | 3/2011 | Mathew .................. G06T 5/40 382/168 |
| 2011/0099214 | A1* | 4/2011 | Stortz .................. G06F 9/30021 708/201 |
| 2012/0086591 | A1* | 4/2012 | Suryono .................. H03M 1/0668 341/143 |
| 2014/0019713 | A1* | 1/2014 | Ould-Ahmed-Vall .................. G06F 9/30036 712/4 |
| 2014/0149715 | A1* | 5/2014 | Inman .................. G06F 15/17393 712/29 |
| 2015/0154024 | A1* | 6/2015 | Anderson .................. G06F 9/30036 712/208 |
| 2015/0269119 | A1* | 9/2015 | Sreedhar .................. G06F 9/30021 712/22 |
| 2015/0381346 | A1 | 12/2015 | Holden et al. |
| 2017/0168827 | A1 | 6/2017 | Mishra et al. |
| 2019/0138494 | A1* | 5/2019 | Inoue .................. G06F 7/36 |
| 2020/0210181 | A1* | 7/2020 | Ould-Ahmed-Vall .................. G06F 9/30123 |

OTHER PUBLICATIONS

Christopher, T. Bitonic Sort [online]. Jun. 2007 [retrieved Apr. 14, 2021]. Retrieved from the Internet: <https://web.archive.org/web/20070628052818/http://www.tools-of-computing.com/tc/CS/Sorts/bitonic_sort.htm>.*
"66AK2Hx Keystone Multicore DSP+ARM System-on-Chips", SPRT651A, Texas Instruments, Inc., 2013, pp. 1-3.
K. E. Batcher, "Sorting Networks and Their Applications", Proceedings of the AFIPS '68 (Spring), Spring Joint Computer Conference, Apr. 30-May 2, 1968, Atlantic City, NJ, pp. 307-314.
Timothy David Anderson, et al., Method and Apparatus for Vector Permutation, TI-77731, U.S. Appl. No. 16/551,587, filed Aug. 26, 2019, pp. 1-113.
PCT Search Report & Written Opinion dated Dec. 22, 2020.

* cited by examiner

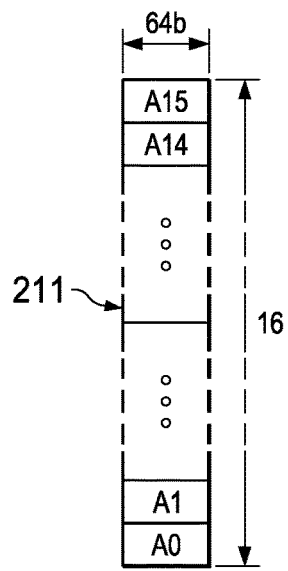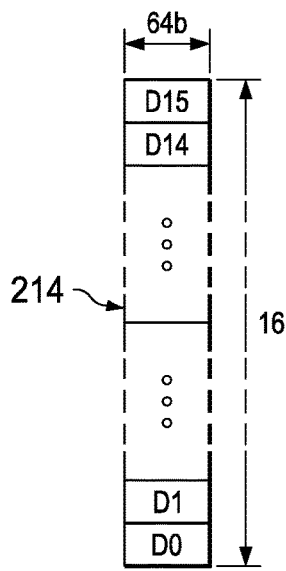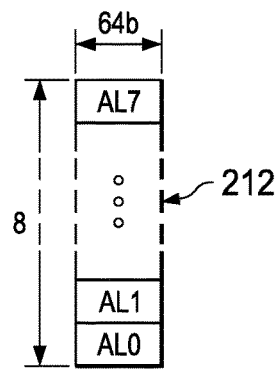
FIG. 3　　　FIG. 4　　　FIG. 5
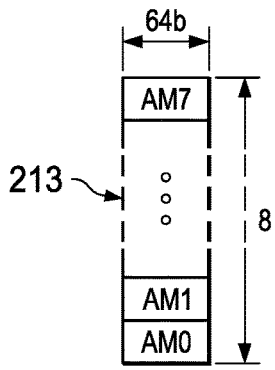
FIG. 6
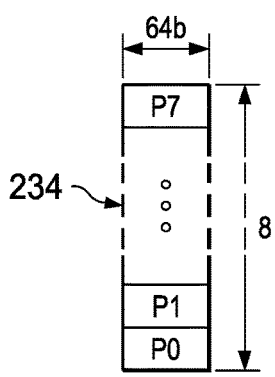
FIG. 8
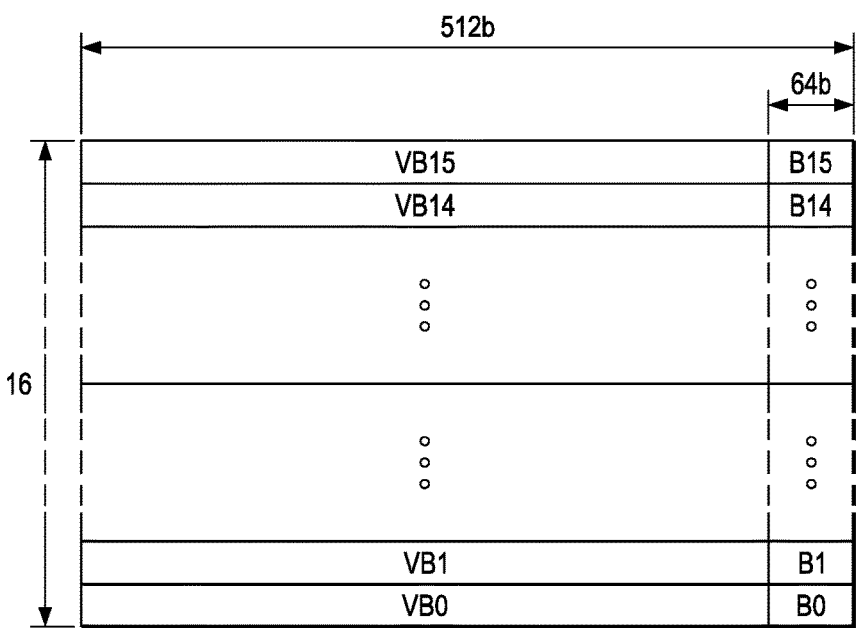
FIG. 7

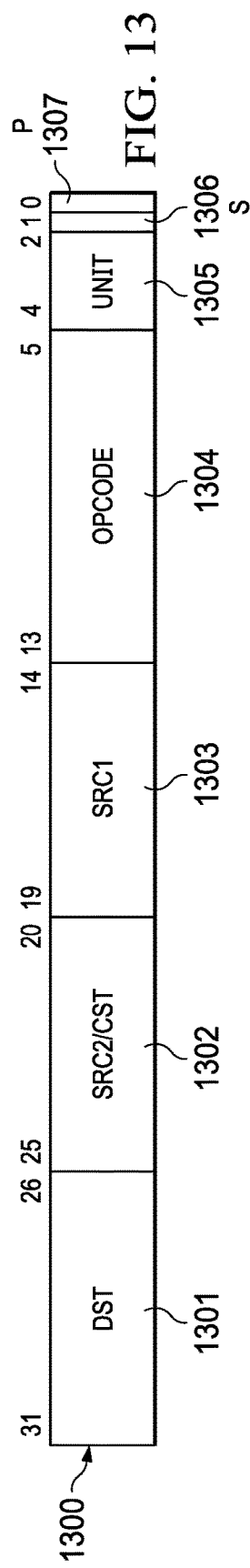
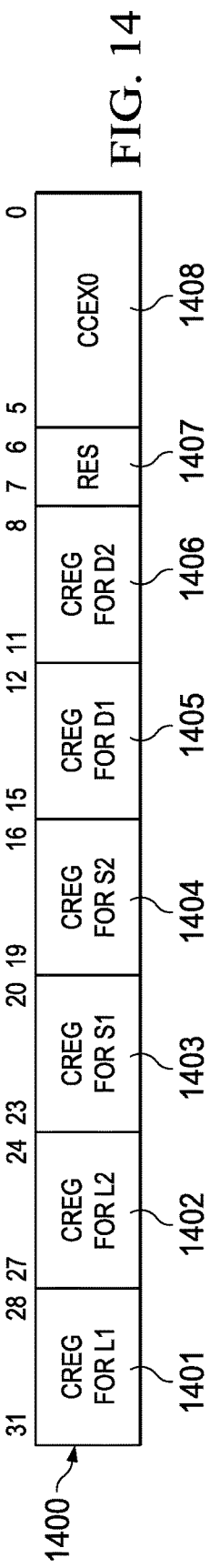
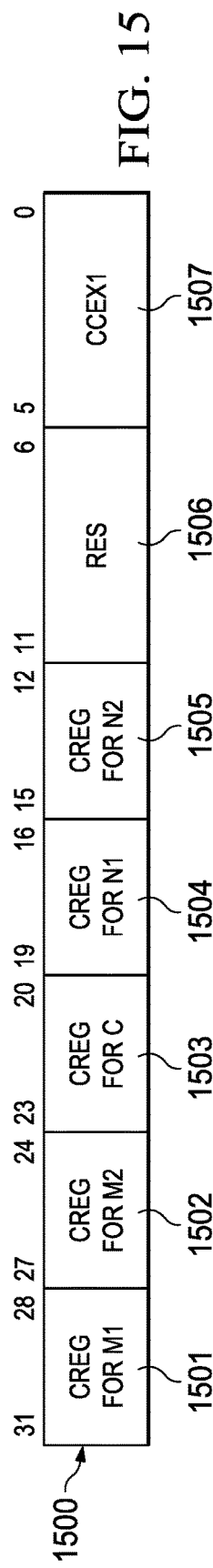
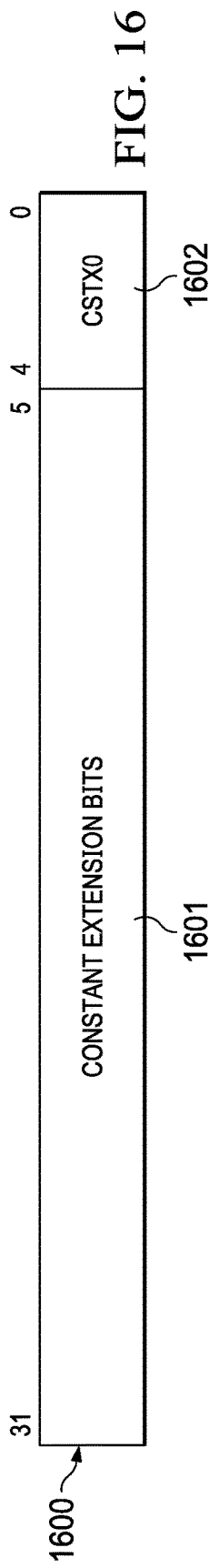

| 511 | 448 447 | 384 383 | 320 319 | 256 |
|---|---|---|---|---|
| LANE 7 | LANE 6 | LANE 5 | LANE 4 |

| 255 | 192 191 | 128 127 | 64 63 | 0 |
|---|---|---|---|---|
| LANE 3 | LANE 2 | LANE 1 | LANE 0 |

| 511 | 480 479 | 448 447 | 416 415 | 384 383 | 352 351 | 320 319 | 288 287 | 256 |
|---|---|---|---|---|---|---|---|---|
| LANE 15 | LANE 14 | LANE 13 | LANE 12 | LANE 11 | LANE 10 | LANE 9 | LANE 8 |

| 255 | 224 223 | 192 191 | 160 159 | 128 127 | 96 95 | 64 63 | 32 31 | 0 |
|---|---|---|---|---|---|---|---|---|
| LANE 7 | LANE 6 | LANE 5 | LANE 4 | LANE 3 | LANE 2 | LANE 1 | LANE 0 |

|     | r0      | r1       | r2       | r3       |
| --- | ------- | -------- | -------- | -------- |
| r0  | r0 < r0 | r0 <= r1 | r0 <= r2 | r0 <= r3 |
| r1  | r1 < r0 | r1 < r1  | r1 <= r2 | r1 <= r3 |
| r2  | r2 < r0 | r2 < r1  | r2 < r2  | r2 <= r3 |
| r3  | r3 < r0 | r3 < r1  | r3 < r2  | r3 < r3  |

4000

|     | r0      | r1        | r2        | r3        |
| --- | ------- | --------- | --------- | --------- |
| r0  | 0       | !(r1 < r0)| !(r2 < r0)| !(r3 < r0)|
| r1  | r1 < r0 | 0         | !(r2 < r1)| !(r3 < r1)|
| r2  | r2 < r0 | r2 < r1   | 0         | !(r3 < r2)|
| r3  | r3 < r0 | r3 < r1   | r3 < r2   | 0         |

| | r0 | r1 | r2 | r3 | r4 | r5 | r6 | r7 | r8 | r9 | r10 | r11 | r12 | r13 | r14 | r15 | r16 | r17 | r18 | r19 | r20 | r21 | r22 | r23 | r24 | r25 | r26 | r27 | r28 | r29 | r30 | r31 |
|---|---|---|---|---|---|---|---|---|---|---|---|---|---|---|---|---|---|---|---|---|---|---|---|---|---|---|---|---|---|---|---|---|
| SRC1 INPUT | r0 | r1 | r2 | r3 | r4 | r5 | r6 | r7 | r8 | r9 | r10 | r11 | r12 | r13 | r14 | r15 | r16 | r17 | r18 | r19 | r20 | r21 | r22 | r23 | r24 | r25 | r26 | r27 | r28 | r29 | r30 | r31 |
| ROW 0 | r0 | r1 | r2 | r3 | r4 | r5 | r6 | r7 | r8 | r9 | r10 | r11 | r12 | r13 | r14 | r15 | r16 | r17 | r18 | r19 | r20 | r21 | r22 | r23 | r24 | r25 | r26 | r27 | r28 | r29 | r30 | r31 |
| ROW 1 |  | r0 | r1 | r2 | r3 | r4 | r5 | r6 | r7 | r8 | r9 | r10 | r11 | r12 | r13 | r14 | r15 | r16 | r17 | r18 | r19 | r20 | r21 | r22 | r23 | r24 | r25 | r26 | r27 | r28 | r29 | r30 |
| ROW 2 |  |  | r0 | r1 | r2 | r3 | r4 | r5 | r6 | r7 | r8 | r9 | r10 | r11 | r12 | r13 | r14 | r15 | r16 | r17 | r18 | r19 | r20 | r21 | r22 | r23 | r24 | r25 | r26 | r27 | r28 | r29 |
| ROW 3 |  |  |  | r0 | r1 | r2 | r3 | r4 | r5 | r6 | r7 | r8 | r9 | r10 | r11 | r12 | r13 | r14 | r15 | r16 | r17 | r18 | r19 | r20 | r21 | r22 | r23 | r24 | r25 | r26 | r27 | r28 |
| ROW 4 |  |  |  |  | r0 | r1 | r2 | r3 | r4 | r5 | r6 | r7 | r8 | r9 | r10 | r11 | r12 | r13 | r14 | r15 | r16 | r17 | r18 | r19 | r20 | r21 | r22 | r23 | r24 | r25 | r26 | r27 |
| ROW 5 |  |  |  |  |  | r0 | r1 | r2 | r3 | r4 | r5 | r6 | r7 | r8 | r9 | r10 | r11 | r12 | r13 | r14 | r15 | r16 | r17 | r18 | r19 | r20 | r21 | r22 | r23 | r24 | r25 | r26 |
| ROW 6 |  |  |  |  |  |  | r0 | r1 | r2 | r3 | r4 | r5 | r6 | r7 | r8 | r9 | r10 | r11 | r12 | r13 | r14 | r15 | r16 | r17 | r18 | r19 | r20 | r21 | r22 | r23 | r24 | r25 |
| ROW 7 |  |  |  |  |  |  |  | r0 | r1 | r2 | r3 | r4 | r5 | r6 | r7 | r8 | r9 | r10 | r11 | r12 | r13 | r14 | r15 | r16 | r17 | r18 | r19 | r20 | r21 | r22 | r23 | r24 |
| ROW 8 |  |  |  |  |  |  |  |  | r0 | r1 | r2 | r3 | r4 | r5 | r6 | r7 | r8 | r9 | r10 | r11 | r12 | r13 | r14 | r15 | r16 | r17 | r18 | r19 | r20 | r21 | r22 | r23 |
| ROW 9 |  |  |  |  |  |  |  |  |  | r0 | r1 | r2 | r3 | r4 | r5 | r6 | r7 | r8 | r9 | r10 | r11 | r12 | r13 | r14 | r15 | r16 | r17 | r18 | r19 | r20 | r21 | r22 |
| ROW 10 |  |  |  |  |  |  |  |  |  |  | r0 | r1 | r2 | r3 | r4 | r5 | r6 | r7 | r8 | r9 | r10 | r11 | r12 | r13 | r14 | r15 | r16 | r17 | r18 | r19 | r20 | r21 |
| ROW 11 |  |  |  |  |  |  |  |  |  |  |  | r0 | r1 | r2 | r3 | r4 | r5 | r6 | r7 | r8 | r9 | r10 | r11 | r12 | r13 | r14 | r15 | r16 | r17 | r18 | r19 | r20 |
| ROW 12 |  |  |  |  |  |  |  |  |  |  |  |  | r0 | r1 | r2 | r3 | r4 | r5 | r6 | r7 | r8 | r9 | r10 | r11 | r12 | r13 | r14 | r15 | r16 | r17 | r18 | r19 |
| ROW 13 |  |  |  |  |  |  |  |  |  |  |  |  |  | r0 | r1 | r2 | r3 | r4 | r5 | r6 | r7 | r8 | r9 | r10 | r11 | r12 | r13 | r14 | r15 | r16 | r17 | r18 |
| ROW 14 |  |  |  |  |  |  |  |  |  |  |  |  |  |  | r0 | r1 | r2 | r3 | r4 | r5 | r6 | r7 | r8 | r9 | r10 | r11 | r12 | r13 | r14 | r15 | r16 | r17 |
| ROW 15 |  |  |  |  |  |  |  |  |  |  |  |  |  |  |  | r0 | r1 | r2 | r3 | r4 | r5 | r6 | r7 | r8 | r9 | r10 | r11 | r12 | r13 | r14 | r15 | r16 |

METHOD AND APPARATUS TO SORT A VECTOR FOR A BITONIC SORTING ALGORITHM

CROSS-REFERENCE TO RELATED APPLICATIONS

This application claims benefit of U.S. Provisional Patent Application No. 62/852,870 filed May 24, 2019, which is incorporated herein by reference in its entirety.

BACKGROUND

Digital signal processors (DSP) are optimized for processing streams of data that may be derived from various input signals, such as sensor data, a video stream, a voice channel, radar signals, biomedical signals, etc. Digital signal processors operating on real-time data typically receive an input data stream, perform a filter function on the data stream (such as encoding or decoding) and output a transformed data stream. The system is called real-time because the application fails if the transformed data stream is not available for output when scheduled. Typical video encoding requires a predictable but non-sequential input data pattern. A typical application requires memory access to load data registers in a data register file and then supply data from the data registers to functional units which perform the data processing.

One or more DSP processing cores can be combined with various peripheral circuits, blocks of memory, etc. on a single integrated circuit (IC) die to form a system on chip (SoC). These systems can include multiple interconnected processors that share the use of on-chip and off-chip memory. A processor can include some combination of instruction cache (ICache) and data cache (DCache) to improve processing. Furthermore, multiple processors with shared memory can be incorporated in a single embedded system. The processors can physically share the same memory without accessing data or executing code located in the same memory locations or can use some portion of the shared memory as common shared memory.

SUMMARY

Embodiments of the present disclosure relate to methods and apparatus for vector sorting. In one aspect, a method is provided that includes performing, by a processor in response to a vector sort instruction, sorting of values stored in lanes of the vector to generate a sorted vector, wherein the values in a first portion of the lanes are sorted in a first order indicated by the vector sort instruction and the values in a second portion of the lanes are sorted in a second order indicated by the vector sort instruction, and storing the sorted vector in a storage location.

In one aspect, a processor is provided that includes comparator logic configured to compare values in lanes of a vector responsive to a vector sort instruction, and vector sort logic configured to sort the values as indicated by the vector sort instruction to generate a sorted vector based on results of comparing the values by the comparator logic, wherein the values in a first portion of the lanes are sorted in a first order indicated by the vector sort instruction and the values in a second portion of the lanes are sorted in a second order indicated by the vector sort instruction.

BRIEF DESCRIPTION OF THE DRAWINGS

FIG. 3 illustrates a global scalar register file;

FIG. 4 illustrates a local scalar register file shared by arithmetic functional units;

FIG. 5 illustrates a local scalar register file shared by multiply functional units;

FIG. 6 illustrates a local scalar register file shared by load/store units;

FIG. 7 illustrates a global vector register file;

FIG. 8 illustrates a predicate register file;

FIG. 13 illustrates an example of the instruction coding;

FIG. 14 illustrates bit coding of a condition code extension slot 0;

FIG. 15 illustrates bit coding of a condition code extension slot 1;

FIG. 16 illustrates bit coding of a constant extension slot 0;

FIG. 21 illustrates an example of lane allocation in a vector;

FIG. 22 illustrates an example of lane allocation in a vector;

FIG. 30 illustrates sub-field definitions of the flags field of the example stream template register of FIG. 29;

FIGS. 40 and 41 illustrate a modified "brute force" approach for comparisons used to implement sort instructions;

FIG. 48 illustrates modifications to the inputs of FIG. 47 to perform the comparisons for dual sort instructions;

FIG. 50 illustrates the inputs to the array of absolute difference elements of the SAD logic of FIG. 45 when vector elements are 32-bit quantities;

DETAILED DESCRIPTION

Figure 1:
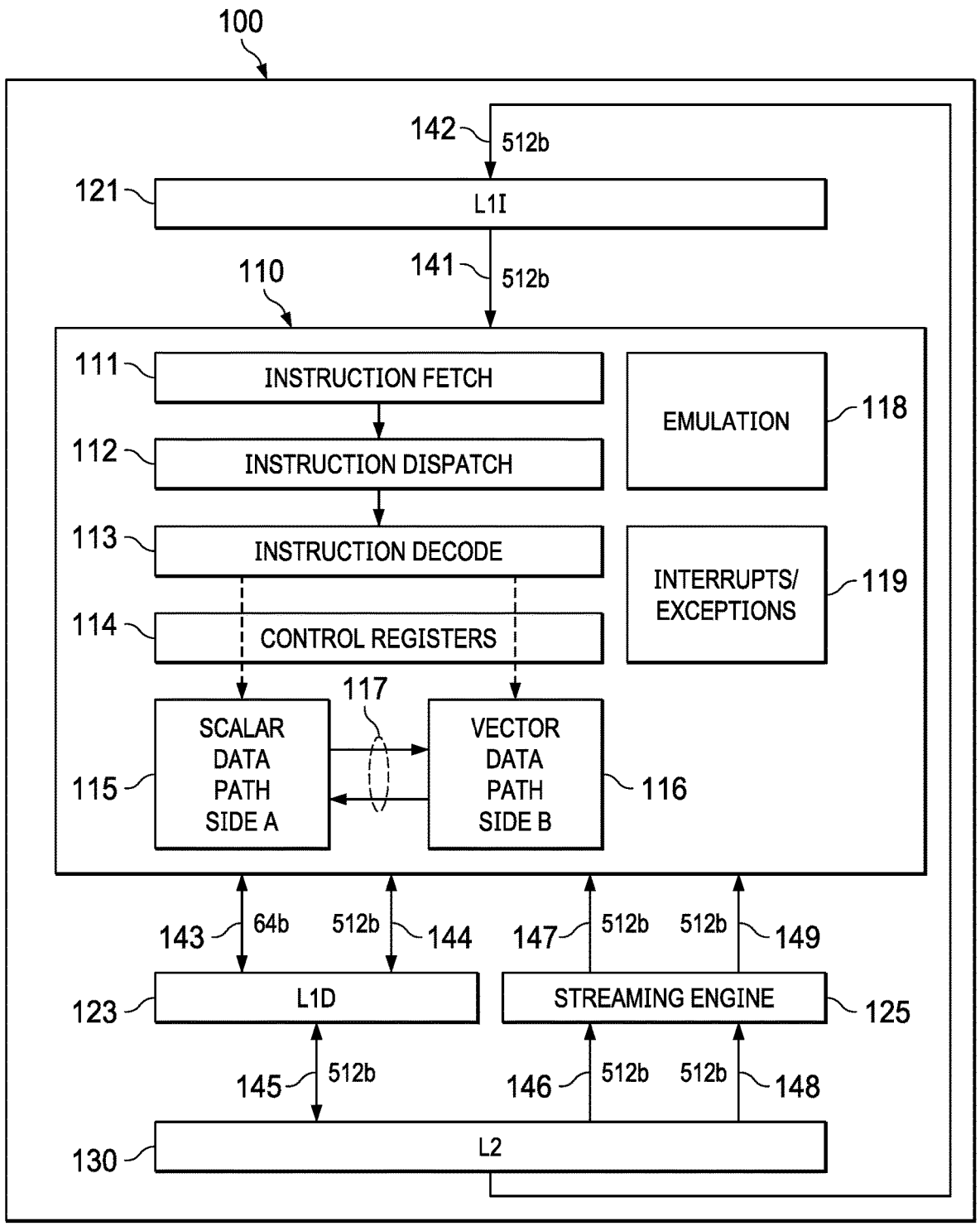
FIG. 1 illustrates an example dual scalar/vector data path processor.

Like elements in the various figures are denoted by like reference numerals for consistency.

Digital signal processors (DSP) are optimized for processing streams of data that can be derived from various input signals, such as sensor data, a video stream, a voice channel, radar signals, biomedical signals, etc. Memory bandwidth and scheduling are concerns for digital signal processors operating on real-time data. An example DSP processing core is described herein that includes a streaming engine to improve memory bandwidth and data scheduling.

One or more DSP processing cores can be combined with various peripheral circuits, blocks of memory, etc. on a single integrated circuit (IC) die to form a system on chip (SoC). See, for example, "66AK2Hx Multicore Keystone™ DSP+ARM® System-on-Chips," 2013 which is incorporated by reference herein.

In the example DSP core described herein, an autonomous streaming engine (SE) is coupled to the DSP. In this example, the streaming engine includes two closely coupled streaming engines that can manage two data streams simultaneously. In another example, the streaming engine is capable of managing only a single stream, while in other examples the streaming engine is capable of handling more than two streams. In each case, for each stream, the streaming engine includes an address generation stage, a data formatting stage, and some storage for formatted data waiting for consumption by the processor. In the examples described herein, addresses are derived from algorithms that can involve multi-dimensional loops, each dimension maintaining an iteration count. In one example, the streaming engine supports six levels of nested iteration. In other examples, more or fewer levels of iteration are supported.

An example DSP processor is described in detail herein with reference to FIGS. 1-18. An example streaming engine capable of managing two data streams using six-dimensional nested loops is described in detail herein with reference to FIGS. 19-35.

Further, in the example DSP core described herein, instruction support is provided for sorting of elements of vectors. Examples of instruction support for vector sorting are described herein in reference to FIGS. 36-54.

FIG. 1 illustrates an example processor 100 that includes dual scalar/vector data paths 115, 117. Processor 100 includes a streaming engine 125 that is described in more detail herein. Processor 100 includes separate level one instruction cache (L1I) 121 and level one data cache (L1 D) 123. Processor 100 includes a level 2 (L2) combined instruction/data cache 130 that holds both instructions and data. FIG. 1 illustrates connection between L1I cache and L2 combined instruction/data cache 130, 512-bit bus 142. FIG. 1 illustrates the connection between L1D cache 123 and L2 combined instruction/data cache 130, 512-bit bus 145. In the example processor 100, L2 combined instruction/data cache 130 stores both instructions to back up L1I cache 121 and data to back up L1D cache 123. In this example, L2 combined instruction/data cache 130 is further connected to higher level cache and/or main memory using known or later developed memory system techniques not illustrated in FIG. 1. As used herein, the term "higher level" memory or cache refers to a next level in a memory hierarchy that is more distant from the processor, while the term "lower level" memory or cache refers to a level in the memory hierarchy that is closer to the processor. L1I cache 121, L1D cache 123, and L2 cache 130 may be implemented in different sizes in various examples. In this example, L1I cache 121 and L1D cache 123 are each 32K bytes, and L2 cache 130 is 1024K bytes. In the example processor 100, L1I cache 121, L1D cache 123 and L2 combined instruction/data cache 130 are formed on a single integrated circuit. This single integrated circuit optionally includes other circuits.

Processing unit core 110 fetches instructions from L1I cache 121 as controlled by instruction fetch unit 111. Instruction fetch unit 111 determines the next instructions to be executed and recalls a fetch packet sized set of such instructions. The nature and size of fetch packets are further detailed below. Instructions are directly fetched from L1I cache 121 upon a cache hit if the instructions are stored in L1I cache 121. Upon a cache miss occurring when the specified instructions are not stored in L1I cache 121, the instructions are sought in L2 combined cache 130. In this example, the size of a cache line in L1I cache 121 equals the size of a fetch packet which is 512 bits. The memory locations of these instructions are either a hit in L2 combined cache 130 or a miss. A hit is serviced from L2 combined cache 130. A miss is serviced from a higher level of cache (not illustrated) or from main memory (not illustrated). In this example, the requested instruction is simultaneously supplied to both L1I cache 121 and processing unit core 110 to speed use.

In this example, processing unit core 110 includes multiple functional units to perform instruction specified data processing tasks. Instruction dispatch unit 112 determines the target functional unit of each fetched instruction. In this example, processing unit 110 operates as a very long instruction word (VLIW) processor capable of operating on multiple instructions in corresponding functional units simultaneously. A complier organizes instructions in execute packets that are executed together. Instruction dispatch unit 112 directs each instruction to its target functional unit. The functional unit assigned to an instruction is completely specified by the instruction produced by the compiler. The hardware of processing unit core 110 has no part in the functional unit assignment. In this example, instruction dispatch unit 112 operates on several instructions in parallel. The number of such parallel instructions is set by the size of the execute packet. This is further described herein.

One part of the dispatch task of instruction dispatch unit 112 is determining whether the instruction is to execute on a functional unit in scalar data path side A 115 or vector data path side B 116. An instruction bit within each instruction called the s bit determines which data path the instruction controls. This is further described herein.

Instruction decode unit 113 decodes each instruction in a current execute packet. Decoding includes identification of the functional unit performing the instruction, identification of registers used to supply data for the corresponding data processing operation from among possible register files, and identification of the register destination of the results of the corresponding data processing operation. As further explained below, instructions can include a constant field in place of one register number operand field. The result of this decoding are signals for control of the target functional unit to perform the data processing operation specified by the corresponding instruction on the specified data.

Processing unit core 110 includes control registers 114. Control registers 114 store information for control of the functional units in scalar data path side A 115 and vector data path side B 116. This information may include mode information or the like.

The decoded instructions from instruction decode 113 and information stored in control registers 114 are supplied to scalar data path side A 115 and vector data path side B 116. As a result, functional units within scalar data path side A 115 and vector data path side B 116 perform instruction specified data processing operations upon instruction specified data and store the results in an instruction specified data register or registers. Each of scalar data path side A 115 and vector data path side B 116 include multiple functional units that operate in parallel. These are further described below in conjunction with FIG. 2. There is a data path 117 between scalar data path side A 115 and vector data path side B 116 permitting data exchange.

Processing unit core 110 includes further non-instruction-based modules. Emulation unit 118 permits determination of the machine state of processing unit core 110 in response to instructions. This capability can be employed for algorithmic development. Interrupts/exceptions unit 119 enables processing unit core 110 to be responsive to external, asynchronous events (interrupts) and to respond to attempts to perform improper operations (exceptions).

Processor 100 includes streaming engine 125. Streaming engine 125 supplies two data streams from predetermined addresses cached in L2 combined cache 130 to register files of vector data path side B of processing unit core 110. This provides controlled data movement from memory (as cached in L2 combined cache 130) directly to functional unit operand inputs. This is further described herein.

FIG. 1 illustrates example data widths of busses between various parts. L1I cache 121 supplies instructions to instruction fetch unit 111 via bus 141. Bus 141 is a 512-bit bus in this example. Bus 141 is unidirectional from L1I cache 121 to processing unit 110. L2 combined cache 130 supplies instructions to L1I cache 121 via bus 142. Bus 142 is a 512-bit bus in this example. Bus 142 is unidirectional from L2 combined cache 130 to L1I cache 121.

L1D cache 123 exchanges data with register files in scalar data path side A 115 via bus 143. Bus 143 is a 64-bit bus in this example. L1D cache 123 exchanges data with register files in vector data path side B 116 via bus 144. Bus 144 is a 512-bit bus in this example. Busses 143 and 144 are illustrated as bidirectional supporting both processing unit core 110 data reads and data writes. L1D cache 123 exchanges data with L2 combined cache 130 via bus 145. Bus 145 is a 512-bit bus in this example. Bus 145 is illustrated as bidirectional supporting cache service for both processing unit core 110 data reads and data writes.

Processor data requests are directly fetched from L1D cache 123 upon a cache hit (if the requested data is stored in L1D cache 123). Upon a cache miss (the specified data is not stored in L1D cache 123), the data is sought in L2 combined cache 130. The memory locations of the requested data are either a hit in L2 combined cache 130 or a miss. A hit is serviced from L2 combined cache 130. A miss is serviced from another level of cache (not illustrated) or from main memory (not illustrated). The requested data may be simultaneously supplied to both L1D cache 123 and processing unit core 110 to speed use.

L2 combined cache 130 supplies data of a first data stream to streaming engine 125 via bus 146. Bus 146 is a 512-bit bus in this example. Streaming engine 125 supplies data of the first data stream to functional units of vector data path side B 116 via bus 147. Bus 147 is a 512-bit bus in this example. L2 combined cache 130 supplies data of a second data stream to streaming engine 125 via bus 148. Bus 148 is a 512-bit bus in this example. Streaming engine 125 supplies data of this second data stream to functional units of vector data path side B 116 via bus 149, which is a 512-bit bus in this example. Busses 146, 147, 148 and 149 are illustrated as unidirectional from L2 combined cache 130 to streaming engine 125 and to vector data path side B 116 in accordance with this example.

Streaming engine data requests are directly fetched from L2 combined cache 130 upon a cache hit (if the requested data is stored in L2 combined cache 130). Upon a cache miss (the specified data is not stored in L2 combined cache 130), the data is sought from another level of cache (not illustrated) or from main memory (not illustrated). It is technically feasible in some examples for L1D cache 123 to cache data not stored in L2 combined cache 130. If such operation is supported, then upon a streaming engine data request that is a miss in L2 combined cache 130, L2 combined cache 130 snoops L1D cache 123 for the stream engine requested data. If L1D cache 123 stores the data, the snoop response includes the data, which is then supplied to service the streaming engine request. If L1D cache 123 does not store the data, the snoop response indicates this and L2 combined cache 130 services the streaming engine request from another level of cache (not illustrated) or from main memory (not illustrated).

In this example, both L1D cache 123 and L2 combined cache 130 can be configured as selected amounts of cache or directly addressable memory in accordance with U.S. Pat. No. 6,606,686 entitled Unified Memory System Architecture Including Cache and Directly Addressable Static Random Access Memory, which is incorporated by reference herein.

In this example, processor 100 is fabricated on an integrated chip (IC) that is mounted on a ball grid array (BGA) substrate. A BGA substrate and IC die together may be referred to as "BGA package," "IC package," "integrated circuit," "IC," "chip," "microelectronic device," or similar terminology. The BGA package may include encapsulation material to cover and protect the IC die from damage. In another example, other types of known or later developed packaging techniques may be used with processor 100.

Figure 2:
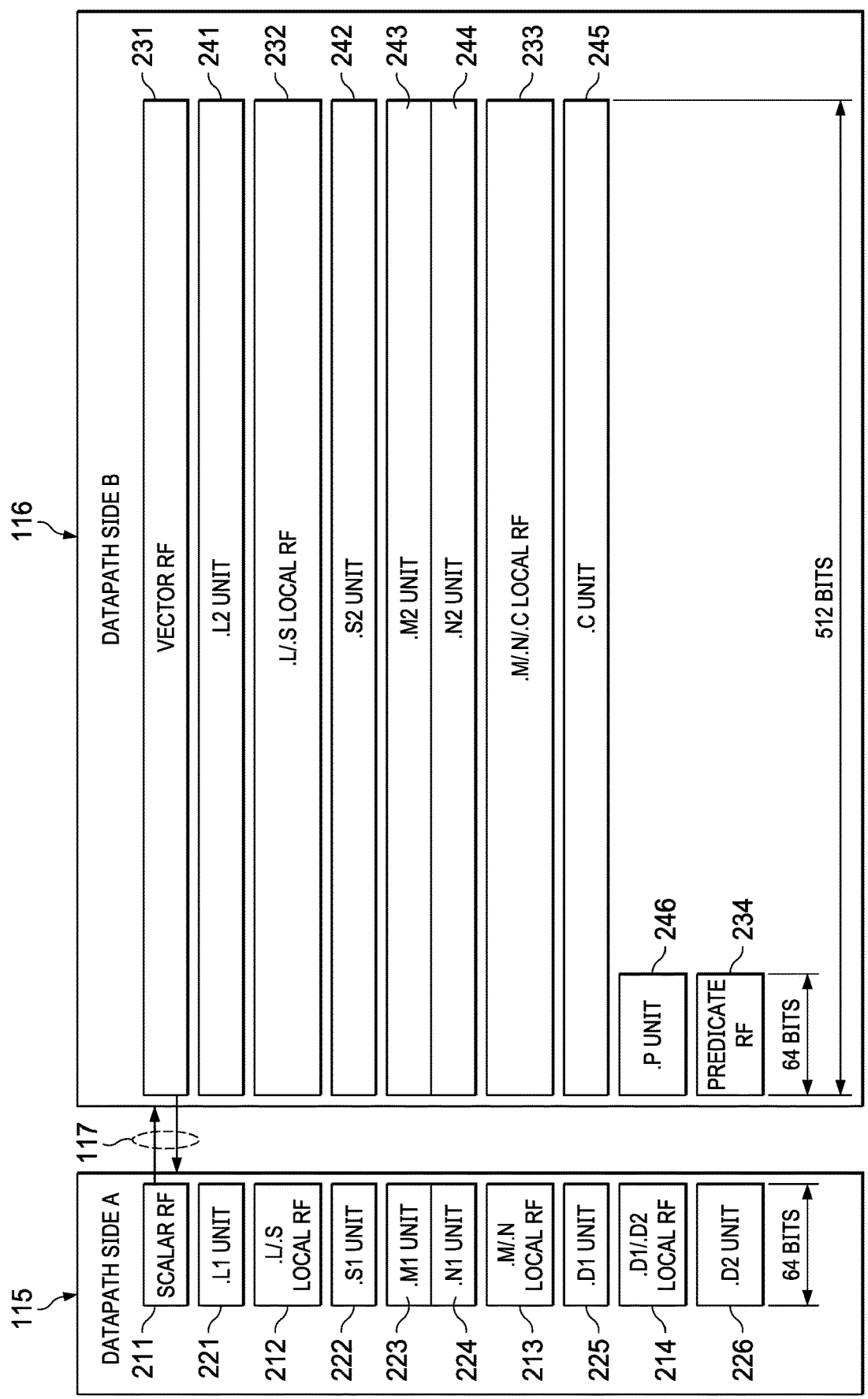
FIG. 2 illustrates the registers and functional units in the dual scalar/vector data path processor illustrated in FIG. 1.

FIG. 2 illustrates further details of functional units and register files within scalar data path side A 115 and vector data path side B 116. Scalar data path side A 115 includes L1 unit 221, S1 unit 222, M1 unit 223, N1 unit 224, D1 unit 225 and D2 unit 226. Scalar data path side A 115 includes global scalar register file 211, L1/S1 local register file 212, M1/N1 local register file 213 and D1/D2 local register file 214. Vector data path side B 116 includes L2 unit 241, S2 unit 242, M2 unit 243, N2 unit 244, C unit 245 and P unit 246. Vector data path side B 116 includes global vector register file 231, L2/S2 local register file 232, M2/N2/C local register file 233 and predicate register file 234. Which functional units can read from or write to which register files is described in more detail herein.

Scalar data path side A 115 includes L1 unit 221. L1 unit 221 generally accepts two 64-bit operands and produces one 64-bit result. The two operands are each recalled from an instruction specified register in either global scalar register file 211 or L1/S1 local register file 212. L1 unit 221 performs the following instruction selected operations: 64-bit add/subtract operations; 32-bit min/max operations; 8-bit Single Instruction Multiple Data (SIMD) instructions such as sum of absolute value, minimum and maximum determinations; circular min/max operations; and various move operations between register files. The result is written into an instruction specified register of global scalar register file 211, L1/S1 local register file 212, M1/N1 local register file 213 or D1/D2 local register file 214.

Scalar data path side A 115 includes S1 unit 222. S1 unit 222 generally accepts two 64-bit operands and produces one 64-bit result. The two operands are each recalled from an instruction specified register in either global scalar register file 211 or L1/S1 local register file 212. In this example, S1 unit 222 performs the same type operations as L1 unit 221. In another example, there may be slight variations between the data processing operations supported by L1 unit 221 and S1 unit 222. The result is written into an instruction specified register of global scalar register file 211, L1/S1 local register file 212, M1/N1 local register file 213 or D1/D2 local register file 214.

Scalar data path side A 115 includes M1 unit 223. M1 unit 223 generally accepts two 64-bit operands and produces one 64-bit result. The two operands are each recalled from an instruction specified register in either global scalar register file 211 or M1/N1 local register file 213. Examples of the instruction selected operations performed by the example M1 unit 223 include 8-bit, 16-bit, and 32-bit multiply operations, Galois field multiplication, complex multiplication with and without rounding, IEEE floating point multiply operations, complex dot product operations, 32-bit bit count operations, complex conjugate multiply operations, and bitwise logical operations, moves, adds and subtracts. The result is written into an instruction specified register of global scalar register file 211, L1/S1 local register file 212, M1/N1 local register file 213 or D1/D2 local register file 214.

Scalar data path side A 115 includes N1 unit 224. N1 unit 224 generally accepts two 64-bit operands and produces one 64-bit result. The two operands are each recalled from an instruction specified register in either global scalar register file 211 or M1/N1 local register file 213. In this example, N1 unit 224 performs the same type operations as M1 unit 223. There are also double operations (called dual issued instructions) that employ both the M1 unit 223 and the N1 unit 224 together. The result is written into an instruction specified register of global scalar register file 211, L1/S1 local register file 212, M1/N1 local register file 213 or D1/D2 local register file 214.

Scalar data path side A 115 includes D1 unit 225 and D2 unit 226. D1 unit 225 and D2 unit 226 generally each accept two 64-bit operands and each produce one 64-bit result. D1 unit 225 and D2 unit 226 generally perform address calculations and corresponding load and store operations. D1 unit 225 is used for scalar loads and stores of 64 bits. D2 unit 226 is used for vector loads and stores of 512 bits. In this example, D1 unit 225 and D2 unit 226 also perform: swapping, pack and unpack on the load and store data; 64-bit SIMD arithmetic operations; and 64-bit bit-wise logical operations. D1/D2 local register file 214 stores base and offset addresses used in address calculations for the corresponding loads and stores. The two operands are each recalled from an instruction specified register in either global scalar register file 211 or D1/D2 local register file 214. The calculated result is written into an instruction specified register of global scalar register file 211, L1/S1 local register file 212, M1/N1 local register file 213 or D1/D2 local register file 214.

Vector data path side B 116 includes L2 unit 241. L2 unit 241 generally accepts two 512-bit operands and produces one 512-bit result. The two operands are each recalled from an instruction specified register in either global vector register file 231, L2/S2 local register file 232 or predicate register file 234. In this example, L2 unit 241 performs instruction similar to L1 unit 221 except on wider 512-bit data. The result may be written into an instruction specified register of global vector register file 231, L2/S2 local register file 232, M2/N2/C local register file 233 or predicate register file 234.

Vector data path side B 116 includes S2 unit 242. S2 unit 242 generally accepts two 512-bit operands and produces one 512-bit result. The two operands are each recalled from an instruction specified register in either global vector register file 231, L2/S2 local register file 232 or predicate register file 234. In this example, S2 unit 242 performs instructions similar to S1 unit 222. The result is written into an instruction specified register of global vector register file 231, L2/S2 local register file 232, M2/N2/C local register file 233 or predicate register file 234.

Vector data path side B 116 includes M2 unit 243. M2 unit 243 generally accepts two 512-bit operands and produces one 512-bit result. The two operands are each recalled from an instruction specified register in either global vector register file 231 or M2/N2/C local register file 233. In this example, M2 unit 243 performs instructions similar to M1 unit 223 except on wider 512-bit data. The result is written into an instruction specified register of global vector register file 231, L2/S2 local register file 232 or M2/N2/C local register file 233.

Vector data path side B 116 includes N2 unit 244. N2 unit 244 generally accepts two 512-bit operands and produces one 512-bit result. The two operands are each recalled from an instruction specified register in either global vector register file 231 or M2/N2/C local register file 233. In this example, N2 unit 244 performs the same type operations as M2 unit 243. There are also double operations (called dual issued instructions) that employ both M2 unit 243 and the N2 unit 244 together. The result is written into an instruction specified register of global vector register file 231, L2/S2 local register file 232 or M2/N2/C local register file 233.

Vector data path side B 116 includes correlation (C) unit 245. C unit 245 generally accepts two 512-bit operands and produces one 512-bit result. The two operands are each recalled from an instruction specified register in either global vector register file 231 or M2/N2/C local register file 233. In this example, C unit 245 performs "Rake" and "Search" instructions that are used for WCDMA (wideband code division multiple access) encoding/decoding. In this example, C unit 245 can perform up to 512 multiples per clock cycle of a 2-bit PN (pseudorandom number) and 8-bit I/Q (complex number), 8-bit and 16-bit Sum-of-Absolute-Difference (SAD) calculations, up to 512 SADs per clock cycle, horizontal add and horizontal min/max instructions, and vector permutes instructions. C unit 245 also contains 4 vector control registers (CUCR0 to CUCR3) used to control certain operations of C unit 245 instructions. Control registers CUCR0 to CUCR3 are used as operands in certain C unit 245 operations. In some examples, control registers CUCR0 to CUCR3 are used in control of a general permutation instruction (VPERM), and as masks for SIMD multiple DOT product operations (DOTPM) and SIMD multiple Sum-of-Absolute-Difference (SAD) operations. In further examples, control register CUCR0 is used to store the polynomials for Galois Field Multiply operations (GFMPY) and control register CUCR1 is used to store the Galois field polynomial generator function.

Vector data path side B 116 includes P unit 246. Vector predicate (P) unit 246 performs basic logic operations on registers of local predicate register file 234. P unit 246 has direct access to read from and write to predication register file 234. The logic operations include single register unary operations such as NEG (negate) which inverts each bit of the single register, BITCNT (bit count) which returns a count of the number of bits in the single register having a predetermined digital state (1 or 0), RMBD (right most bit detect) which returns a number of bit positions from the least significant bit position (right most) to a first bit position having a predetermined digital state (1 or 0), DECIMATE which selects every instruction specified Nth (1, 2, 4, etc.) bit to output, and EXPAND which replicates each bit an instruction specified N times (2, 4, etc.). The logic operations also include two register binary operations such as AND which is a bitwise AND of data of the two registers, NAND which is a bitwise AND and negate of data of the two registers, OR which is a bitwise OR of data of the two registers, NOR which is a bitwise OR and negate of data of the two registers, and XOR which is exclusive OR of data of the two registers. The logic operations include transfer of data from a predicate register of predicate register file 234 to another specified predicate register or to a specified data register in global vector register file 231. One use of P unit 246 is manipulation of the SIMD vector comparison results for use in control of a further SIMD vector operation. The BITCNT instruction can be used to count the number of 1's in a predicate register to determine the number of valid data elements from a predicate register.

FIG. 3 illustrates global scalar register file 211. There are 16 independent 64-bit wide scalar registers designated A0 to A15. Each register of global scalar register file 211 can be read from or written to as 64-bits of scalar data. All scalar data path side A 115 functional units (L1 unit 221, S1 unit 222, M1 unit 223, N1 unit 224, D1 unit 225 and D2 unit 226) can read or write to global scalar register file 211. Global scalar register file 211 can be read from as 32-bits or as 64-bits and written to as 64-bits. The instruction executing determines the read data size. Vector data path side B 116 functional units (L2 unit 241, S2 unit 242, M2 unit 243, N2 unit 244, C unit 245 and P unit 246) can read from global scalar register file 211 via cross path 117 under restrictions that are described below.

FIG. 4 illustrates D1/D2 local register file 214. There are sixteen independent 64-bit wide scalar registers designated D0 to D16. Each register of D1/D2 local register file 214 is read from or written to as 64-bits of scalar data. All scalar data path side A 115 functional units (L1 unit 221, S1 unit 222, M1 unit 223, N1 unit 224, D1 unit 225 and D2 unit 226) can write to global scalar register file 211. Only D1 unit 225 and D2 unit 226 can read from D1/D2 local scalar register file 214. Data stored in D1/D2 local scalar register file 214 can include base addresses and offset addresses used in address calculation.

FIG. 5 illustrates L1/S1 local register file 212. In this example, L1/S1 local register file 212 includes eight independent 64-bit wide scalar registers designated AL0 to AL7. In this example, the instruction coding permits L1/S1 local register file 212 to include up to 16 registers. In this example, eight registers are implemented to reduce circuit size and complexity. Each register of L1/S1 local register file 212 can be read from or written to as 64-bits of scalar data. All scalar data path side A 115 functional units (L1 unit 221, S1 unit 222, M1 unit 223, N1 unit 224, D1 unit 225 and D2 unit 226) can write to L1/S1 local scalar register file 212. L1 unit 221 and S1 unit 222 can read from L1/S1 local scalar register file 212.

FIG. 6 illustrates M1/N1 local register file 213. In this example, eight independent 64-bit wide scalar registers designated AM0 to AM7 are implemented. In this example, the instruction coding permits M1/N1 local register file 213 to include up to 16 registers. In this example, eight registers are implemented to reduce circuit size and complexity. Each register of M1/N1 local register file 213 can be read from or written to as 64-bits of scalar data. All scalar data path side A 115 functional units (L1 unit 221, S1 unit 222, M1 unit 223, N1 unit 224, D1 unit 225 and D2 unit 226) can write to M1/N1 local scalar register file 213. M1 unit 223 and N1 unit 224 can read from M1/N1 local scalar register file 213.

FIG. 7 illustrates global vector register file 231. There are sixteen independent 512-bit wide vector registers. Each register of global vector register file 231 can be read from or written to as 64-bits of scalar data designated B0 to B15. Each register of global vector register file 231 can be read from or written to as 512-bits of vector data designated VB0 to VB15. The instruction type determines the data size. All vector data path side B 116 functional units (L2 unit 241, S2 unit 242, M2 unit 243, N2 unit 244, C unit 245 and P unit 246) can read or write to global vector register file 231. Scalar data path side A 115 functional units (L1 unit 221, S1 unit 222, M1 unit 223, N1 unit 224, D1 unit 225 and D2 unit 226) can read from global vector register file 231 via cross path 117 under restrictions that are described below.

FIG. 8 illustrates predicate (P) local register file 234. There are eight independent 64-bit wide registers designated P0 to P7. Each register of P local register file 234 can be read from or written to as 64-bits of scalar data. Vector data path side B 116 functional units L2 unit 241, S2 unit 242, C unit 244 and P unit 246 can write to P local register file 234. L2 unit 241, S2 unit 242 and P unit 246 can read from P local scalar register file 234. One use of P local register file 234 is writing one-bit SIMD vector comparison results from L2 unit 241, S2 unit 242 or C unit 244, manipulation of the SIMD vector comparison results by P unit 246, and use of the manipulated results in control of a further SIMD vector operation.

Figure 9:
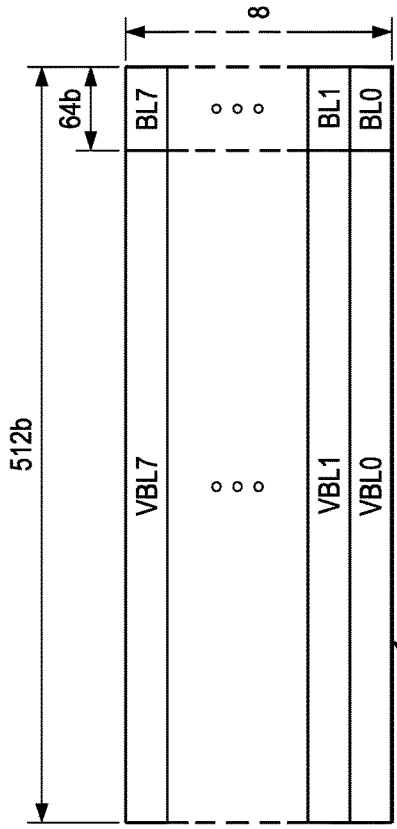
FIG. 9 illustrates a local vector register file shared by arithmetic functional units.

FIG. 9 illustrates L2/S2 local register file 232. In this example, eight independent 512-bit wide vector registers are implemented. In this example, the instruction coding permits L2/S2 local register file 232 to include up to sixteen registers. In this example, eight registers are implemented to reduce circuit size and complexity. Each register of L2/S2 local vector register file 232 can be read from or written to as 64-bits of scalar data designated BL0 to BL7. Each register of L2/S2 local vector register file 232 can be read from or written to as 512-bits of vector data designated VBL0 to VBL7. The instruction type determines the data size. All vector data path side B 116 functional units (L2 unit 241, S2 unit 242, M2 unit 243, N2 unit 244, C unit 245 and P unit 246) can write to L2/S2 local vector register file 232. L2 unit 241 and S2 unit 242 can read from L2/S2 local vector register file 232.

Figure 10:
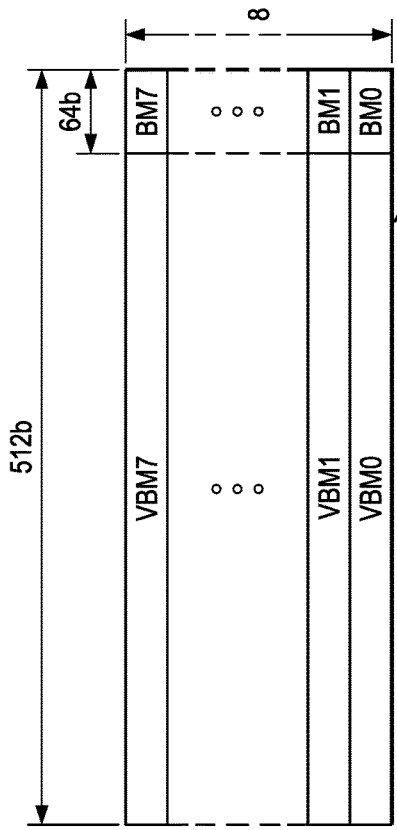
FIG. 10 illustrates a local vector register file shared by multiply and correlation functional units.

FIG. 10 illustrates M2/N2/C local register file 233. In this example, eight independent 512-bit wide vector registers are implemented. In this example, the instruction coding permits M2/N2/C local register file 233 to include up to sixteen registers. In this example, eight registers are implemented to reduce circuit size and complexity. Each register of M2/N2/C local vector register file 233 can be read from or written to as 64-bits of scalar data designated BM0 to BM7. Each register of M2/N2/C local vector register file 233 can be read from or written to as 512-bits of vector data designated VBM0 to VBM7. All vector data path side B 116 functional units (L2 unit 241, S2 unit 242, M2 unit 243, N2 unit 244, C unit 245 and P unit 246) can write to M2/N2/C local vector register file 233. M2 unit 243, N2 unit 244 and C unit 245 can read from M2/N2/C local vector register file 233.

The provision of global register files accessible by all functional units of a side and local register files accessible by some of the functional units of a side is a design choice. In another example, a different accessibility provision could be made, such as employing one type of register file corresponding to the global register files described herein.

Cross path 117 permits limited exchange of data between scalar data path side A 115 and vector data path side B 116. During each operational cycle one 64-bit data word can be recalled from global scalar register file A 211 for use as an operand by one or more functional units of vector data path side B 116 and one 64-bit data word can be recalled from global vector register file 231 for use as an operand by one or more functional units of scalar data path side A 115. Any scalar data path side A 115 functional unit (L1 unit 221, S1 unit 222, M1 unit 223, N1 unit 224, D1 unit 225 and D2 unit 226) can read a 64-bit operand from global vector register file 231. This 64-bit operand is the least significant bits of the 512-bit data in the accessed register of global vector register file 231. Multiple scalar data path side A 115 functional units can employ the same 64-bit cross path data as an operand during the same operational cycle. However, a single 64-bit operand is transferred from vector data path side B 116 to scalar data path side A 115 in a single operational cycle. Any vector data path side B 116 functional unit (L2 unit 241, S2 unit 242, M2 unit 243, N2 unit 244, C unit 245 and P unit 246) can read a 64-bit operand from global scalar register file 211. If the corresponding instruction is a scalar instruction, the cross-path operand data is treated as a 64-bit operand. If the corresponding instruction is a vector instruction, the upper 448 bits of the operand are zero filled. Multiple vector data path side B 116 functional units can employ the same 64-bit cross path data as an operand during the same operational cycle. In one example, a single 64-bit operand is transferred from scalar data path side A 115 to vector data path side B 116 in a single operational cycle.

Streaming engine 125 (FIG. 1) transfers data in certain restricted circumstances. Streaming engine 125 controls two data streams. A stream includes of a sequence of elements of a particular type. Programs that operate on streams read the data sequentially, operating on each element in turn. Every stream has the following basic properties: the stream data have a well-defined beginning and ending in time; the stream data have fixed element size and type throughout the stream; and, the stream data have a fixed sequence of elements. Once a stream is opened, streaming engine 125 performs the following operations: calculates the address; fetches the defined data type from L2 unified cache 130 (which may require cache service from a higher level memory, e.g., in the event of a cache miss in L2); performs data type manipulation such as zero extension, sign extension, data element sorting/swapping such as matrix transposition; and delivers the data directly to the programmed data register file within processor core 110. Streaming engine 125 is thus useful for real-time digital filtering operations on well-behaved data. Streaming engine 125 frees the corresponding processor from these memory fetch tasks, thus enabling other processing functions.

Streaming engine 125 provides several benefits. For example, streaming engine 125 permits multi-dimensional memory accesses, increases the available bandwidth to the functional units minimizes the number of cache miss stalls since the stream buffer bypasses L1D cache 123, and reduces the number of scalar operations required to maintain a loop. Streaming engine 125 also manages address pointers and handles address generation which frees up the address generation instruction slots and D1 unit 225 and D2 unit 226 for other computations.

Processor core 110 (FIG. 1) operates on an instruction pipeline. Instructions are fetched in instruction packets of fixed length as further described below. All instructions require the same number of pipeline phases for fetch and decode but require a varying number of execute phases.

Figure 11:
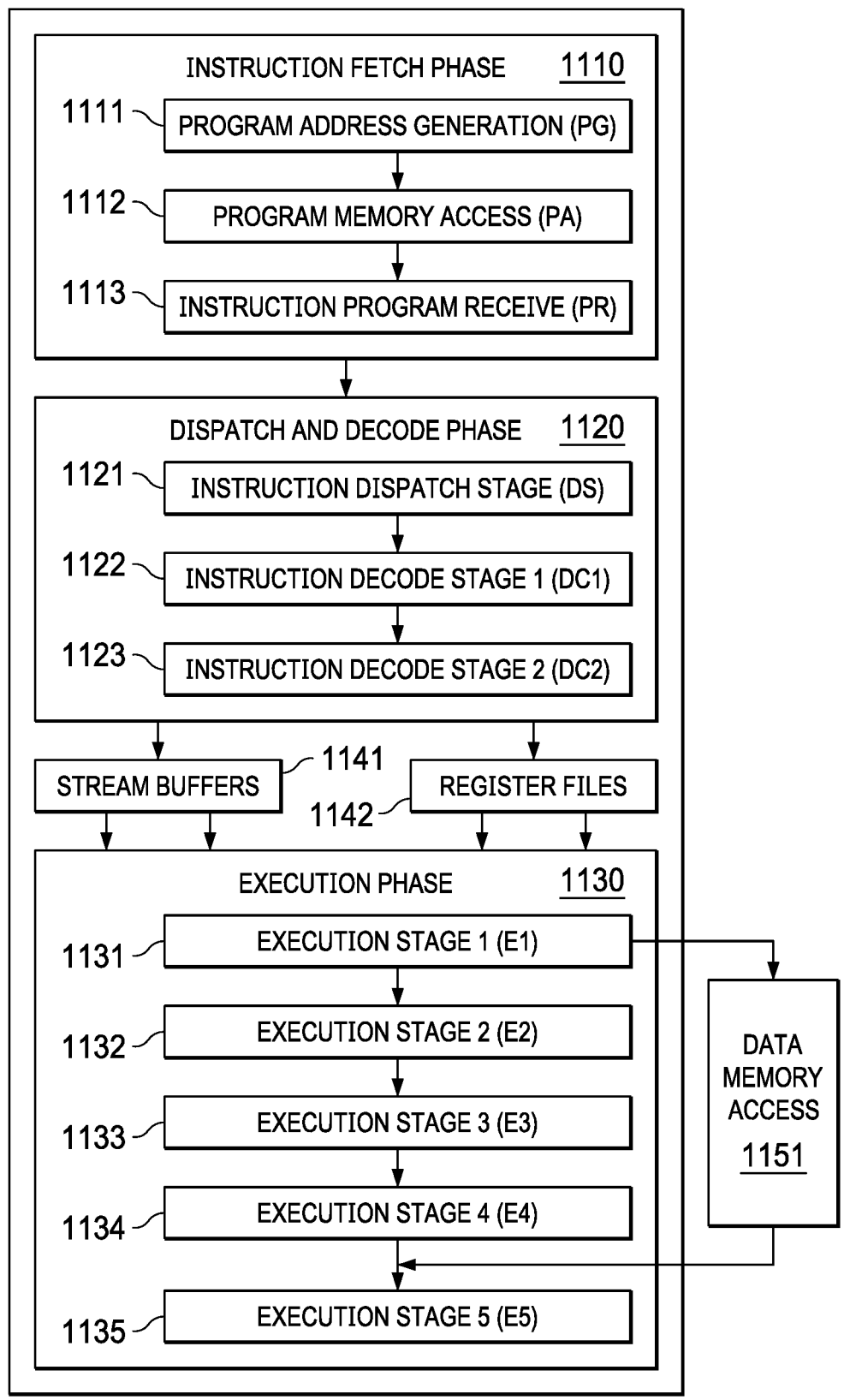
FIG. 11 illustrates pipeline phases of a processing unit.

FIG. 11 illustrates the following pipeline phases: program fetch phase 1110, dispatch and decode phases 1120, and execution phases 1130. Program fetch phase 1110 includes three stages for all instructions. Dispatch and decode phases 1120 include three stages for all instructions. Execution phase 1130 includes one to four stages depending on the instruction.

Fetch phase 1110 includes program address generation (PG) stage 1111, program access (PA) stage 1112 and program receive (PR) stage 1113. During program address generation stage 1111, the program address is generated in the processor and the read request is sent to the memory controller for the L1I cache. During the program access stage 1112, the L1I cache processes the request, accesses the data in its memory and sends a fetch packet to the processor boundary. During the program receive stage 1113, the processor registers the fetch packet.

Figure 12:
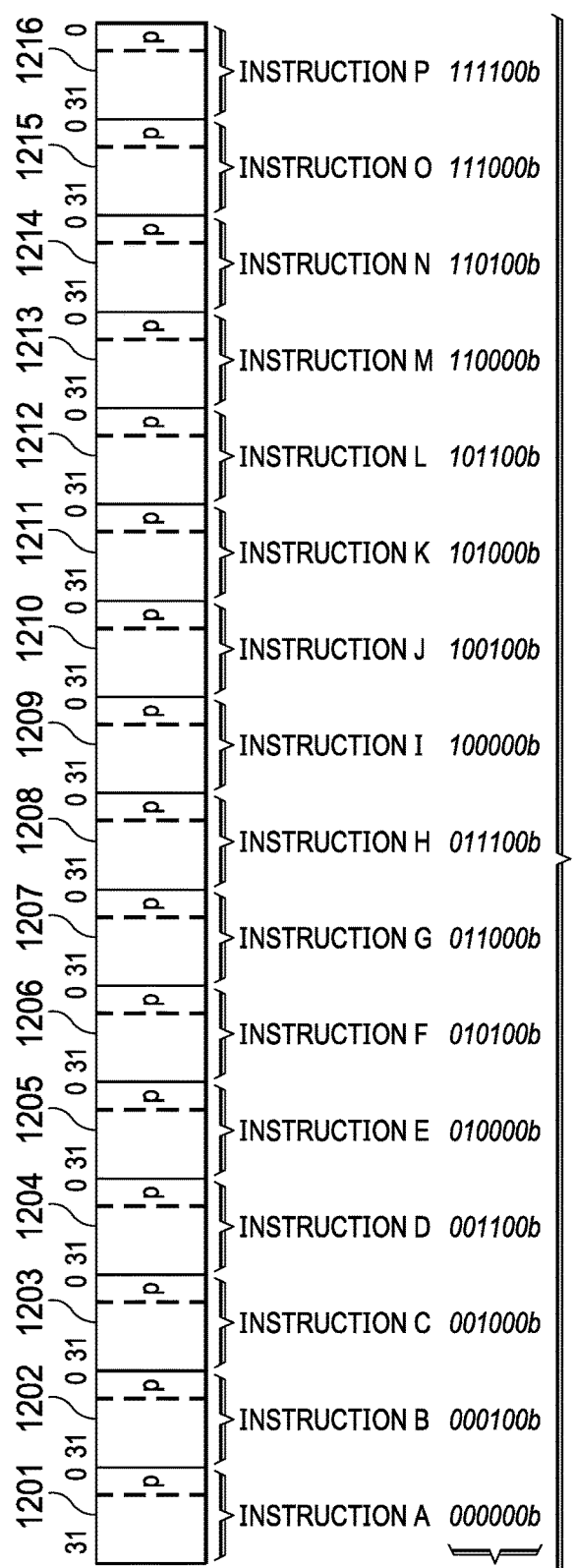
FIG. 12 illustrates sixteen instructions of a single fetch packet.

Instructions are fetched in a fetch packet that includes sixteen 32-bit wide words. FIG. 12 illustrates sixteen instructions 1201 to 1216 of a single fetch packet. Fetch packets are aligned on 512-bit (16-word) boundaries. This example employs a fixed 32-bit instruction length which enables decoder alignment. A properly aligned instruction fetch can load multiple instructions into parallel instruction decoders. Such a properly aligned instruction fetch can be achieved by predetermined instruction alignment when stored in memory by having fetch packets aligned on 512-bit boundaries coupled with a fixed instruction packet fetch. Conversely, variable length instructions require an initial step of locating each instruction boundary before decoding. A fixed length instruction set generally permits more regular layout of instruction fields which simplifies the construction of each decoder which is an advantage for a wide issue VLIW processor.

The execution of the individual instructions is partially controlled by a p bit in each instruction. In this example, the p bit is bit 0 of the 32-bit wide slot. The p bit determines whether an instruction executes in parallel with the next instruction. In this example, instructions are scanned from lower to higher address. If the p bit of an instruction is 1, then the next following instruction (higher memory address) is executed in parallel with (in the same cycle as) that instruction. If the p bit of an instruction is 0, then the next following instruction is executed in the cycle after the instruction.

Processor core 110 (FIG. 1) and L1I cache 121 pipelines (FIG. 1) are de-coupled from each other. Fetch packet returns from L1I cache can take a different number of clock cycles, depending on external circumstances such as whether there is a hit in L1I cache 121 or a hit in L2 combined cache 130. Therefore, program access stage 1112 can take several clock cycles instead of one clock cycle as in the other stages.

The instructions executing in parallel constitute an execute packet. In this example, an execute packet can contain up to sixteen 32-bit wide slots for sixteen instructions. No two instructions in an execute packet can use the same functional unit. A slot is one of five types: 1) a self-contained instruction executed on one of the functional units of processor core 110 (L1 unit 221, S1 unit 222, M1 unit 223, N1 unit 224, D1 unit 225, D2 unit 226, L2 unit 241, S2 unit 242, M2 unit 243, N2 unit 244, C unit 245 and P unit 246); 2) a unitless instruction such as a NOP (no operation) instruction or multiple NOP instructions; 3) a branch instruction; 4) a constant field extension; and 5) a conditional code extension. Some of these slot types are further explained herein.

Dispatch and decode phases 1120 (FIG. 11) include instruction dispatch to appropriate execution unit (DS) stage 1121, instruction pre-decode (DC1) stage 1122, and instruction decode, operand read (DC2) stage 1123. During instruction dispatch to appropriate execution unit stage 1121, the fetch packets are split into execute packets and assigned to the appropriate functional units. During the instruction pre-decode stage 1122, the source registers, destination registers, and associated paths are decoded for the execution of the instructions in the functional units. During the instruction decode, operand read stage 1123, more detailed unit decodes are performed and operands are read from the register files.

Execution phase 1130 includes execution (E1 to E5) stages 1131 to 1135. Different types of instructions require different numbers of such stages to complete execution. The execution stages of the pipeline play an important role in understanding the device state at processor cycle boundaries.

During E1 stage 1131, the conditions for the instructions are evaluated and operands are operated on. As illustrated in FIG. 11, E1 stage 1131 can receive operands from a stream buffer 1141 and one of the register files shown schematically as 1142. For load and store instructions, address generation is performed, and address modifications are written to a register file. For branch instructions, the branch fetch packet in PG phase is affected. As illustrated in FIG. 11, load and store instructions access memory here shown schematically as memory 1151. For single-cycle instructions, results are written to a destination register file when any conditions for the instructions are evaluated as true. If a condition is evaluated as false, the instruction does not write any results or have any pipeline operation after E1 stage 1131.

During E2 stage 1132, load instructions send the address to memory. Store instructions send the address and data to memory. Single-cycle instructions that saturate results set the SAT bit in the control status register (CSR) if saturation occurs. For 2-cycle instructions, results are written to a destination register file.

During E3 stage 1133, data memory accesses are performed. Any multiply instructions that saturate results set the SAT bit in the control status register (CSR) if saturation occurs. For 3-cycle instructions, results are written to a destination register file.

During E4 stage 1134, load instructions bring data to the processor boundary. For 4-cycle instructions, results are written to a destination register file.

During E5 stage 1135, load instructions write data into a register as illustrated schematically in FIG. 11 with input from memory 1151 to E5 stage 1135.

FIG. 13 illustrates an example of instruction coding 1300 used by processing unit core 110. The illustrated instruction format is for a two source arithmetic instruction. Other instruction coding may also be used. In general, instructions include 32 bits and control the operation of one of the individually controllable functional units (L1 unit 221, S1 unit 222, M1 unit 223, N1 unit 224, D1 unit 225, D2 unit 226, L2 unit 241, S2 unit 242, M2 unit 243, N2 unit 244, C unit 245 and P unit 246).

In the example of FIG. 13, the dst field 1301 specifies a register in a corresponding register file as the destination of the instruction results. The src2/cst field 1302 has several meanings depending on the instruction opcode field 1304 and the unit field 1305. One meaning specifies a register of a corresponding register file as the second operand. Another meaning is an immediate constant. Depending on the instruction type, the field 1302 is treated as an unsigned integer and zero extended to a specified data length or is treated as a signed integer and sign extended to the specified data length.

The src1 field 1303 specifies a register in a corresponding register file as the first source operand. The opcode field 1304 specifies the type of instruction. The unit field 1305 in combination with the side bit 1306 indicates which of the functional units is to be used to execute the instruction. A detailed explanation of the opcode is beyond the scope of this description except for the instruction options described below.

The s bit 1306 designates scalar data path side A 115 or vector data path side B 116. If s=0, then scalar data path side A 115 is selected which limits the functional unit to L1 unit 221, S1 unit 222, M1 unit 223, N1 unit 224, D1 unit 225 and D2 unit 226 and the corresponding register files illustrated in FIG. 2. Similarly, s=1 selects vector data path side B 116 which limits the functional unit to L2 unit 241, S2 unit 242, M2 unit 243, N2 unit 244, P unit 246 and the corresponding register file illustrated in FIG. 2.

The p bit 1307 marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to sixteen instructions. Each instruction in an execute packet uses a different functional unit.

Most instructions of the processing unit core 110 do not include direct encoding for conditional execution. However, instructions can be made conditional. The act of making an instruction conditional is called predication and the register storing the condition is referred to as a predicate register. An execute packet can include two 32-bit condition code extension slots which encode 4-bit condition information for instructions in the same execute packet. The condition code slots are referred to as condition code extension slot 0 and condition code extension slot 1 and the 4-bit condition information is referred to as a creg/z field herein.

Table 1 shows the encodings of a creg/z field. The creg bits identify the predicate register and the z bit indicates whether the predication is based on zero or not zero in the predicate register. Execution of a conditional instruction is conditional upon the value stored in the specified data register. If $z=1$, the test is for equality with zero. If $z=0$, the test is for nonzero. The case of $creg=0$ and $z=0$ is treated as true to allow unconditional instruction execution. Note that "z" in the z bit column refers to the zero/not zero comparison selection noted above and "x" is a don't care state.

TABLE 1

| Meaning | creg | | | z |
|---|---|---|---|---|
| Unconditional | 0 | 0 | 0 | 0 |
| Reserved | 0 | 0 | 0 | 1 |
| A0 | 0 | 0 | 1 | z |
| A1 | 0 | 1 | 0 | z |
| A2 | 0 | 1 | 1 | z |
| A3 | 1 | 0 | 0 | z |
| A4 | 1 | 0 | 1 | z |
| A5 | 1 | 1 | 0 | z |
| Reserved | 1 | 1 | x | x |

FIG. 14 illustrates the coding for condition code extension slot 0 1400. Field 1401 specifies four creg/z bits assigned to the L1 unit 221 instruction, field 1402 specifies four creg/z bits assigned to the L2 unit 241 instruction, field 1403 specifies four creg/z bits assigned to the S1 unit 222 instruction, field 1404 specifies four creg/z bits assigned to the S2 unit 242 instruction, field 1405 specifies four creg/z bits assigned to the D1 unit 225 instruction, field 1406 specifies four creg/z bits assigned to the D2 unit 226 instruction, field 1407 is unused/reserved, and field 1408 is coded as a set of unique bits (CCEX0) that identify the condition code extension slot 0. When the unique ID of condition code extension slot 0 is detected, the creg/z bits are employed to control conditional execution of any corresponding L1 unit 221, L2 unit 241, S1 unit 222, S2 unit 242, D1 unit 225, and D2 unit 226 instruction in the same execution packet. Note that a properly coded condition code extension slot 0 can make some instructions in an execute packet conditional and some unconditional.

FIG. 15 illustrates the coding for condition code extension slot 1 1500. Field 1501 specifies four creg/z bits assigned to the M1 unit 223 instruction, field 1502 specifies four creg/z bits assigned to the M2 unit 243 instruction, field 1503 specifies four creg/z bits assigned to the C unit 245 instruction, field 1504 specifies four creg/z bits assigned to the N1 unit 224 instruction, field 1505 specifies four creg/z bits assigned to the N2 unit 244 instruction, field 1506 is unused/reserved, and field 1507 is coded as a set of unique bits (CCEX1) that identify the condition code extension slot 1. When the unique ID of condition code extension slot 1 is detected, the corresponding creg/z bits are employed to control conditional execution of any M1 unit 223, M2 unit 243, C unit 245, N1 unit 224 and N2 unit 244 instruction in the same execution packet.

Referring again to FIG. 13, in some instructions, a bit in the opcode field 1304 referred to as the constant extension bit can be encoded to indicate that a constant in the src2/CST field 1302 is to be extended. An execute packet can include two 32-bit constant extension slots that can each store 27-bits to be concatenated as high order bits with a 5-bit constant in the field 1302 to form a 32-bit constant. FIG. 16 illustrates the fields of constant extension slot 0 1600. Field 1601 stores the most significant 27 bits of an extended 32-bit constant. Field 1602 is coded as a set of unique bits (CSTX0) to identify the constant extension slot 0. In this example, constant extension slot 0 1600 can be used to extend the constant of one of an L1 unit 221 instruction, data in a D1 unit 225 instruction, an S2 unit 242 instruction, an offset in a D2 unit 226 instruction, an M2 unit 243 instruction, an N2 unit 244 instruction, a branch instruction, or a C unit 245 instruction in the same execute packet. Constant extension slot 1 is similar to constant extension slot 0 except the slot is coded with a set of unique bits (CSTX1) to identify the constant extension slot 1. In this example, constant extension slot 1 can be used to extend the constant of one of an L2 unit 241 instruction, data in a D2 unit 226 instruction, an S1 unit 222 instruction, an offset in a D1 unit 225 instruction, an M1 unit 223 instruction or an N1 unit 224 instruction in the same execute packet.

Constant extension slot 0 and constant extension slot 1 are used as follows. Instruction decoder 113 determines that a constant is in field 1302, referred to as an immediate field, from the instruction opcode bits and whether or not the constant is to be extended from the previously mentioned constant extension bit in the opcode field 1304. If instruction decoder 113 detects a constant extension slot 0 or a constant extension slot 1, instruction decoder 113 checks the instructions within the execute packet for an instruction corresponding to the detected constant extension slot. A constant extension is made if one corresponding instruction has a constant extension bit equal to 1.

Figure 17:
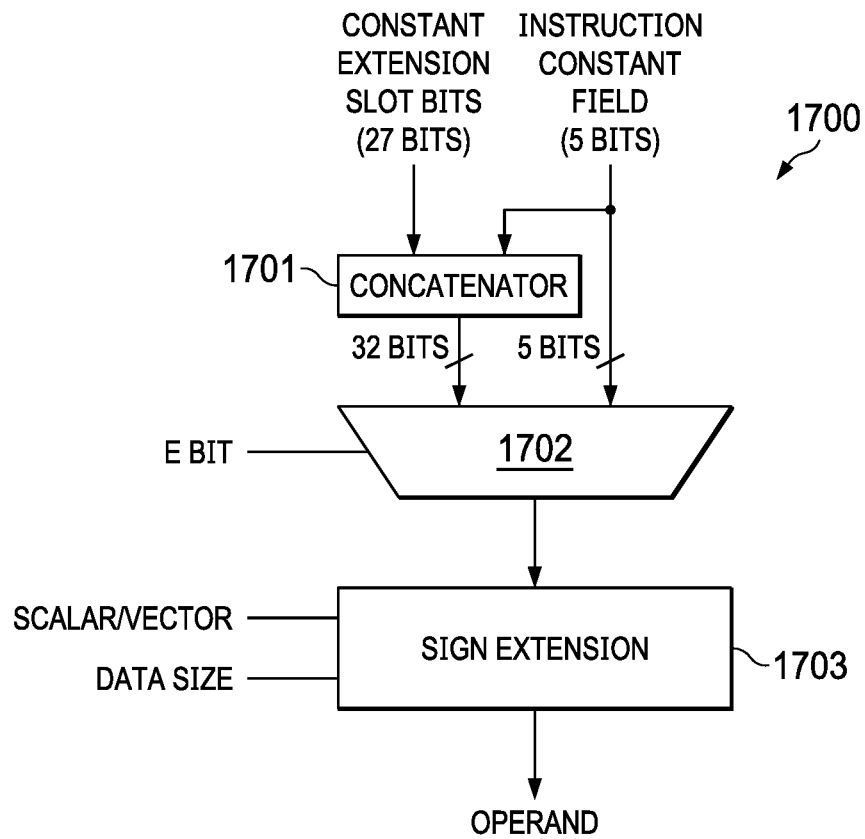
FIG. 17 is a partial block diagram illustrating constant extension.

FIG. 17 is a partial block diagram 1700 illustrating constant extension. FIG. 17 assumes that instruction decoder 113 (FIG. 1) detects a constant extension slot and a corresponding instruction in the same execute packet. Instruction decoder 113 supplies the twenty-seven extension bits from field 1601 of the constant extension slot and the five constant bits from field 1302 from the corresponding instruction to concatenator 1701. Concatenator 1701 forms a single 32-bit word from these two parts. In this example, the twenty-seven extension bits from field 1601 of the constant extension slot are the most significant bits and the five constant bits from field 1302 are the least significant bits. The combined 32-bit word is supplied to one input of multiplexer 1702. The five constant bits from the corresponding instruction field 1302 supply a second input to multiplexer 1702. Selection of multiplexer 1702 is controlled by the status of the constant extension bit. If the constant extension bit is 1, multiplexer 1702 selects the concatenated 32-bit input. If the constant extension bit is 0, multiplexer 1702 selects the five constant bits from the corresponding instruction field 1302. The output of multiplexer 1702 supplies an input of sign extension unit 1703.

Sign extension unit 1703 forms the final operand value from the input from multiplexer 1703. Sign extension unit 1703 receives control inputs scalar/vector and data size. The scalar/vector input indicates whether the corresponding instruction is a scalar instruction or a vector instruction. The functional units of data path side A 115 (L1 unit 221, S1 unit 222, M1 unit 223, N1 unit 224, D1 unit 225 and D2 unit 226) perform scalar instructions. Any instruction directed to one of these functional units is a scalar instruction. Data path side B functional units L2 unit 241, S2 unit 242, M2 unit 243, N2 unit 244 and C unit 245 can perform scalar instructions or vector instructions. Instruction decoder 113 determines whether the instruction is a scalar instruction or a vector instruction from the opcode bits. P unit 246 may performs scalar instructions. The data size can be eight bits (byte B), sixteen bits (half-word H), 32 bits (word W), or 64 bits (double word D).

Table 2 lists the operation of sign extension unit 1703 for the various options.

TABLE 2

| Instruction Type | Operand Size | Constant Length | Action |
|---|---|---|---|
| Scalar | B/H/W/D | 5 bits | Sign extend to 64 bits |
| Scalar | B/H/W/D | 32 bits | Sign extend to 64 bits |
| Vector | B/H/W/D | 5 bits | Sign extend to operand size and replicate across whole vector |
| Vector | B/H/W | 32 bits | Replicate 32-bit constant across each 32-bit (W) lane |
| Vector | D | 32 bits | Sign extend to 64 bits and replicate across each 64-bit (D) lane |

Both constant extension slot 0 and constant extension slot 1 can include a p bit to define an execute packet as described above in conjunction with FIG. 13. In this example, as in the case of the condition code extension slots, constant extension slot 0 and constant extension slot 1 have bit 0 (p bit) encoded as 1. Thus, neither constant extension slot 0 nor constant extension slot 1 can be in the last instruction slot of an execute packet.

An execute packet can include a constant extension slot 0 or 1 and more than one corresponding instruction marked constant extended (e bit=1). For such an occurrence, for constant extension slot 0, more than one of an L1 unit 221 instruction, data in a D1 unit 225 instruction, an S2 unit 242 instruction, an offset in a D2 unit 226 instruction, an M2 unit 243 instruction or an N2 unit 244 instruction in an execute packet can have an e bit of 1. For such an occurrence, for constant extension slot 1, more than one of an L2 unit 241 instruction, data in a D2 unit 226 instruction, an S1 unit 222 instruction, an offset in a D1 unit 225 instruction, an M1 unit 223 instruction or an N1 unit 224 instruction in an execute packet can have an e bit of 1. In one example, instruction decoder 113 determines that such an occurrence is an invalid operation and not supported. Alternately, the combination can be supported with extension bits of the constant extension slot applied to each corresponding functional unit instruction marked constant extended.

L1 unit 221, S1 unit 222, L2 unit 241, S2 unit 242 and C unit 245 often operate in a single instruction multiple data (SIMD) mode. In this SIMD mode, the same instruction is applied to packed data from the two operands. Each operand holds multiple data elements disposed in predetermined slots. SIMD operation is enabled by carry control at the data boundaries. Such carry control enables operations on varying data widths.

Figure 18:
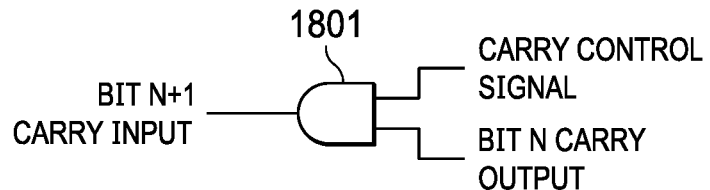
FIG. 18 illustrates carry control for SIMD operations.

FIG. 18 illustrates the carry control logic. AND gate 1801 receives the carry output of bit N within the operand wide arithmetic logic unit (64 bits for scalar data path side A 115 functional units and 512 bits for vector data path side B 116 functional units). AND gate 1801 also receives a carry control signal which is further explained below. The output of AND gate 1801 is supplied to the carry input of bit N+1 of the operand wide arithmetic logic unit. AND gates such as AND gate 1801 are disposed between every pair of bits at a possible data boundary. For example, for 8-bit data such an AND gate will be between bits 7 and 8, bits 15 and 16, bits 23 and 24, etc. Each such AND gate receives a corresponding carry control signal. If the data size is the minimum size, each carry control signal is 0, effectively blocking carry transmission between the adjacent bits. The corresponding carry control signal is 1 if the selected data size requires both arithmetic logic unit sections. Table 3 below shows example carry control signals for the case of a 512-bit wide operand as used by vector data path side B 116 functional units which can be divided into sections of 8 bits, 16 bits, 32 bits, 64 bits, 128 bits or 256 bits. In Table 3, the upper 32 bits control the upper bits (bits 128 to 511) carries and the lower 32 bits control the lower bits (bits 0 to 127) carries. No control of the carry output of the most significant bit is needed, thus only 63 carry control signals are required.

TABLE 3

| Data Size | Carry Control Signals |
|---|---|
| 8 bits (B) | –000 0000 0000 0000 0000 0000 0000 0000 0000 0000 0000 0000 0000 0000 0000 0000 |
| 16 bits (H) | –101 0101 0101 0101 0101 0101 0101 0101 0101 0101 0101 0101 0101 0101 0101 0101 |
| 32 bits (W) | –111 0111 0111 0111 0111 0111 0111 0111 0111 0111 0111 0111 0111 0111 0111 0111 |
| 64 bits (D) | –111 1111 0111 1111 0111 1111 0111 1111 0111 1111 0111 1111 0111 1111 0111 1111 |
| 128 bits | –111 1111 1111 1111 0111 1111 1111 1111 0111 1111 1111 1111 0111 1111 1111 1111 |
| 256 bits | –111 1111 1111 1111 1111 1111 1111 1111 0111 1111 1111 1111 1111 1111 1111 1111 |

Operation on data sizes that are integral powers of 2 (2$^n$) is common. However, the carry control technique is not limited to integral powers of 2 and can be applied to other data sizes and operand widths.

In this example, at least L2 unit 241 and S2 unit 242 employ two types of SIMD instructions using registers in predicate register file 234. In this example, the SIMD vector predicate instructions operate on an instruction specified data size. The data sizes include byte (8 bit) data, half word (16 bit) data, word (32 bit) data, double word (64 bit) data, quad word (128 bit) data and half vector (256 bit) data. In the first of these instruction types, the functional unit (L2 unit 241 or S2 unit 242) performs a SIMD comparison on packed data in two general data registers and supplies results to a predicate data register. The instruction specifies a data size, the two general data register operands, and the destination predicate register. In this example, each predicate data register includes one bit corresponding to each minimal data size portion of the general data registers. In the current example, the general data registers are 512 bits (64 bytes) and the predicate data registers are 64 bits (8 bytes). Each bit of a predicate data register corresponds to eight bits of a general data register. The comparison is performed on a specified data size (8, 16, 32, 64, 128 or 256 bits). If the comparison is true, then the functional unit supplies 1's to all predicate register bits corresponding the that data size portion. If the comparison is false, the functional unit supplies zeroes to the predicate register bits corresponding to that data size portion. In this example, the enabled comparison operations include: less than, greater than, and equal to.

In the second of the instruction types, the functional unit (L2 unit 241 or S2 unit 242) separately performs a first SIMD operation or a second SIMD operation on packed data in general data registers based upon the state of data in a predicate data register. The instruction specifies a data size, one or two general data register operands, a controlling predicate register, and a general data register destination. For example, a functional unit can select, for each data sized portion of two vector operands, a first data element of a first operand or a second data element of a second operand dependent upon the I/O state of corresponding bits in the predicate data register to store in the destination register. In another example, the data elements of a single vector operand can be saved to memory or not saved dependent upon the data of the corresponding bits of the predicate register.

The operations of P unit 245 permit a variety of compound vector SIMD operations based upon more than one vector comparison. For example, a range determination can be made using two comparisons. In a SIMD operation, a candidate vector is compared with a vector reference having the minimum of the range packed within a data register. The greater than result is scalar data with bits corresponding to the SIMD data width set to 0 or 1 depending upon the SIMD comparison and is stored in a predicate data register. Another SIMD comparison of the candidate vector is performed with another reference vector having the maximum of the range packed within a different data register produces another scalar with less than results stored in another predicate register. The P unit then ANDs the two predicate registers. The AND result indicates whether each SIMD data part of the candidate vector is within range or out of range. A P unit BITCNT instruction of the AND result can produce a count of the data elements within the comparison range. The P unit NEG function can be used to convert: a less than comparison result to a greater than or equal comparison result; a greater than comparison result to a less than or equal to comparison result; or, an equal to comparison result to a not equal to comparison result.

Streaming Engine

Figure 19:
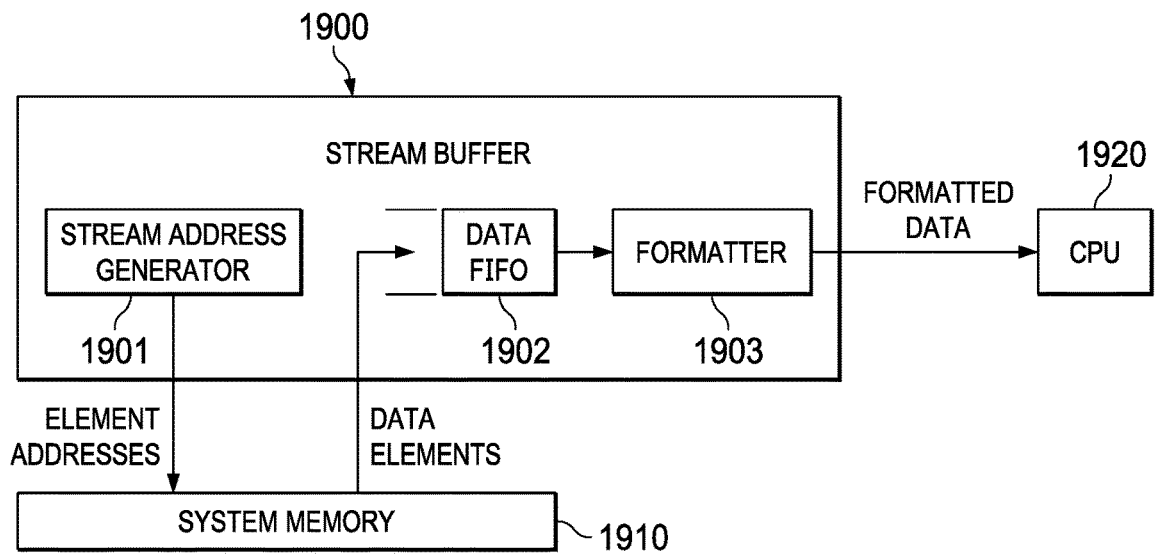
FIG. 19 illustrates a conceptual view of streaming engines.

FIG. 19 is a conceptual view of the streaming engine 125 of the example processor 100 of FIG. 1. FIG. 19 illustrates the processing of a single stream representative of the two streams controlled by streaming engine 125. Streaming engine 1900 includes stream address generator 1901. Stream address generator 1901 sequentially generates addresses of the elements of the stream and supplies these element addresses to system memory 1910. Memory 1910 recalls data stored at the element addresses (data elements) and supplies these data elements to data first-in-first-out (FIFO) buffer 1902. Data FIFO buffer 1902 provides buffering between memory 1910 and processor 1920. Data formatter 1903 receives the data elements from data FIFO memory 1902 and provides data formatting according to the stream definition. This process is described in more detail herein. Streaming engine 1900 supplies the formatted data elements from data formatter 1903 to the processor 1920. A program executing on processor 1920 consumes the data and generates an output.

Stream elements typically reside in system memory. The memory imposes no particular structure upon the stream. Programs define streams and thereby impose structure by specifying the stream attributes such as address of the first element of the stream, size and type of the elements in the stream, formatting for data in the stream, and the address sequence associated with the stream.

The streaming engine defines an address sequence for elements of the stream in terms of a pointer walking through memory. A multiple-level nested loop controls the path the pointer takes. An iteration count for a loop level indicates the number of times the level repeats. A dimension gives the distance between pointer positions of the loop level.

In a basic forward stream, the innermost loop consumes physically contiguous elements from memory as the implicit dimension of the innermost loop is one element. The pointer moves from element to element in consecutive, increasing order. In each level outside the inner loop, that loop moves the pointer to a new location based on the size of the dimension of the loop level. This form of addressing allows programs to specify regular paths through memory using a small number of parameters. Table 4 lists the addressing parameters of a basic stream. In this example, ELEM_BYTES ranges from 1 to 64 bytes as shown in Table 5.

TABLE 4

| Parameter | Definition |
| --- | --- |
| ELEM_BYTES | Size of each element in bytes |
| ICNT0 | Number of iterations for the innermost loop level 0. At loop level 0 all elements are physically contiguous. Implied DIM0 = ELEM_BYTES |
| ICNT1 | Number of iterations for loop level 1 |
| DIM1 | Number of bytes between the starting points for consecutive iterations of loop level 1 |
| ICNT2 | Number of iterations for loop level 2 |
| DIM2 | Number of bytes between the starting points for consecutive iterations of loop level 2 |
| ICNT3 | Number of iterations for loop level 3 |
| DIM3 | Number of bytes between the starting points for consecutive iterations of loop level 3 |
| ICNT4 | Number of iterations for loop level 4 |
| DIM4 | Number of bytes between the starting points for consecutive iterations of loop level 4 |
| ICNT5 | Number of iterations for loop level 5 |
| DIM5 | Number of bytes between the starting points for consecutive iterations of loop level 5 |

TABLE 5

| ELEM_BYTES | Stream Element Length |
| --- | --- |
| 000 | 1 byte |
| 001 | 2 bytes |
| 010 | 4 bytes |
| 011 | 8 bytes |
| 100 | 16 bytes |
| 101 | 32 bytes |
| 110 | 64 bytes |
| 111 | Reserved |

The definition above maps consecutive elements of the stream to increasing addresses in memory which is appropriate for many algorithms. Some algorithms are better served by reading elements in decreasing memory address order or reverse stream addressing. For example, a discrete convolution computes vector dot-products, as illustrated by $$(f*g)[t]=\Sigma_{x=-\infty}^{\infty}f[x]g[t-x]$$

where f[ ] and g[ ] represent arrays in memory. For each output, the algorithm reads f[ ] in the forward direction and reads g[ ] in the reverse direction. Practical filters limit the range of indices for [x] and [t−x] to a finite number of elements. To support this pattern, the streaming engine supports reading elements in decreasing address order.

Matrix multiplication presents a unique problem to the streaming engine. Each element in the matrix product is a vector dot product between a row from the first matrix and a column from the second. Programs typically store matrices in row-major or column-major order. Row-major order stores all the elements of a single row contiguously in memory. Column-major order stores all elements of a single column contiguously in memory. Matrices are typically stored in the same order as the default array order for the language. As a result, only one of the two matrices in a matrix multiplication map on to the 2-dimensional stream definition of the streaming engine. In a typical example, an index steps through columns on one array and rows of the other array. The streaming engine supports implicit matrix transposition with transposed streams. Transposed streams avoid the cost of explicitly transforming the data in memory. Instead of accessing data in strictly consecutive-element order, the streaming engine effectively interchanges the inner two loop dimensions of the traversal order, fetching elements along the second dimension into contiguous vector lanes.

This algorithm works but is impractical to implement for small element sizes. Some algorithms work on matrix tiles which are multiple columns and rows together. Therefore, the streaming engine defines a separate transposition granularity. The hardware imposes a minimum granularity. The transpose granularity needs to be at least as large as the element size. Transposition granularity causes the streaming engine to fetch one or more consecutive elements from dimension 0 before moving along dimension 1. When the granularity equals the element size, a single column from a row-major array is fetched. Otherwise, the granularity specifies fetching two, four or more columns at a time from a row-major array. This is also applicable for column-major layout by exchanging row and column in the description. A parameter GRANULE indicates the transposition granularity in bytes.

Another common matrix multiplication technique exchanges the innermost two loops of the matrix multiply. The resulting inner loop no longer reads down the column of one matrix while reading across the row of another. For example, the algorithm may hoist one term outside the inner loop, replacing it with the scalar value. The innermost loop can be implemented with a single scalar by vector multiply followed by a vector add. Or, the scalar value can be duplicated across the length of the vector and a vector by vector multiply used. The streaming engine of this example directly supports the latter case and related use models with an element duplication mode. In this mode, the streaming engine reads a granule smaller than the full vector size and replicates that granule to fill the next vector output.

The streaming engine treats each complex number as a single element with two sub-elements that give the real and imaginary (rectangular) or magnitude and angle (polar) portions of the complex number. Not all programs or peripherals agree what order these sub-elements should appear in memory. Therefore, the streaming engine offers the ability to swap the two sub-elements of a complex number with no cost. The feature swaps the halves of an element without interpreting the contents of the element and can be used to swap pairs of sub-elements of any type, not just complex numbers.

Algorithms generally prefer to work at high precision, but high precision values require more storage and bandwidth than lower precision values. Commonly, programs store data in memory at low precision, promote those values to a higher precision for calculation, and then demote the values to lower precision for storage. The streaming engine supports such operations directly by allowing algorithms to specify one level of type promotion. In this example, every sub-element can be promoted to a larger type size with either sign or zero extension for integer types. In some examples, the streaming engine supports floating point promotion, promoting 16-bit and 32-bit floating point values to 32-bit and 64-bit formats, respectively.

While the streaming engine defines a stream as a discrete sequence of data elements, the processing unit core 110 consumes data elements packed contiguously in vectors. The vectors resemble streams as the vectors contain multiple homogeneous elements with some implicit sequence. Because the streaming engine reads streams, but the processing unit core 110 consumes vectors, the streaming engine maps streams onto vectors in a consistent way.

Vectors are divided into equal-sized lanes, each lane allocated to storing a sub-element. The processing unit core 110 designates the rightmost lane of the vector as lane 0, regardless of current endian mode. Lane numbers increase right-to-left. The actual number of lanes within a vector varies depending on the length of the vector and the data size of the sub-element. Further, the lanes may be referred to as lanes, vector lanes, or SIMD lanes herein.

Figure 20:
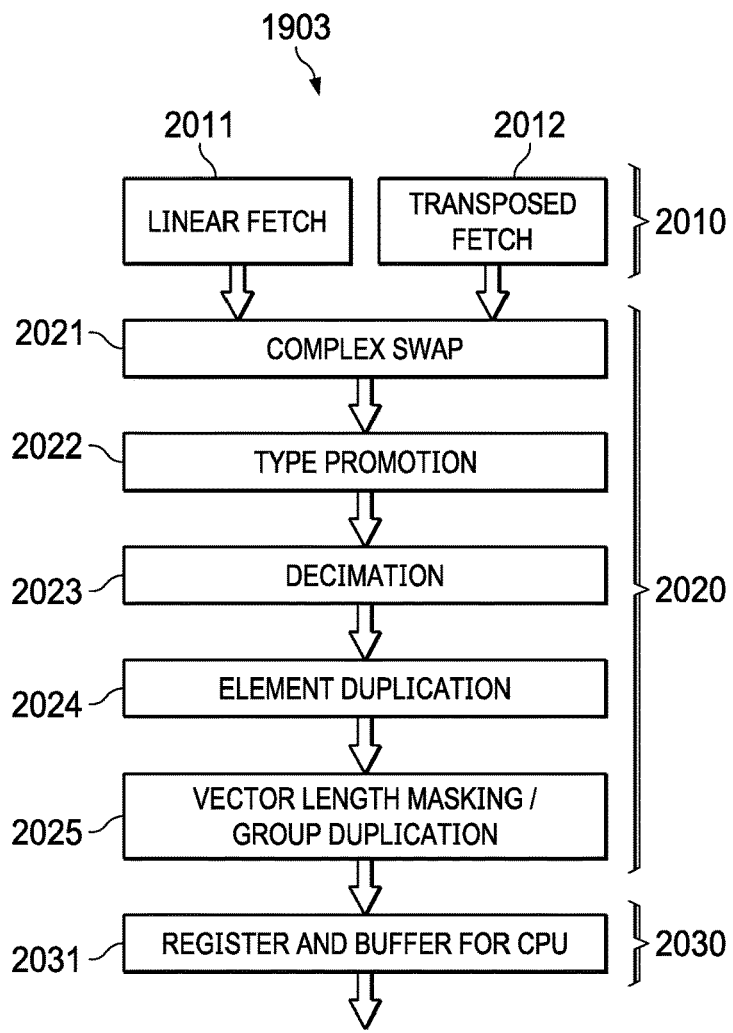
FIG. 20 illustrates a sequence of formatting operations.

FIG. 20 illustrates the sequence of the formatting operations of formatter 1903. Formatter 1903 includes three sections: input section 2010, formatting section 2020, and output section 2030. Input section 2010 receives the data recalled from system memory 1910 as accessed by stream address generator 1901. The data can be via linear fetch stream 2011 or transposed fetch stream 2012.

Formatting section 2020 includes various formatting blocks. The formatting performed within formatter 1903 by the blocks is further described below. Complex swap block 2021 optionally swaps two sub-elements forming a complex number element. Type promotion block 2022 optionally promotes each data element into a larger data size. Promotion includes zero extension for unsigned integers and sign extension for signed integers. Decimation block 2023 optionally decimates the data elements. In this example, decimation can be 2:1 retaining every other data element or 4:1 retaining every fourth data element. Element duplication block 2024 optionally duplicates individual data elements. In this example, the data element duplication is an integer power of 2 (2N, where N is an integer) including 2×, 4×, 8×, 16×, 32× and 64×. In this example, data duplication can extend over multiple destination vectors. Vector length masking/group duplication block 2025 has two primary functions. An independently specified vector length VECLEN controls the data elements supplied to each output data vector. When group duplication is off, excess lanes in the output data vector are zero filled and these lanes are marked invalid. When group duplication is on, input data elements of the specified vector length are duplicated to fill the output data vector.

Output section 2030 holds the data for output to the corresponding functional units. Register and buffer for processor 2031 stores a formatted vector of data to be used as an operand by the functional units of processing unit core 110 (FIG. 1).

FIG. 21 illustrates an example of lane allocation in a vector. Vector 2100 is divided into eight 64-bit lanes (8×64 bits=512 bits, the vector length). Lane 0 includes bits 0 to 63, lane 1 includes bits 64 to 127, lane 2 includes bits 128 to 191, lane 3 includes bits 192 to 255, lane 4 includes bits 256 to 319, lane 5 includes bits 320 to 383, lane 6 includes bits 384 to 447, and lane 7 includes bits 448 to 511.

FIG. 22 illustrates another example of lane allocation in a vector. Vector 2210 is divided into sixteen 32-bit lanes (16×32 bits=512 bits, the vector length). Lane 0 includes bits 0 to 31, lane 1 includes bits 32 to 63, lane 2 includes bits 64 to 95, lane 3 includes bits 96 to 127, lane 4 includes bits 128 to 159, lane 5 includes bits 160 to 191, lane 6 includes bits 192 to 223, lane 7 includes bits 224 to 255, lane 8 includes bits 256 to 287, lane 9 includes bits 288 to 319, lane 10 includes bits 320 to 351, lane 11 includes bits 352 to 383, lane 12 includes bits 384 to 415, lane 13 includes bits 416 to 447, lane 14 includes bits 448 to 479, and lane 15 includes bits 480 to 511.

The streaming engine maps the innermost stream dimension directly to vector lanes. The streaming engine maps earlier elements within the innermost stream dimension to lower lane numbers and later elements to higher lane numbers, regardless of whether the stream advances in increasing or decreasing address order. Whatever order the stream defines, the streaming engine deposits elements in vectors in increasing-lane order. For non-complex data, the streaming engine places the first element in lane 0 of the vector processing unit core 110 (FIG. 1) fetches, the second in lane 1, and so on. For complex data, the streaming engine places the first element in lanes 0 and 1, the second element in lanes 2 and 3, and so on. Sub-elements within an element retain the same relative ordering regardless of the stream direction. For non-swapped complex elements, the sub-elements with the lower address of each pair are placed in the even numbered lanes, and the sub-elements with the higher address of each pair are placed in the odd numbered lanes. For swapped complex elements, the placement is reversed.

The streaming engine fills each vector processing unit core 110 fetches with as many elements as possible from the innermost stream dimension. If the innermost dimension is not a multiple of the vector length, the streaming engine zero pads the dimension to a multiple of the vector length. As noted below, the streaming engine also marks the lanes invalid. Thus, for higher-dimension streams, the first element from each iteration of an outer dimension arrives in lane 0 of a vector. The streaming engine maps the innermost dimension to consecutive lanes in a vector. For transposed streams, the innermost dimension includes groups of sub-elements along dimension 1, not dimension 0, as transposition exchanges these two dimensions.

Two-dimensional (2D) streams exhibit greater variety as compared to one-dimensional streams. A basic 2D stream extracts a smaller rectangle from a larger rectangle. A transposed 2D stream reads a rectangle column-wise instead of row-wise. A looping stream, where the second dimension overlaps first, executes a finite impulse response (FIR) filter taps which loops repeatedly over FIR filter samples providing a sliding window of input samples.

Figure 23:
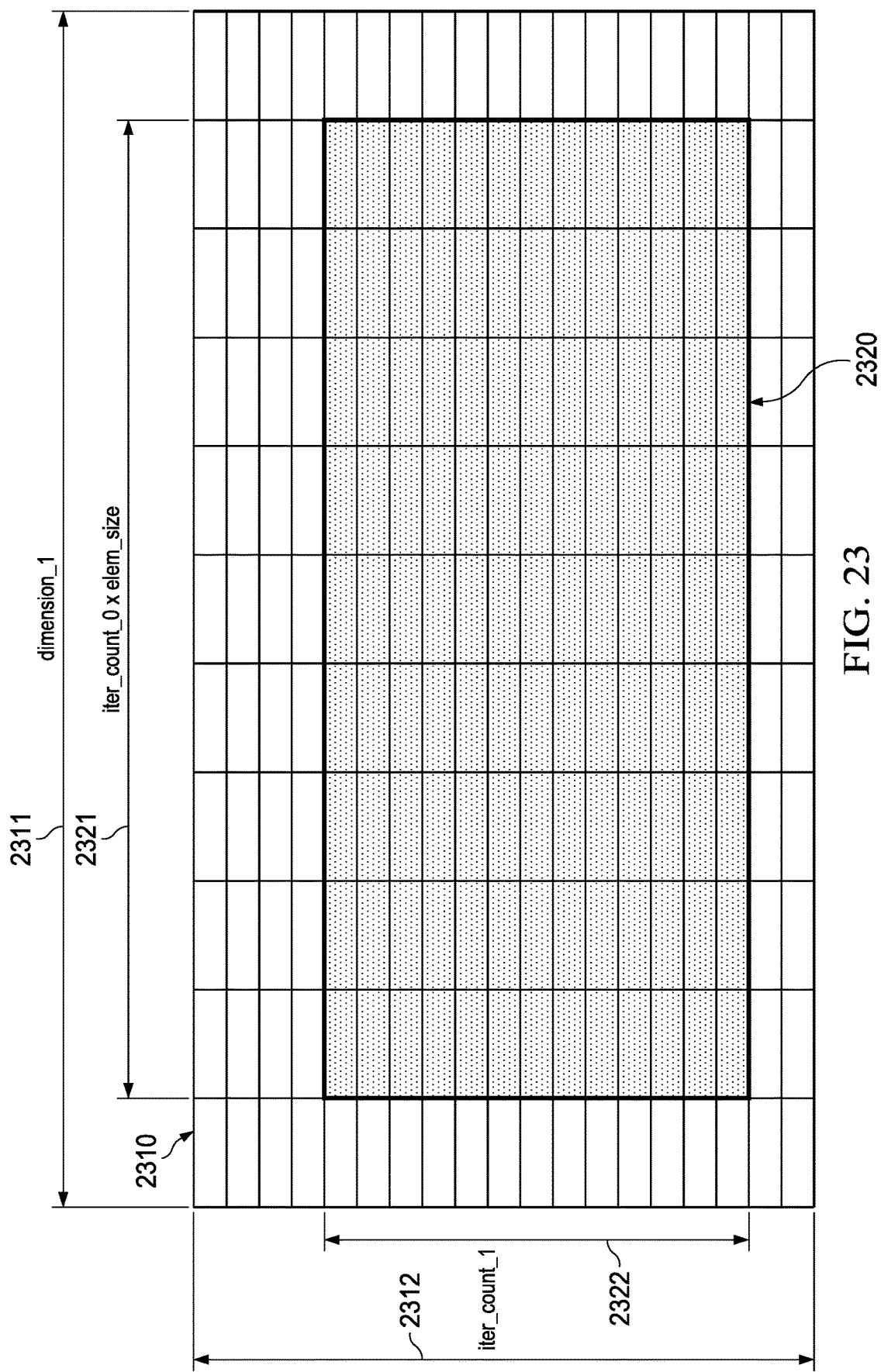
FIG. 23 illustrates a basic two-dimensional (2D) stream.

FIG. 23 illustrates a region of memory that can be accessed using a basic two-dimensional stream. The inner two dimensions, represented by ELEM_BYTES, ICNT0, DIM1 and ICNT1 (refer to Table 4), give sufficient flexibility to describe extracting a smaller rectangle 2320 having dimensions 2321 and 2322 from a larger rectangle 2310 having dimensions 2311 and 2312. In this example, rectangle 2320 is a 9 by 13 rectangle of 64-bit values and rectangle 2310 is a larger 11 by 19 rectangle. The following stream parameters define this stream:

ICNT0=9, ELEM_BYTES=8, ICNT1=13, and DIM1=88 (11 times 8).

Thus, the iteration count in the 0-dimension 2321 is nine and the iteration count in the 1-dimension 2322 is thirteen. Note that the ELEM_BYTES scales the innermost dimension. The first dimension has ICNT0 elements of size ELEM_BYTES. The stream address generator does not scale the outer dimensions. Therefore, DIM1=88, which is eleven elements scaled by eight bytes per element.

Figure 24:
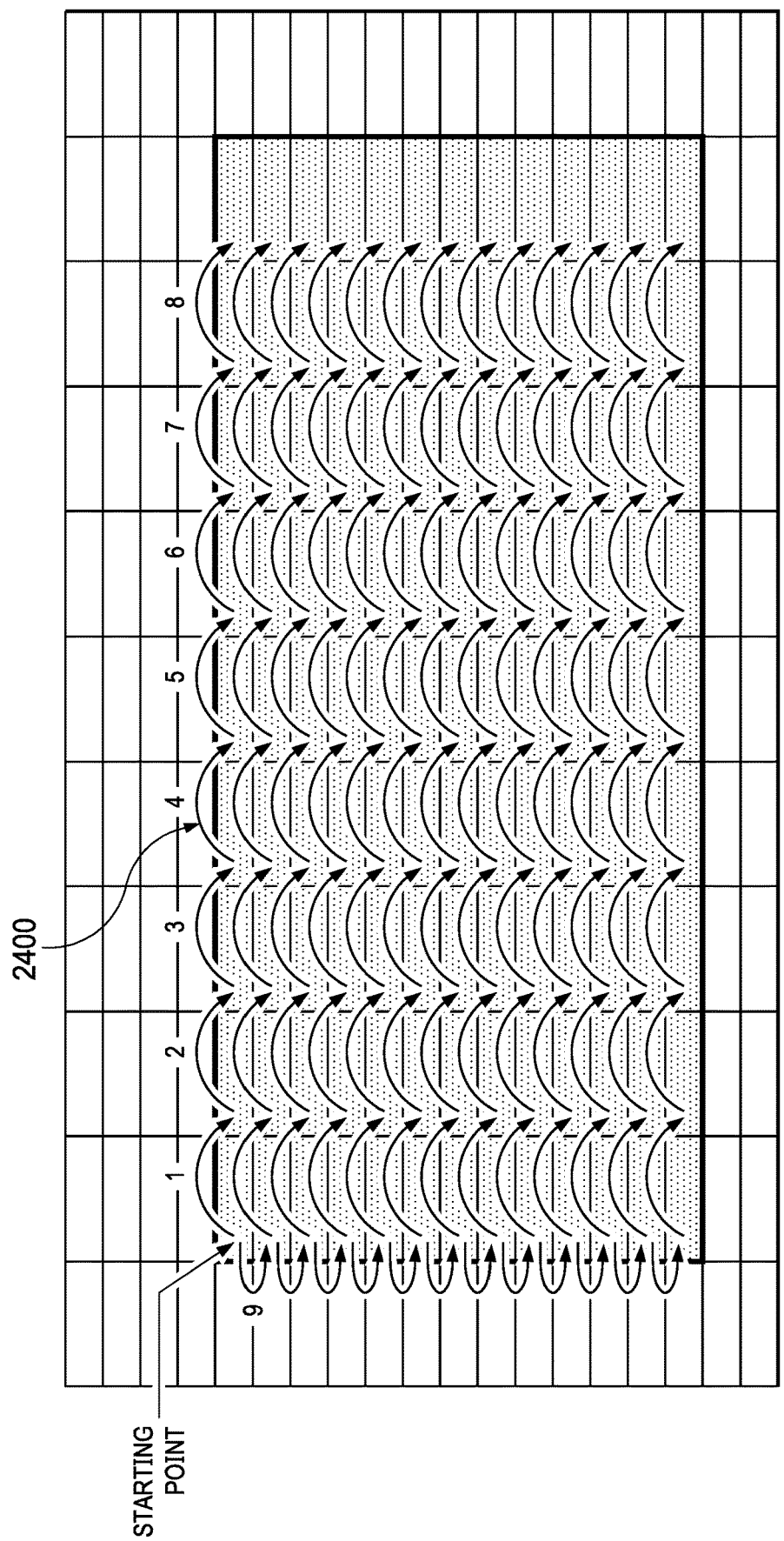
FIG. 24 illustrates the order of elements within the example stream of FIG. 23.

FIG. 24 illustrates the order of elements within the example stream of FIG. 23. The streaming engine fetches elements for the stream in the order illustrated in order 2400. The first nine elements come from the first row of rectangle 2320, left-to-right in hops 1 to 8. The 10th through 24th elements comes from the second row, and so on. When the stream moves from the 9th element to the 10th element (hop 9 in FIG. 24), the streaming engine computes the new location based on the position of the pointer at the start of the inner loop, not the position of the pointer at the end of the first dimension. Thus, DIM1 is independent of ELEM_BYTES and ICNT0. DIM1 represents the distance between the first bytes of each consecutive row.

Figure 25:
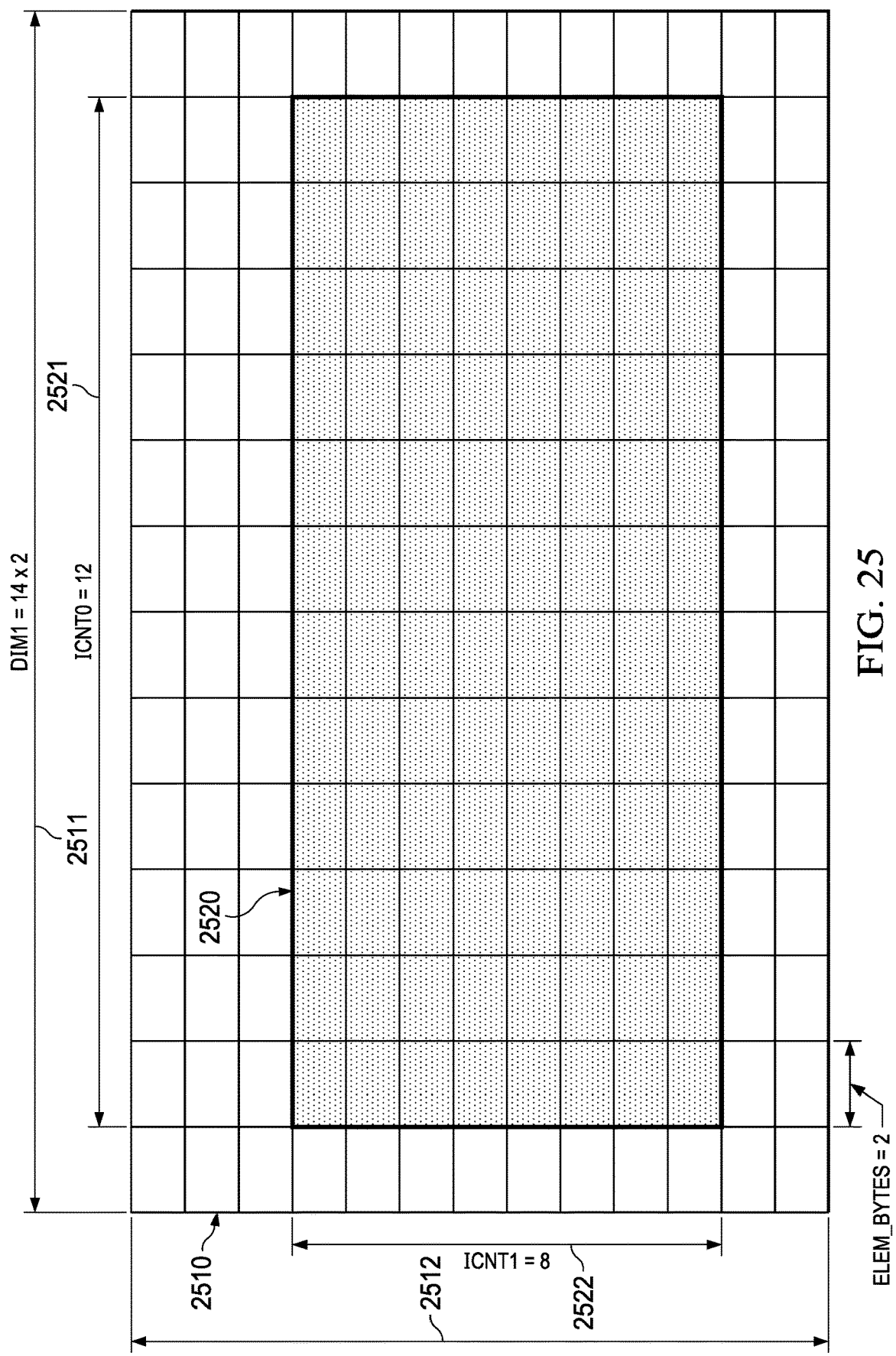
FIG. 25 illustrates extracting a smaller rectangle from a larger rectangle.

Transposed streams are accessed along dimension 1 before dimension 0. The following examples illustrate transposed streams with varying transposition granularity. FIG. 25 illustrates extracting a smaller rectangle 2520 (12×8) having dimensions 2521 and 2522 from a larger rectangle 2510 (14×13) having dimensions 2511 and 2512. In FIG. 25, ELEM_BYTES equal 2.

Figure 26:
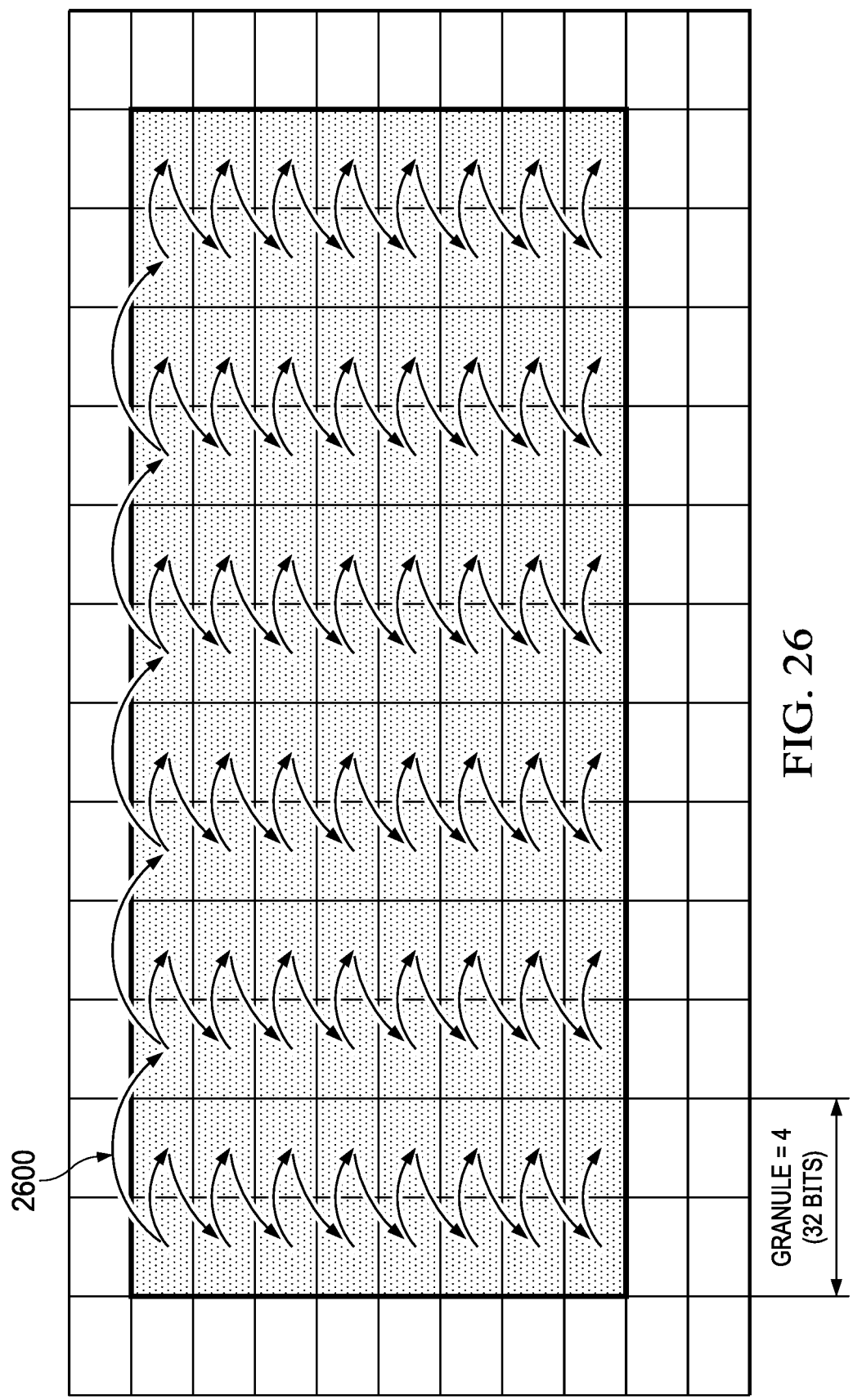
FIG. 26 illustrates how an example streaming engine fetches a stream with a transposition granularity of 4 bytes.

FIG. 26 illustrates how the streaming engine fetches the stream of the example stream of FIG. 25 with a transposition granularity of four bytes. Fetch pattern 2600 fetches pairs of elements from each row (because the granularity of four is twice the ELEM_BYTES of two), but otherwise moves down the columns. Once the streaming engine reaches the bottom of a pair of columns, the streaming engine repeats the pattern with the next pair of columns.

Figure 27:
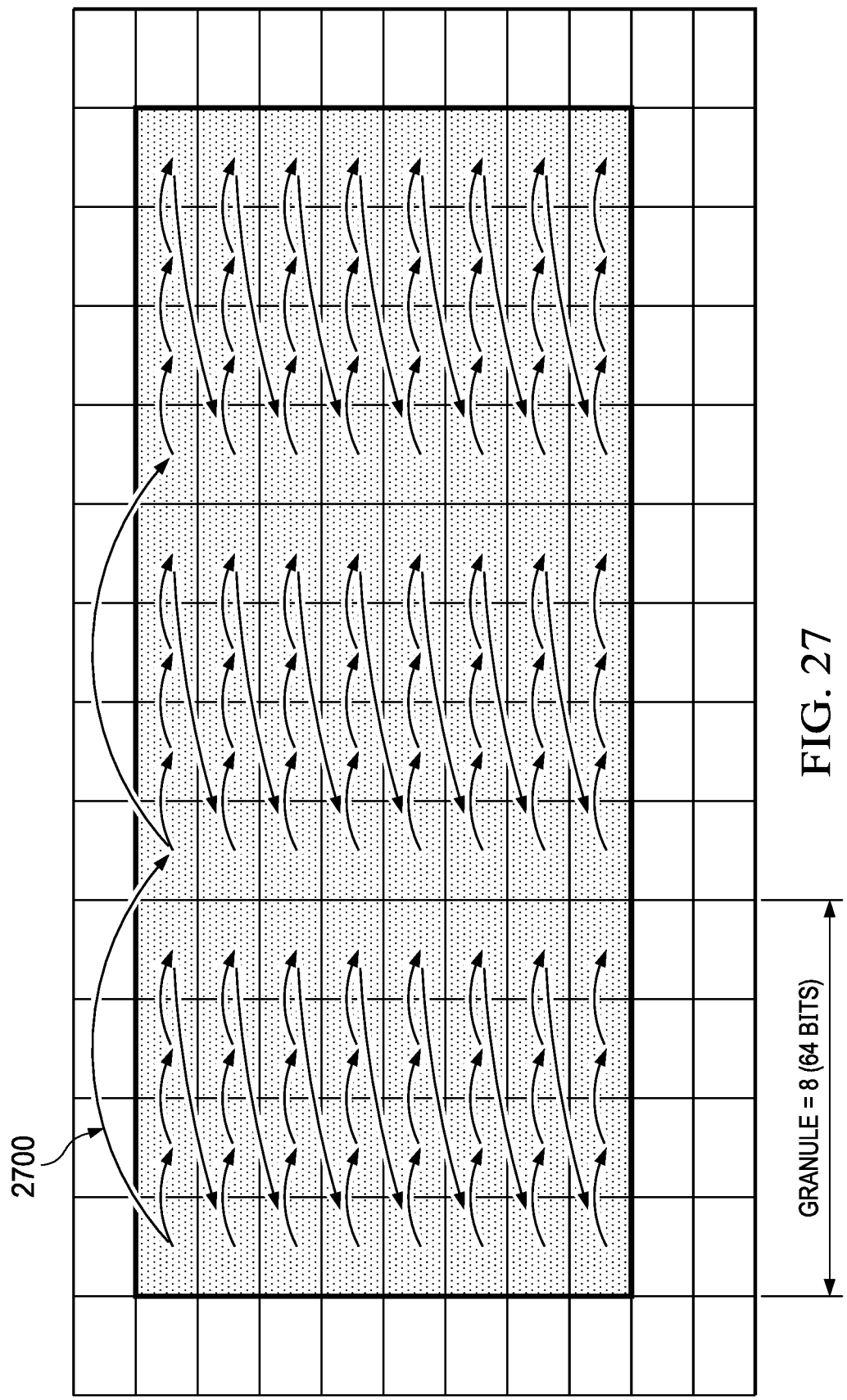
FIG. 27 illustrates how an example streaming engine fetches a stream with a transposition granularity of 8 bytes.

FIG. 27 illustrates how the streaming engine fetches the stream of the example stream of FIG. 25 with a transposition granularity of eight bytes. The overall structure remains the same. The streaming engine fetches four elements from each row (because the granularity of eight is four times the ELEM_BYTES of two) before moving to the next row in the column as shown in fetch pattern 2700.

The streams examined so far read each element from memory exactly once. A stream can read a given element from memory multiple times, in effect looping over a portion of memory. FIR filters exhibit two common looping patterns: re-reading the same filter taps for each output and reading input samples from a sliding window. Two consecutive outputs need inputs from two overlapping windows.

Figure 28:
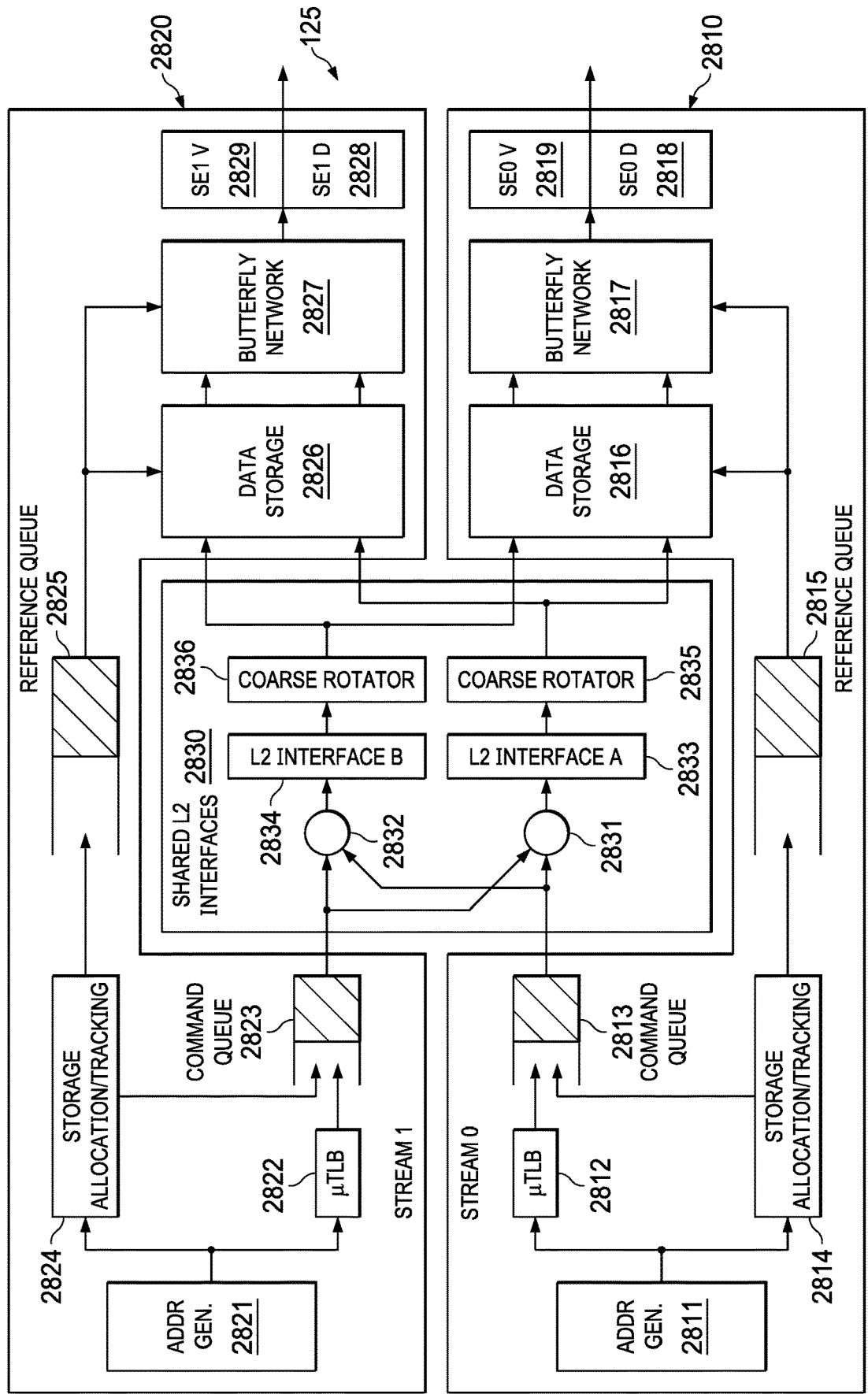
FIG. 28 illustrates the details of an example streaming engine.

FIG. 28 illustrates the details of streaming engine 125 of FIG. 1. Streaming engine 125 contains three major sections: Stream 0 2810; Stream 1 2820; and Shared L2 Interfaces 2830. Stream 0 2810 and Stream 1 2820 both contain identical hardware that operates in parallel. Stream 0 2810 and Stream 1 2820 both share L2 interfaces 2830. Each stream 2810 and 2820 provides processing unit core 110 (FIG. 1) data at a rate of up to 512 bits/cycle, every cycle, which is enabled by the dedicated stream paths and shared dual L2 interfaces.

Each streaming engine 125 includes a respective dedicated 6-dimensional (6D) stream address generator 2811/2821 that can each generate one new non-aligned request per cycle. As is further described herein, address generators 2811/2821 output 512-bit aligned addresses that overlap the elements in the sequence defined by the stream parameters.

Each address generator 2811/2821 connects to a respective dedicated micro table look-aside buffer (μTLB) 2812/2822. The μTLB 2812/2822 converts a single 48-bit virtual address to a 44-bit physical address each cycle. Each μTLB 2812/2822 has 8 entries, covering a minimum of 32 kB with 4 kB pages or a maximum of 16 MB with 2 MB pages. Each address generator 2811/2821 generates 2 addresses per cycle. The μTLB 2812/2822 only translates one address per cycle. To maintain throughput, streaming engine 125 operates under the assumption that most stream references are within the same 4 kB page. Thus, the address translation does not modify bits 0 to 11 of the address. If aout0 and aout1 line in the same 4 kB page (aout0[47:12] are the same aout1[47:12]), then the μTLB 2812/2822 only translates aout0 and reuses the translation for the upper bits of both addresses.

Translated addresses are queued in respective command queue 2813/2823. These addresses are aligned with information from the respective corresponding Storage Allocation and Tracking block 2814/2824. Streaming engine 125 does not explicitly manage μTLB 2812/2822. The system memory management unit (MMU) invalidates μTLBs as necessary during context switches.

Storage Allocation and Tracking 2814/2824 manages the internal storage of the stream, discovering data reuse and tracking the lifetime of each piece of data. The block accepts two virtual addresses per cycle and binds those addresses to slots in the internal storage if the addresses are not already allocated to slots. The data store is organized as an array of slots. The streaming engine maintains the following metadata to track the contents and lifetime of the data in each slot: a 49-bit virtual address associated with the slot, a valid bit indicating whether the tag address is valid, a ready bit indicating data has arrived for the address, an active bit indicating if there are any outstanding references to the data, and a last reference value indicating the most recent reference to the slot in the reference queue. The storage allocation and tracking are further described herein.

Respective reference queue 2815/2825 stores the sequence of references generated by the respective corresponding address generator 2811/2821. The reference sequence enables the data formatting network to present data to processing unit core 110 in the correct order. Each entry in respective reference queue 2815/2825 contains the information necessary to read data out of the data store and align the data for processing unit core 110. Respective reference queue 2815/2825 maintains the information listed in Table 6 in each slot.

TABLE 6

| | |
|---|---|
| Data Slot Low | Slot number for the lower half of data associated with aout0 |
| Data Slot High | Slot number for the upper half of data associated with aout1 |
| Rotation | Number of bytes to rotate data to align next element with lane 0 |
| Length | Number of valid bytes in this reference |

Storage allocation and tracking 2814/2824 inserts references in reference queue 2815/2825 as address generator 2811/2821 generates new addresses. Storage allocation and tracking 2814/2824 removes references from reference queue 2815/2825 when the data becomes available and there is room in the stream head registers. As storage allocation and tracking 2814/2824 removes slot references from reference queue 2815/2825 and formats data, the references are checked for the last reference to the corresponding slots. Storage allocation and tracking 2814/2824 compares reference queue 2815/2825 removal pointer against the recorded last reference of the slot. If the pointer and the recorded last reference match, then storage allocation and tracking 2814/2824 marks the slot inactive once the data is no longer needed.

Streaming engine 125 has respective data storage 2816/2826 for a selected number of elements. Deep buffering allows the streaming engine to fetch far ahead in the stream, hiding memory system latency. Each data storage 2816/2826 accommodates two simultaneous read operations and two simultaneous write operations per cycle and each is therefore referred to a two-read, two-write (2r2w) data storage. In other examples, the amount of buffering can be different. In the current example, streaming engine 125 dedicates 32 slots to each stream with each slot tagged by the previously described metadata. Each slot holds 64 bytes of data in eight banks of eight bytes.

Data storage 2816/2826 and the respective storage allocation/tracking logic 2814/2824 and reference queues 2815/2825 implement the data FIFO 1902 discussed with reference to FIG. 19.

Respective butterfly network 2817/2827 includes a seven-stage butterfly network that implements the formatter 1903 (FIG. 19, FIG. 20). Butterfly network 2817/2827 receives 128 bytes of input and generates 64 bytes of output. The first stage of the butterfly is actually a half-stage that collects bytes from both slots that match a non-aligned fetch and merges the collected bytes into a single, rotated 64-byte array. The remaining six stages form a standard butterfly network. Respective butterfly network 2817/2827 performs the following operations: rotates the next element down to byte lane 0; promotes data types by a power of two, if requested; swaps real and imaginary components of complex numbers, if requested; and converts big endian to little endian if processing unit core 110 is presently in big endian mode. The user specifies element size, type promotion, and real/imaginary swap as part of the parameters of the stream.

Streaming engine 125 attempts to fetch and format data ahead of processing unit core 110's demand in order to maintain full throughput. Respective stream head registers 2818/2828 provide a small amount of buffering so that the process remains fully pipelined. Respective stream head registers 2818/2828 are not directly architecturally visible. Each stream also has a respective stream valid register 2819/2829. Valid registers 2819/2829 indicate which elements in the corresponding stream head registers 2818/2828 are valid.

The two streams 2810/2820 share a pair of independent L2 interfaces 2830: L2 Interface A (IFA) 2833 and L2 Interface B (IFB) 2834. Each L2 interface provides 512 bits/cycle throughput direct to the L2 controller 130 (FIG. 1) via respective buses 147/149 for an aggregate bandwidth of 1024 bits/cycle. The L2 interfaces use the credit-based multicore bus architecture (MBA) protocol. The MBA protocol is described in more detail in U.S. Pat. No. 9,904,645, "Multicore Bus Architecture with Non-Blocking High Performance Transaction Credit System," which is incorporated by reference herein. The L2 controller assigns a pool of command credits to each interface. The pool has sufficient credits so that each interface can send sufficient requests to achieve full read-return bandwidth when reading L2 RAM, L2 cache and multicore shared memory controller (MSMC) memory, as described in more detail herein.

To maximize performance, in this example both streams can use both L2 interfaces, allowing a single stream to send a peak command rate of two requests per cycle. Each interface prefers one stream over the other, but this preference changes dynamically from request to request. IFA 2833 and IFB 2834 prefer opposite streams, when IFA 2833 prefers Stream 0, IFB 2834 prefers Stream 1 and vice versa.

Respective arbiter 2831/2832 ahead of each respective interface 2833/2834 applies the following basic protocol on every cycle having credits available. Arbiter 2831/2832 checks if the preferred stream has a command ready to send. If so, arbiter 2831/2832 chooses that command. Arbiter 2831/2832 next checks if an alternate stream has at least two requests ready to send, or one command and no credits. If so, arbiter 2831/2832 pulls a command from the alternate stream. If either interface issues a command, the notion of preferred and alternate streams swap for the next request. Using this algorithm, the two interfaces dispatch requests as quickly as possible while retaining fairness between the two streams. The first rule ensures that each stream can send a request on every cycle that has available credits. The second rule provides a mechanism for one stream to borrow the interface of the other when the second interface is idle. The third rule spreads the bandwidth demand for each stream across both interfaces, ensuring neither interface becomes a bottleneck.

Respective coarse grain rotator 2835/2836 enables streaming engine 125 to support a transposed matrix addressing mode. In this mode, streaming engine 125 interchanges the two innermost dimensions of the multidimensional loop to access an array column-wise rather than row-wise. Respective rotators 2835/2836 are not architecturally visible.

Figure 29:
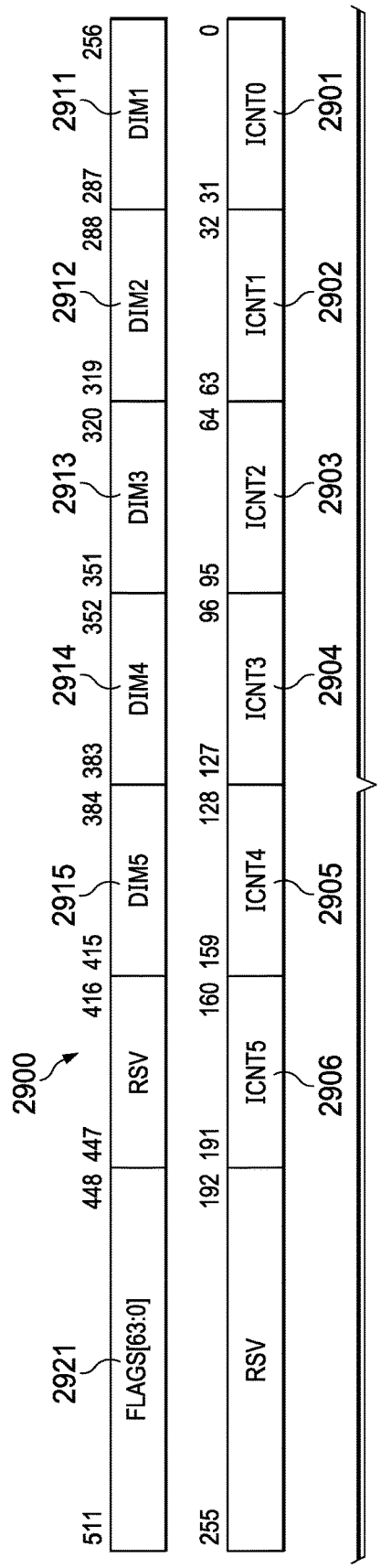
FIG. 29 illustrates an example stream template register.

FIG. 29 illustrates an example stream template register 2900. The stream definition template provides the full structure of a stream that contains data. The iteration counts and dimensions provide most of the structure, while the various flags provide the rest of the details. In this example, a single stream template 2900 is defined for all data-containing streams. All stream types supported by the streaming engine are covered by the template 2900. The streaming engine supports a six-level loop nest for addressing elements within the stream. Most of the fields in the stream template 2900 map directly to the parameters in that algorithm. The numbers above the fields are bit numbers within a 256-bit vector. Table 7 shows the stream field definitions of a stream template.

TABLE 7

| Field Name | FIG. 29 Reference Number | Description | Size Bits |
|---|---|---|---|
| ICNT0 | 2901 | Iteration count for loop 0 | 32 |
| ICNT1 | 2902 | Iteration count for loop 1 | 32 |
| ICNT2 | 2903 | Iteration count for loop 2 | 32 |
| ICNT3 | 2904 | Iteration count for loop 3 | 32 |
| ICNT4 | 2905 | Iteration count for loop 4 | 32 |
| ICNT5 | 2906 | Iteration count for loop 5 | 32 |
| DIM1 | 2911 | Signed dimension for loop 1 | 32 |
| DIM2 | 2912 | Signed dimension for loop 2 | 32 |
| DIM3 | 2913 | Signed dimension for loop 3 | 32 |
| DIM4 | 2914 | Signed dimension for loop 4 | 32 |
| DIM5 | 2915 | Signed dimension for loop 5 | 32 |
| FLAGS | 2921 | Stream modifier flags | 64 |

Loop 0 is the innermost loop and loop 5 is the outermost loop. In the current example, DIM0 is equal to ELEM_BYTES defining physically contiguous data. Thus, the stream template register 2900 does not define DIM0. Streaming engine 125 interprets iteration counts as unsigned integers and dimensions as unscaled signed integers. An iteration count of zero at any level (ICNT0, ICNT1, ICNT2, ICNT3, ICNT4 or ICNT5) indicates an empty stream. Each iteration count must be at least one to define a valid stream. The template above specifies the type of elements, length and dimensions of the stream. The stream instructions separately specify a start address, e.g., by specification of a scalar register in scalar register file 211 which stores the start address. Thus, a program can open multiple streams using the same template but different registers storing the start address.

Figure 30:
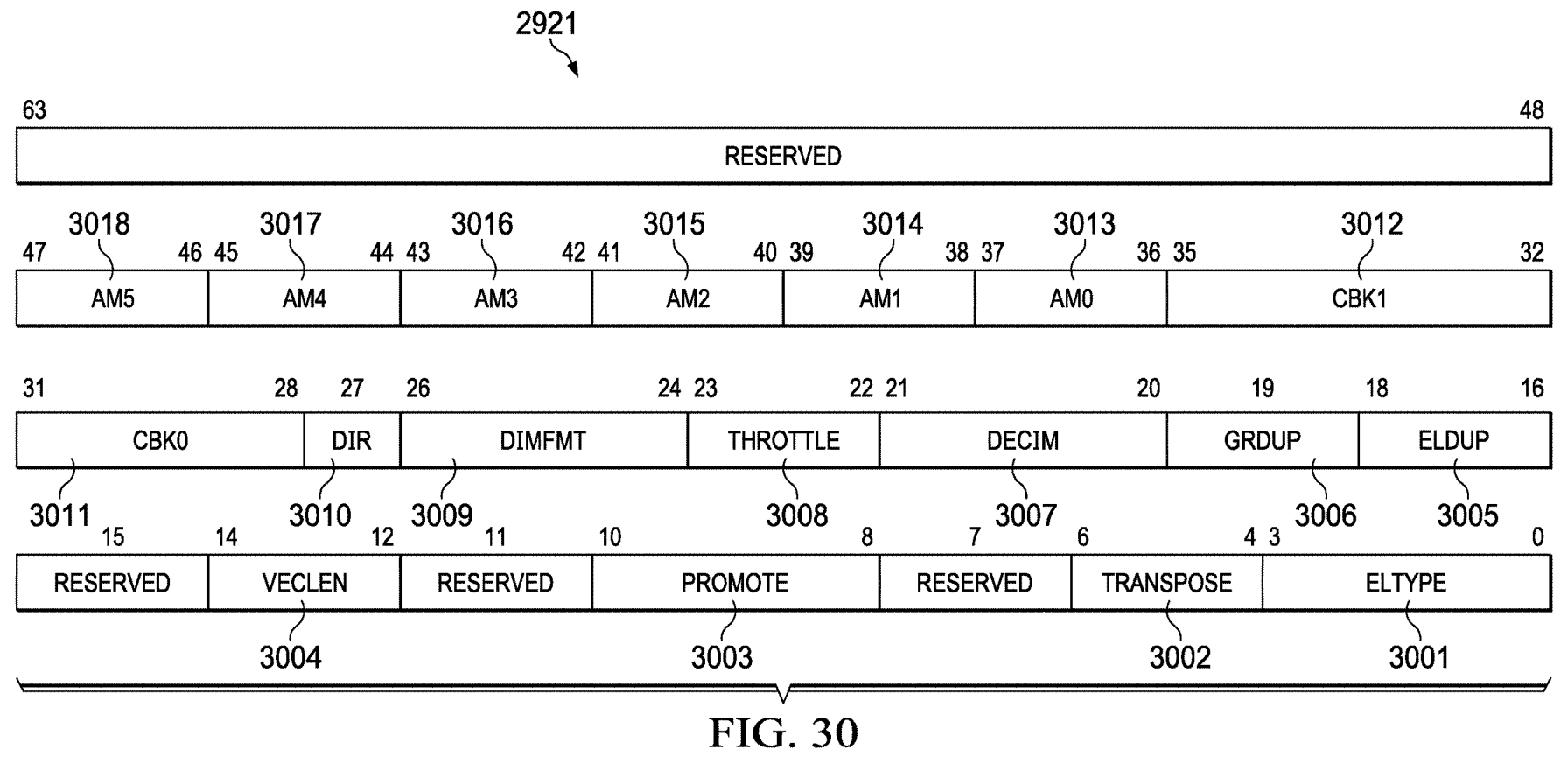

FIG. 30 illustrates an example of sub-field definitions of the flags field 2921 shown in FIG. 29. As shown in FIG. 30, the flags field 2911 is 6 bytes or 48 bits. FIG. 30 shows bit numbers of the fields. Table 8 shows the definition of these fields.

TABLE 8

| Field Name | FIG. 30 Reference Number | Description | Size Bits |
|---|---|---|---|
| ELTYPE | 3001 | Type of data element | 4 |
| TRANSPOSE | 3002 | Two-dimensional transpose mode | 3 |
| PROMOTE | 3003 | Promotion mode | 3 |
| VECLEN | 3004 | Stream vector length | 3 |
| ELDUP | 3005 | Element duplication | 3 |
| GRDUP | 3006 | Group duplication | 1 |
| DECIM | 3007 | Element decimation | 2 |
| THROTTLE | 3008 | Fetch ahead throttle mode | 2 |
| DIMFMT | 3009 | Stream dimensions format | 3 |
| DIR | 3010 | Stream direction 0 forward direction 1 reverse direction | 1 |
| CBK0 | 3011 | First circular block size number | 4 |
| CBK1 | 3012 | Second circular block size number | 4 |
| AM0 | 3013 | Addressing mode for loop 0 | 2 |
| AM1 | 3014 | Addressing mode for loop 1 | 2 |
| AM2 | 3015 | Addressing mode for loop 2 | 2 |
| AM3 | 3016 | Addressing mode for loop 3 | 2 |
| AM4 | 3017 | Addressing mode for loop 4 | 2 |
| AMS | 3018 | Addressing mode for loop 5 | 2 |

The Element Type (ELTYPE) field 3001 defines the data type of the elements in the stream. The coding of the four bits of the ELTYPE field 3001 is defined as shown in Table 9.

TABLE 9

| ELTYPE | Real/ Complex | Sub-element Size Bits | Total Element Size Bits |
|---|---|---|---|
| 0000 | real | 8 | 8 |
| 0001 | real | 16 | 16 |
| 0010 | real | 32 | 32 |
| 0011 | real | 64 | 64 |
| 0100 | reserved | | |
| 0101 | reserved | | |
| 0110 | reserved | | |
| 0111 | reserved | | |
| 1000 | complex no swap | 8 | 16 |
| 1001 | complex no swap | 16 | 32 |
| 1010 | complex no swap | 32 | 64 |
| 1011 | complex no swap | 64 | 128 |
| 1100 | complex swapped | 8 | 16 |
| 1101 | complex swapped | 16 | 32 |
| 1110 | complex swapped | 32 | 64 |
| 1111 | complex swapped | 64 | 128 |

Real/Complex Type determines whether the streaming engine treats each element as a real number or two parts (real/imaginary or magnitude/angle) of a complex number and also specifies whether to swap the two parts of complex numbers. Complex types have a total element size twice the sub-element size. Otherwise, the sub-element size equals the total element size.

Sub-Element Size determines the type for purposes of type promotion and vector lane width. For example, 16-bit sub-elements get promoted to 32-bit sub-elements or 64-bit sub-elements when a stream requests type promotion. The vector lane width matters when processing unit core 110 (FIG. 1) operates in big endian mode, as the core 110 lays out vectors in little endian order.

Total Element Size specifies the minimal granularity of the stream which determines the number of bytes the stream fetches for each iteration of the innermost loop. Streams read whole elements, either in increasing or decreasing order. Therefore, the innermost dimension of a stream spans ICNT0×total-element-size bytes.

The TRANSPOSE field 3002 determines whether the streaming engine accesses the stream in a transposed order. The transposed order exchanges the inner two addressing levels. The TRANSPOSE field 3002 also indicated the granularity for transposing the stream. The coding of the three bits of the TRANSPOSE field 3002 is defined as shown in Table 10 for normal 2D operations.

TABLE 10

| Transpose | Meaning |
|---|---|
| 000 | Transpose disabled |
| 001 | Transpose on 8-bit boundaries |
| 010 | Transpose on 16-bit boundaries |
| 011 | Transpose on 32-bit boundaries |
| 100 | Transpose on 64-bit boundaries |
| 101 | Transpose on 128-bit boundaries |
| 110 | Transpose on 256-bit boundaries |
| 111 | Reserved |

Streaming engine 125 can transpose data elements at a different granularity than the element size thus allowing programs to fetch multiple columns of elements from each row. The transpose granularity cannot be smaller than the element size. The TRANSPOSE field 3002 interacts with the DIMFMT field 3009 in a manner further described below.

The PROMOTE field 3003 controls whether the streaming engine promotes sub-elements in the stream and the type of promotion. When enabled, streaming engine 125 promotes types by powers-of-2 sizes. The coding of the three bits of the PROMOTE field 3003 is defined as shown in Table 11.

When PROMOTE is 000, corresponding to a 1× promotion, each sub-element is unchanged and occupies a vector lane equal in width to the size specified by ELTYPE. When PROMOTE is 001, corresponding to a 2× promotion and zero extend, each sub-element is treated as an unsigned integer and zero extended to a vector lane twice the width specified by ELTYPE. A 2× promotion is invalid for an initial sub-element size of 64 bits. When PROMOTE is 010, corresponding to a 4× promotion and zero extend, each sub-element is treated as an unsigned integer and zero extended to a vector lane four times the width specified by ELTYPE. A 4× promotion is invalid for an initial sub-element size of 32 or 64 bits.

When PROMOTE is 011, corresponding to an 8× promotion and zero extend, each sub-element is treated as an unsigned integer and zero extended to a vector lane eight times the width specified by ELTYPE. An 8× promotion is invalid for an initial sub-element size of 16, 32 or 64 bits. When PROMOTE is 101, corresponding to a 2× promotion and sign extend, each sub-element is treated as a signed integer and sign extended to a vector lane twice the width specified by ELTYPE. A 2× promotion is invalid for an initial sub-element size of 64 bits.

When PROMOTE is 110, corresponding to a 4× promotion and sign extend, each sub-element is treated as a signed integer and sign extended to a vector lane four times the width specified by ELTYPE. A 4× promotion is invalid for an initial sub-element size of 32 or 64 bits. When PROMOTE is 111, corresponding to an 8× promotion and zero extend, each sub-element is treated as a signed integer and sign extended to a vector lane eight times the width specified by ELTYPE. An 8× promotion is invalid for an initial sub-element size of 16, 32 or 64 bits.

The VECLEN field 3004 defines the stream vector length for the stream in bytes. Streaming engine 125 breaks the stream into groups of elements that are VECLEN bytes long. The coding of the three bits of the VECLEN field 3004 is defined as shown in Table 12. VECLEN cannot be less than the product of the element size in bytes and the duplication factor. As shown in Table 11, the maximum VECLEN of 64 bytes equals the preferred vector size of vector data path side B 116. When VECLEN is shorter than the native vector width of processing unit core 110, streaming engine 125 pads the extra lanes in the vector provided to processing unit core 110. The GRDUP field 3006 determines the type of padding. The VECLEN field 3004 interacts with ELDUP field 3005 and GRDUP field 3006 in a manner detailed below.

TABLE 11

| PROMOTE | Promotion Factor | Promotion Type | Resulting Sub-element Size | | | |
|---|---|---|---|---|---|---|
| | | | 8-bit | 16-bit | 32-bit | 64-bit |
| 000 | 1x | N/A | 8-bit | 16-bit | 32-bit | 64-bit |
| 001 | 2x | zero extend | 16-bit | 32-bit | 64-bit | Invalid |
| 010 | 4x | zero extend | 32-bit | 64-bit | Invalid | Invalid |
| 011 | 8x | zero extend | 64-bit | Invalid | Invalid | Invalid |
| 100 | | | reserved | | | |
| 101 | 2x | sign extend | 16-bit | 32-bit | 64-bit | Invalid |
| 110 | 4x | sign extend | 32-bit | 64-bit | Invalid | Invalid |
| 111 | 8x | sign extend | 64-bit | Invalid | Invalid | Invalid |

TABLE 12

| VECLEN | Stream Vector Length |
|---|---|
| 000 | 1 byte |
| 001 | 2 bytes |
| 010 | 4 bytes |
| 011 | 8 bytes |
| 100 | 16 bytes |
| 101 | 32 bytes |
| 110 | 64 bytes |
| 111 | Reserved |

The ELDUP field 3005 specifies the number of times to duplicate each element. The element size multiplied with the element duplication amount cannot exceed the 64 bytes. The coding of the three bits of the ELDUP field 3005 is defined as shown in Table 13. The ELDUP field 3005 interacts with VECLEN field 3004 and GRDUP field 3006 in a manner detailed below. The nature of the relationship between the permitted element size, the element duplication factor, and the destination vector length requires that a duplicated element that overflows the first destination register fills an integer number of destination registers upon completion of duplication. The data of the additional destination registers eventually supplies the respective stream head register 2818/2828. Upon completion of duplication of a first data element, the next data element is rotated down to the least significant bits of source register 3100 discarding the first data element. The process then repeats for the new data element.

TABLE 13

| ELDUP | Duplication Factor |
|---|---|
| 000 | No Duplication |
| 001 | 2 times |
| 010 | 4 times |
| 011 | 8 times |
| 100 | 16 times |
| 101 | 32 times |
| 110 | 64 times |
| 111 | Reserved |

The GRDUP bit 3006 determines whether group duplication is enabled. If GRDUP bit 3006 is 0, then group duplication is disabled. If the GRDUP bit 3006 is 1, then group duplication is enabled. When enabled by GRDUP bit 3006, streaming engine 125 duplicates a group of elements to fill the vector width. VECLEN field 3004 defines the length of the group to replicate. When VECLEN field 3004 is less than the vector length of processing unit core 110 and GRDUP bit 3006 enables group duplication, streaming engine 125 fills the extra lanes (see FIGS. 21 and 22) with additional copies of the stream vector. Because stream vector length and vector length of processing unit core 110 are integral powers of two, group duplication produces an integral number of duplicate copies. Note GRDUP and VECLEN do not specify the number of duplications. The number of duplications performed is based upon the ratio of VECLEN to the native vector length, which is 64 bytes/512 bits in this example.

The GRDUP field 3006 specifies how stream engine 125 pads stream vectors for bits following the VECLEN length to the vector length of processing unit core 110. When GRDUP bit 3006 is 0, streaming engine 125 fills the extra lanes with zeros and marks the extra vector lanes invalid. When GRDUP bit 3006 is 1, streaming engine 125 fills extra lanes with copies of the group of elements in each stream vector. Setting GRDUP bit 3006 to 1 has no effect when VECLEN is set to the native vector width of processing unit core 110. VECLEN must be at least as large as the product of ELEM_BYTES and the element duplication factor ELDUP. That is, an element or the duplication factor number of elements cannot be separated using VECLEN.

Group duplication operates to the destination vector size. Group duplication does not change the data supplied when the product of the element size ELEM_BYTES and element duplication factor ELDUP equals or exceeds the destination vector width. Under such conditions, the states of the GRDUP bit 3006 and the VECLEN field 3004 have no effect on the supplied data.

The set of examples below illustrate the interaction between VECLEN and GRDUP. Each of the following examples show how the streaming engine maps a stream onto vectors across different stream vector lengths and the vector size of vector data path side B 116. The stream of this example includes twenty-nine elements (E0 to E28) of 64 bits/8 bytes. The stream can be a linear stream of twenty-nine elements or an inner loop of 29 elements. The tables illustrate eight byte lanes such as shown in FIG. 21. Each illustrated vector is stored in the respective stream head register 2818/2828 in turn.

Table 14 illustrates how the example stream maps onto bits within the 64-byte processor vectors when VECLEN is 64 bytes. As shown in Table 14, the stream extends over four vectors. As previously described, the lanes within vector 4 that extend beyond the stream are zero filled. When VECLEN has a size equal to the native vector length, the value of GRDUP does not matter as no duplication can take place with such a VECLEN.

TABLE 14

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | E7 | E6 | E5 | E4 | E3 | E2 | E1 | E0 |
| 2 | E15 | E14 | E13 | E12 | E11 | E10 | E9 | E8 |
| 3 | E23 | E22 | E21 | E20 | E19 | E18 | E17 | E16 |
| 4 | 0 | 0 | 0 | E28 | E27 | E26 | E25 | E24 |

Table 15 shows the same parameters as shown in Table 14, except with VECLEN of 32 bytes. Group duplicate is disabled (GRDUP=0). The twenty-nine elements of the stream are distributed over lanes 0 to 3 in eight vectors. Extra lanes 4 to 7 in vectors 1-7 are zero filled. In vector 8, lane 1 has a stream element (E28) and the other lanes are zero filled.

TABLE 15

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | 0 | 0 | 0 | 0 | E3 | E2 | E1 | E0 |
| 2 | 0 | 0 | 0 | 0 | E7 | E6 | E5 | E4 |
| 3 | 0 | 0 | 0 | 0 | E11 | E10 | E9 | E8 |
| 4 | 0 | 0 | 0 | 0 | E15 | E14 | E13 | E12 |
| 5 | 0 | 0 | 0 | 0 | E19 | E18 | E17 | E16 |
| 6 | 0 | 0 | 0 | 0 | E23 | E22 | E21 | E20 |
| 7 | 0 | 0 | 0 | 0 | E27 | E26 | E25 | E24 |
| 8 | 0 | 0 | 0 | 0 | 0 | 0 | 0 | E28 |

Table 16 shows the same parameters as shown in Table 14, except with VECLEN of sixteen bytes. Group duplicate is disabled (GRDUP=0). The twenty-nine elements of the stream are distributed over lane 0 and lane 1 in fifteen vectors. Extra lanes 2 to 7 in vectors 1-14 are zero filled. In vector 15, lane 1 has a stream element (E28) and the other lanes are zero filled.

TABLE 16

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | 0 | 0 | 0 | 0 | 0 | 0 | E1 | E0 |
| 2 | 0 | 0 | 0 | 0 | 0 | 0 | E3 | E2 |
| 3 | 0 | 0 | 0 | 0 | 0 | 0 | E5 | E4 |
| 4 | 0 | 0 | 0 | 0 | 0 | 0 | E7 | E6 |
| 5 | 0 | 0 | 0 | 0 | 0 | 0 | E9 | E8 |
| 6 | 0 | 0 | 0 | 0 | 0 | 0 | E11 | E10 |
| 7 | 0 | 0 | 0 | 0 | 0 | 0 | E13 | E12 |
| 8 | 0 | 0 | 0 | 0 | 0 | 0 | E15 | E14 |
| 9 | 0 | 0 | 0 | 0 | 0 | 0 | E17 | E16 |
| 10 | 0 | 0 | 0 | 0 | 0 | 0 | E19 | E18 |
| 11 | 0 | 0 | 0 | 0 | 0 | 0 | E21 | E20 |
| 12 | 0 | 0 | 0 | 0 | 0 | 0 | E23 | E22 |
| 13 | 0 | 0 | 0 | 0 | 0 | 0 | E25 | E24 |
| 14 | 0 | 0 | 0 | 0 | 0 | 0 | E27 | E26 |
| 15 | 0 | 0 | 0 | 0 | 0 | 0 | 0 | E28 |

Table 17 shows the same parameters as shown in Table 14, except with VECLEN of eight bytes. Group duplicate is disabled (GRDUP=0). The twenty-nine elements of the stream appear in lane 0 in twenty-nine vectors. Extra lanes 1-7 in vectors 1-29 are zero filled.

TABLE 17

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | 0 | 0 | 0 | 0 | 0 | 0 | 0 | E0 |
| 2 | 0 | 0 | 0 | 0 | 0 | 0 | 0 | E1 |
| 3 | 0 | 0 | 0 | 0 | 0 | 0 | 0 | E2 |
| 4 | 0 | 0 | 0 | 0 | 0 | 0 | 0 | E3 |
| 5 | 0 | 0 | 0 | 0 | 0 | 0 | 0 | E4 |
| 6 | 0 | 0 | 0 | 0 | 0 | 0 | 0 | E5 |
| 7 | 0 | 0 | 0 | 0 | 0 | 0 | 0 | E6 |
| 8 | 0 | 0 | 0 | 0 | 0 | 0 | 0 | E7 |
| 9 | 0 | 0 | 0 | 0 | 0 | 0 | 0 | E8 |
| 10 | 0 | 0 | 0 | 0 | 0 | 0 | 0 | E9 |
| 11 | 0 | 0 | 0 | 0 | 0 | 0 | 0 | E10 |
| 12 | 0 | 0 | 0 | 0 | 0 | 0 | 0 | E11 |
| 13 | 0 | 0 | 0 | 0 | 0 | 0 | 0 | E12 |
| 14 | 0 | 0 | 0 | 0 | 0 | 0 | 0 | E13 |
| 15 | 0 | 0 | 0 | 0 | 0 | 0 | 0 | E14 |
| 16 | 0 | 0 | 0 | 0 | 0 | 0 | 0 | E15 |
| 17 | 0 | 0 | 0 | 0 | 0 | 0 | 0 | E16 |
| 18 | 0 | 0 | 0 | 0 | 0 | 0 | 0 | E17 |
| 19 | 0 | 0 | 0 | 0 | 0 | 0 | 0 | E18 |
| 20 | 0 | 0 | 0 | 0 | 0 | 0 | 0 | E19 |
| 21 | 0 | 0 | 0 | 0 | 0 | 0 | 0 | E20 |
| 22 | 0 | 0 | 0 | 0 | 0 | 0 | 0 | E21 |
| 23 | 0 | 0 | 0 | 0 | 0 | 0 | 0 | E22 |
| 24 | 0 | 0 | 0 | 0 | 0 | 0 | 0 | E23 |
| 25 | 0 | 0 | 0 | 0 | 0 | 0 | 0 | E24 |
| 26 | 0 | 0 | 0 | 0 | 0 | 0 | 0 | E25 |
| 27 | 0 | 0 | 0 | 0 | 0 | 0 | 0 | E26 |
| 28 | 0 | 0 | 0 | 0 | 0 | 0 | 0 | E27 |
| 29 | 0 | 0 | 0 | 0 | 0 | 0 | 0 | E28 |

Table 18 shows the same parameters as shown in Table 15, except with VECLEN of thirty-two bytes and group duplicate is enabled (GRDUP=1). The twenty-nine elements of the stream are distributed over lanes 0-7 in eight vectors. Each vector 1-7 includes four elements duplicated. The duplication factor (2) results because VECLEN (32 bytes) is half the native vector length of 64 bytes. In vector 8, lane 0 has a stream element (E28) and lanes 1-3 are zero filled. Lanes 4-7 of vector 9 duplicate this pattern.

TABLE 18

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | E3 | E2 | E1 | E0 | E3 | E2 | E1 | E0 |
| 2 | E7 | E6 | E5 | E4 | E7 | E6 | E5 | E4 |
| 3 | E11 | E10 | E9 | E8 | E11 | E10 | E9 | E8 |
| 4 | E15 | E14 | E13 | E12 | E15 | E14 | E13 | E12 |
| 5 | E19 | E18 | E17 | E16 | E19 | E18 | E17 | E16 |
| 6 | E23 | E22 | E21 | E20 | E23 | E22 | E21 | E20 |
| 7 | E27 | E26 | E25 | E24 | E27 | E26 | E25 | E24 |
| 8 | 0 | 0 | 0 | E28 | 0 | 0 | 0 | E28 |

Table 19 shows the same parameters as shown in Table 16, except with VECLEN of sixteen bytes. Group duplicate is enabled (GRDUP=1). The twenty-nine elements of the stream are distributed over lanes 0-7 in fifteen vectors. Each vector 1-7 includes two elements duplicated four times. The duplication factor (4) results because VECLEN (16 bytes) is one quarter the native vector length of 64 bytes. In vector 15, lane 0 has a stream element (E28) and lane 1 is zero filled. This pattern is duplicated in lanes 2 and 3, lanes 4 and 5, and lanes 6 and 7 of vector 15.

TABLE 19

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | E1 | E0 | E1 | E0 | E1 | E0 | E1 | E0 |
| 2 | E3 | E2 | E3 | E2 | E3 | E2 | E3 | E2 |
| 3 | E5 | E4 | E5 | E4 | E5 | E4 | E5 | E4 |
| 4 | E7 | E6 | E7 | E6 | E7 | E6 | E7 | E6 |
| 5 | E9 | E8 | E9 | E8 | E9 | E8 | E9 | E8 |
| 6 | E11 | E10 | E11 | E10 | E11 | E10 | E11 | E10 |
| 7 | E13 | E12 | E13 | E12 | E13 | E12 | E13 | E12 |
| 8 | E15 | E14 | E15 | E14 | E15 | E14 | E15 | E14 |
| 9 | E17 | E16 | E17 | E16 | E17 | E16 | E17 | E16 |
| 10 | E19 | E18 | E19 | E18 | E19 | E18 | E19 | E18 |
| 11 | E21 | E20 | E21 | E20 | E21 | E20 | E21 | E20 |
| 12 | E23 | E22 | E23 | E22 | E23 | E22 | E23 | E22 |
| 13 | E25 | E24 | E25 | E24 | E25 | E24 | E25 | E24 |
| 14 | E27 | E26 | E27 | E26 | E27 | E26 | E27 | E26 |
| 15 | 0 | E28 | 0 | E28 | 0 | E28 | 0 | E28 |

Table 20 shows the same parameters as shown in Table 17, except with VECLEN of eight bytes. Group duplicate is enabled (GRDUP=1). The twenty-nine elements of the stream all appear on lanes 0 to 7 in twenty-nine vectors. Each vector includes one element duplicated eight times. The duplication factor (8) results because VECLEN (8 bytes) is one eighth the native vector length of 64 bytes. Thus, each lane is the same in vectors 1-29.

TABLE 20

| Processor Vectors | Lane 7 | Lane 6 | Lane 5 | Lane 4 | Lane 3 | Lane 2 | Lane 1 | Lane 0 |
|---|---|---|---|---|---|---|---|---|
| 1 | E0 | E0 | E0 | E0 | E0 | E0 | E0 | E0 |
| 2 | E1 | E1 | E1 | E1 | E1 | E1 | E1 | E1 |
| 3 | E2 | E2 | E2 | E2 | E2 | E2 | E2 | E2 |
| 4 | E3 | E3 | E3 | E3 | E3 | E3 | E3 | E3 |
| 5 | E4 | E4 | E4 | E4 | E4 | E4 | E4 | E4 |
| 6 | E5 | E5 | E5 | E5 | E5 | E5 | E5 | E5 |
| 7 | E6 | E6 | E6 | E6 | E6 | E6 | E6 | E6 |
| 8 | E7 | E7 | E7 | E7 | E7 | E7 | E7 | E7 |
| 9 | E8 | E8 | E8 | E8 | E8 | E8 | E8 | E8 |
| 10 | E9 | E9 | E9 | E9 | E9 | E9 | E9 | E9 |
| 11 | E10 | E10 | E10 | E10 | E10 | E10 | E10 | E10 |
| 12 | E11 | E11 | E11 | E11 | E11 | E11 | E11 | E11 |
| 13 | E12 | E12 | E12 | E12 | E12 | E12 | E12 | E12 |
| 14 | E13 | E13 | E13 | E13 | E13 | E13 | E13 | E13 |
| 15 | E14 | E14 | E14 | E14 | E14 | E14 | E14 | E14 |

TABLE 20-continued

| Processor Vectors | Lane 7 | Lane 6 | Lane 5 | Lane 4 | Lane 3 | Lane 2 | Lane 1 | Lane 0 |
|---|---|---|---|---|---|---|---|---|
| 16 | E15 | E15 | E15 | E15 | E15 | E15 | E15 | E15 |
| 17 | E16 | E16 | E16 | E16 | E16 | E16 | E16 | E16 |
| 18 | E17 | E17 | E17 | E17 | E17 | E17 | E17 | E17 |
| 19 | E18 | E18 | E18 | E18 | E18 | E18 | E18 | E18 |
| 20 | E19 | E19 | E19 | E19 | E19 | E19 | E19 | E19 |
| 21 | E20 | E20 | E20 | E20 | E20 | E20 | E20 | E20 |
| 22 | E21 | E21 | E21 | E21 | E21 | E21 | E21 | E21 |
| 23 | E22 | E22 | E22 | E22 | E22 | E22 | E22 | E22 |
| 24 | E23 | E23 | E23 | E23 | E23 | E23 | E23 | E23 |
| 25 | E24 | E24 | E24 | E24 | E24 | E24 | E24 | E24 |
| 26 | E25 | E25 | E25 | E25 | E25 | E25 | E25 | E25 |
| 27 | E26 | E26 | E26 | E26 | E26 | E26 | E26 | E26 |
| 28 | E27 | E27 | E27 | E27 | E27 | E27 | E27 | E27 |
| 29 | E28 | E28 | E28 | E28 | E28 | E28 | E28 | E28 |

Figure 31:
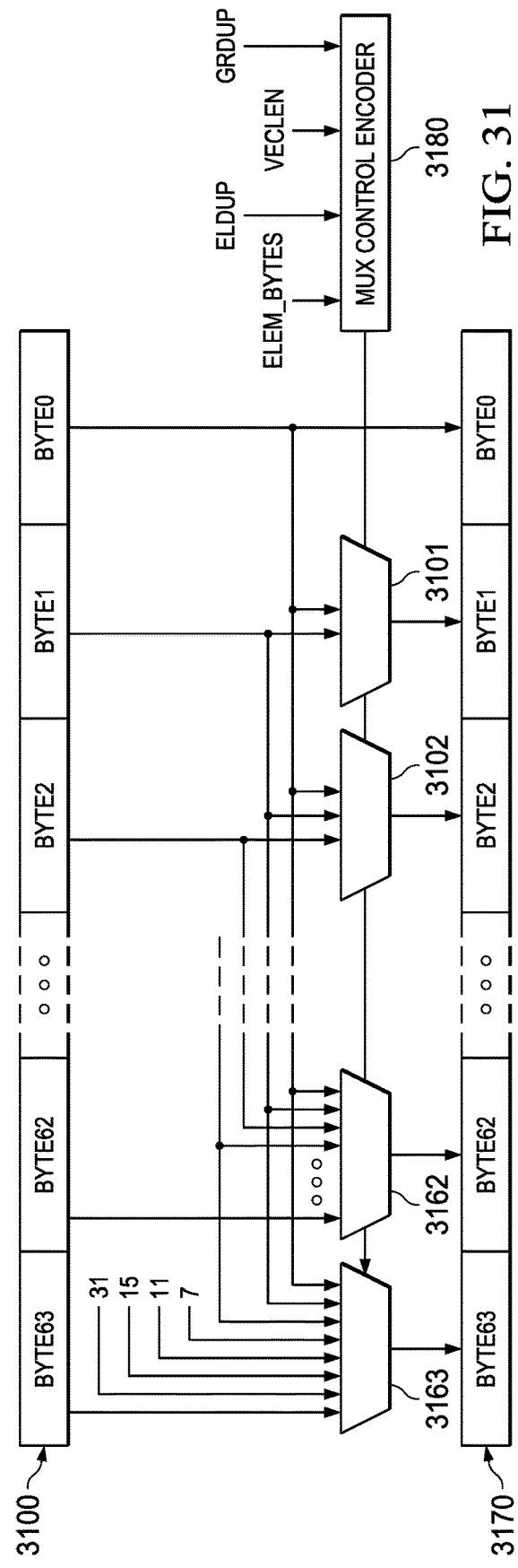
FIG. 31 illustrates an example of a vector length masking/group duplication block.

FIG. 31 illustrates an example of vector length masking/group duplication block 2025 (see FIG. 20) that is included within formatter block 1903 of FIG. 19. Input register 3100 receives a vector input from element duplication block 2024 shown in FIG. 20. Input register 3100 includes 64 bytes arranged in 64 1-byte blocks byte0 to byte63. Note that bytes byte0 to byte63 are each equal in length to the minimum of ELEM_BYTES. A set of multiplexers 3101 to 3163 couple input bytes from source register 3100 to output register 3170. Each respective multiplexer 3101 to 3163 supplies an input to a respective byte1 to byte63 of output register 3170. Not all input bytes byte0 to byte63 of input register 3100 are coupled to every multiplexer 3101 to 3163. Note there is no multiplexer supplying byte0 of output register 3170. In this example, byte0 of output register 3170 is supplied by byte0 of input register 3100.

Multiplexers 3101 to 3163 are controlled by multiplexer control encoder 3180. Multiplexer control encoder 3180 receives ELEM_BYTES, VECLEN and GRDUP input signals and generates respective control signals for multiplexers 3101 to 3163. ELEM_BYTES and ELDUP are supplied to multiplexer control encoder 3180 to check to see that VECLEN is at least as great as the product of ELEM_BYTES and ELDUP. In operation, multiplexer control encoder 3180 controls multiplexers 3101 to 3163 to transfer least significant bits equal in number to VECLEN from input register 3100 to output register 3170. If GRDUP=0 indicating group duplication disabled, then multiplexer control encoder 3180 controls the remaining multiplexers 3101 to 3163 to transfer zeros to all bits in the remaining most significant lanes of output register 3170. If GRDUP=1 indicating group duplication enabled, then multiplexer control encoder 3180 controls the remaining multiplexers 3101 to 3163 to duplicate the VECLEN number of least significant bits of input register 3100 into the most significant lanes of output register 3170. This control is similar to the element duplication control described above and fills the output register 3170 with the first vector. For the next vector, data within input register 3100 is rotated down by VECLEN, discarding the previous VECLEN least significant bits. The rate of data movement in formatter 1903 (FIG. 19) is set by the rate of consumption of data by processing unit core 110 (FIG. 1) via stream read and advance instructions described below. The group duplication formatting repeats as long as the stream includes additional data elements.

Element duplication (ELDUP) and group duplication (GRUDP) are independent. Note these features include independent specification and parameter setting. Thus, element duplication and group duplication can be used together or separately. Because of how these are specified, element duplication permits overflow to the next vector while group duplication does not.

Referring again to FIG. 30, the DECIM field 3007 controls data element decimation of the corresponding stream. Streaming engine 125 deletes data elements from the stream upon storage in respective stream head registers 2818/2828 for presentation to the requesting functional unit. Decimation removes whole data elements, not sub-elements. The DECIM field 3007 is defined as listed in Table 21.

TABLE 21

| DECIM | Decimation Factor |
|---|---|
| 00 | No Decimation |
| 01 | 2 times |
| 10 | 4 times |
| 11 | Reserved |

If DECIM field 3007 equals 00, then no decimation occurs. The data elements are passed to the corresponding stream head registers 2818/2828 without change. If DECIM field 3007 equals 01, then 2:1 decimation occurs. Streaming engine 125 removes odd number elements from the data stream upon storage in the stream head registers 2818/2828. Limitations in the formatting network require 2:1 decimation to be employed with data promotion by at least 2× (PROMOTE cannot be 000), ICNT0 must be multiple of 2, and the total vector length (VECLEN) must be large enough to hold a single promoted, duplicated element. For transposed streams (TRANSPOSE≠0), the transpose granule must be at least twice the element size in bytes before promotion. If DECIM field 3007 equals 10, then 4:1 decimation occurs. Streaming engine 125 retains every fourth data element removing three elements from the data stream upon storage in the stream head registers 2818/2828. Limitations in the formatting network require 4:1 decimation to be employed with data promotion by at least 4× (PROMOTE cannot be 000, 001 or 101), ICNT0 must be a multiple of 4 and the total vector length (VECLEN) must be large enough to hold a single promoted, duplicated element. For transposed streams (TRANSPOSE≠0), in one example, decimation removes columns, and does not remove rows. Thus, in such cases, the transpose granule must be at least twice the element size in bytes before promotion for 2:1 decimation (GRANULE≥2×ELEM_BYTES) and at least four times the element size in bytes before promotion for 4:1 decimation (GRANULE≥4×ELEM_BYTES).

The THROTTLE field 3008 controls how aggressively the streaming engine fetches ahead of processing unit core 110. The coding of the two bits of this field is defined as shown in Table 22.

TABLE 22

| THROTTLE | Description |
|---|---|
| 00 | Minimum throttling, maximum fetch ahead |
| 01 | Less throttling, more fetch ahead |
| 10 | More throttling, less fetch ahead |
| 11 | Maximum throttling, minimum fetch ahead |

THROTTLE does not change the meaning of the stream and serves only as a hint. The streaming engine can ignore this field. Programs should not rely on the specific throttle behavior for program correctness, because the architecture does not specify the precise throttle behavior. THROTTLE allows programmers to provide hints to the hardware about the program behavior. By default, the streaming engine attempts to get as far ahead of processing unit core 110 as possible to hide as much latency as possible (equivalent to THROTTLE=11), while providing full stream throughput to processing unit core 110. While some applications need this level of throughput, such throughput can cause bad system level behavior for others. For example, the streaming engine discards all fetched data across context switches. Therefore, aggressive fetch-ahead can lead to wasted bandwidth in a system with large numbers of context switches.

The DIMFMT field 3009 defines which of the loop count fields ICNT0 2901, ICNT1 2902, ICNT2 2903, ICNT3 2804, ICNT4 2905 and ICNT5 2906, of the loop dimension fields DIM1 2911, DIM2 2912, DIM3 2913, DIM4 2914 and DIM5 2915 and of the addressing mode fields AM0 3013, AM1 3014, AM2 3015, AM3 3016, AM4 3017 and AM5 3018 (part of FLAGS field 2921) of the stream template register 2900 are active for the particular stream. Table 23 lists the active loops for various values of the DIMFMT field 3009. Each active loop count must be at least 1 and the outer active loop count must be greater than 1.

TABLE 23

| DIMFMT | Loop5 | Loop4 | Loop3 | Loop2 | Loop1 | Loop0 |
|---|---|---|---|---|---|---|
| 000 | Inactive | Inactive | Inactive | Inactive | Inactive | Active |
| 001 | Inactive | Inactive | Inactive | Inactive | Active | Active |
| 010 | Inactive | Inactive | Inactive | Active | Active | Active |
| 011 | Inactive | Inactive | Active | Active | Active | Active |
| 100 | Inactive | Active | Active | Active | Active | Active |
| 101 | Active | Active | Active | Active | Active | Active |
| 110-111 | | | Reserved | | | |

The DIR bit 3010 determines the direction of fetch of the inner loop (Loop0). If the DIR bit 3010 is 0, Loop0 fetches are in the forward direction toward increasing addresses. If the DIR bit 3010 is 1, Loop0 fetches are in the backward direction toward decreasing addresses. The fetch direction of other loops is determined by the sign of the corresponding loop dimension DIM1, DIM2, DIM3, DIM4 and DIM5.

The CBK0 field 3011 and the CBK1 field 3012 control the circular block size upon selection of circular addressing. The manner of determining the circular block size is described herein.

The AM0 field 3013, AM1 field 3014, AM2 field 3015, AM3 field 3016, AM4 field 3017 and AM5 field 3018 control the addressing mode of a corresponding loop, thus permitting the addressing mode to be independently specified for each loop. Each of AM0 field 3013, AM1 field 3014, AM2 field 3015, AM3 field 3016, AM4 field 3017 and AM5 field 3018 are three bits and are decoded as listed in Table 24.

TABLE 24

| AMx field | Meaning |
|---|---|
| 00 | Linear addressing |
| 01 | Circular addressing block size set by CBK0 |
| 10 | Circular addressing block size set by CBK0 + CBK1 + 1 |
| 11 | reserved |

In linear addressing, the address advances according to the address arithmetic whether forward or reverse. In circular addressing, the address remains within a defined address block. Upon reaching the end of the circular address block the address wraps around to the beginning limit of the block. Circular addressing blocks are limited to 2N addresses where N is an integer. Circular address arithmetic can operate by cutting the carry chain between bits and not allowing a selected number of most significant bits to change. Thus, arithmetic beyond the end of the circular block changes only the least significant bits. The block size is set as listed in Table 25.

TABLE 25

| Encoded Block Size CBK0 or CBK0 + CBK1 + 1 | Block Size (bytes) |
|---|---|
| 0 | 512 |
| 1 | 1K |
| 2 | 2K |
| 3 | 4K |
| 4 | 8K |
| 5 | 16K |
| 6 | 32K |
| 7 | 64K |
| 8 | 128K |
| 9 | 256K |
| 10 | 512K |
| 11 | 1M |
| 12 | 2M |
| 13 | 4M |
| 14 | 8M |
| 15 | 16M |
| 16 | 32M |
| 17 | 64M |
| 18 | 128M |
| 19 | 256M |
| 20 | 512M |
| 21 | 1 G |
| 22 | 2 G |
| 23 | 4 G |
| 24 | 8 G |
| 25 | 16 G |
| 26 | 32 G |
| 27 | 64 G |
| 28 | Reserved |
| 29 | Reserved |
| 30 | Reserved |
| 31 | Reserved |

In this example, the circular block size is set by the number encoded by CBK0 (first circular address mode 01) or the number encoded by CBK0+CBK1+1 (second circular address mode 10). For example, in the first circular address mode, the circular address block size can range from 512 bytes to 16 M bytes. For the second circular address mode, the circular address block size can range from 1 K bytes to 64 G bytes. Thus, the encoded block size is 2(B+9) bytes, where B is the encoded block number which is CBK0 for the first block size (AMx of 01) and CBK0+CBK1+1 for the second block size (AMx of 10).

The processing unit 110 (FIG. 1) exposes the streaming engine 125 (FIG. 28) to programs through a small number of instructions and specialized registers. Programs start and end streams with SEOPEN and SECLOSE. SEOPEN opens a new stream and the stream remains open until terminated explicitly by SECLOSE or replaced by a new stream with SEOPEN. The SEOPEN instruction specifies a stream number indicating opening stream 0 or stream 1. The SEOPEN instruction specifies a data register storing the start address of the stream. The SEOPEN instruction also specifies a stream template register that stores the stream template as described above. The arguments of the SEOPEN instruction are listed in Table 26.

TABLE 26

| Argument | Description |
| --- | --- |
| Stream Start Address Register | Scalar register storing stream start address |
| Stream Number | Stream 0 or Stream 1 |
| Stream Template Register | Vector register storing stream template data |

The stream start address register is a register in general scalar register file 211 (FIG. 2) in this example. The SEOPEN instruction can specify the stream start address register via src1 field 1303 (FIG. 13) of example instruction coding 1300 (FIG. 13). The SEOPEN instruction specifies stream 0 or stream 1 in the opcode. The stream template register is a vector register in general vector register file 221 in this example. The SEOPEN instruction can specify the stream template register via src2/cst field 1302 (FIG. 13). If the specified stream is active, the SEOPEN instruction closes the prior stream and replaces the stream with the specified stream.

SECLOSE explicitly marks a stream inactive, flushing any outstanding activity. Any further references to the stream trigger exceptions. SECLOSE also allows a program to prematurely terminate one or both streams.

An SESAVE instruction saves the state of a stream by capturing sufficient state information of a specified stream to restart that stream in the future. An SERSTR instruction restores a previously saved stream. An SESAVE instruction saves the stream metadata and does not save any of the stream data. The stream re-fetches stream data in response to an SERSTR instruction.

Each stream can be in one of three states: inactive, active, or frozen after reset. Both streams begin in the inactive state. Opening a stream moves the stream to the active state. Closing the stream returns the stream to the inactive state. In the absence of interrupts and exceptions, streams ordinarily do not make other state transitions. To account for interrupts, the streaming engine adds a third state: frozen. The frozen state represents an interrupted active stream.

In this example, four bits, two bits per stream, define the state of both streams. One bit per stream resides within the streaming engine, and the other bit resides within the processor core 110. The streaming engine internally tracks whether each stream holds a parameter set associated with an active stream. This bit distinguishes an inactive stream from a not-inactive stream. The processor core 110 separately tracks the state of each stream with a dedicated bit per stream in the Task State Register (TSR): TSR.SE0 for stream 0, and TSR.SE1 for stream 1. These bits distinguish between active and inactive streams.

Opening a stream moves the stream to the active state. Closing a stream moves the stream to the inactive state. If a program opens a new stream over a frozen stream, the new stream replaces the old stream and the streaming engine discards the contents of the previous stream. The streaming engine supports opening a new stream on a currently active stream. The streaming engine discards the contents of the previous stream, flushes the pipeline, and starts fetching data for the new opened stream. Data to processor is asserted once the data has returned. If a program closes an already closed stream, nothing happens. If a program closes an open or frozen stream, the streaming engine discards all state related to the stream, clears the internal stream-active bit, and clears the counter, tag and address registers. Closing a stream serves two purposes. Closing an active stream allows a program to specifically state the stream and the resources associated with the stream are no longer needed. Closing a frozen stream also allows context switching code to clear the state of the frozen stream, so that other tasks do not see it.

As noted above, there are circumstances when some data within a stream holding register 2818 or 2828 is not valid. As described above, such a state can occur at the end of an inner loop when the number of stream elements is less than the respective stream holding register 2818/2828 size or at the end of an inner loop when the number of stream elements remaining is less than the lanes defined by VECLEN. For times not at the end of an inner loop, if VECLEN is less than the width of stream holding register 2818/2828 and GRDUP is disabled, then lanes in stream holding register 2818/2828 in excess of VECLEN are invalid.

Referring again to FIG. 28, in this example streaming engine 125 further includes valid registers 2819 and 2829. Valid register 2819 indicates the valid lanes in stream head register 2818. Valid register 2829 indicates the valid lanes in stream head register 2828. Respective valid registers 2819/2829 include one bit for each minimum ELEM_BYTES lane within the corresponding stream head register 2818/2828. In this example, the minimum ELEM_BYTES is 1 byte. The preferred data path width of processor 100 and the data length of stream head registers 2818/2828 is 64 bytes (512 bits). Valid registers 2819/2829 accordingly have a data width of 64 bits. Each bit in valid registers 2819/2829 indicates whether a corresponding byte in stream head registers 2818/2828 is valid. In this example, a 0 indicates the corresponding byte within the stream head register is invalid, and a 1 indicates the corresponding byte is valid.

In this example, upon reading a respective one of the stream head registers 2818/2828 and transferring of data to the requesting functional unit, the invalid/valid data in the respective valid register 2819/2829 is automatically transferred to a data register within predicate register file 234 (FIG. 2) corresponding to the particular stream. In this example the valid data for stream 0 is stored in predicate register P0 and the valid data for stream 1 is stored in predicate register P1.

The valid data stored in the predicate register file 234 can be used in a variety of ways. The functional unit can combine the vector stream data with another set of vectors and then store the combined data to memory using the valid data indications as a mask, thus enabling the same process to be used for the end of loop data as is used for cases where all the lanes are valid which avoids storing invalid data. The valid indication stored in predicate register file 234 can be used as a mask or an operand in other processes. P unit 246 (FIG. 2) can have an instruction to count the number of 1's in a predicate register (BITCNT, which can be used to determine the count of valid data elements from a predicate register.

Figure 32:
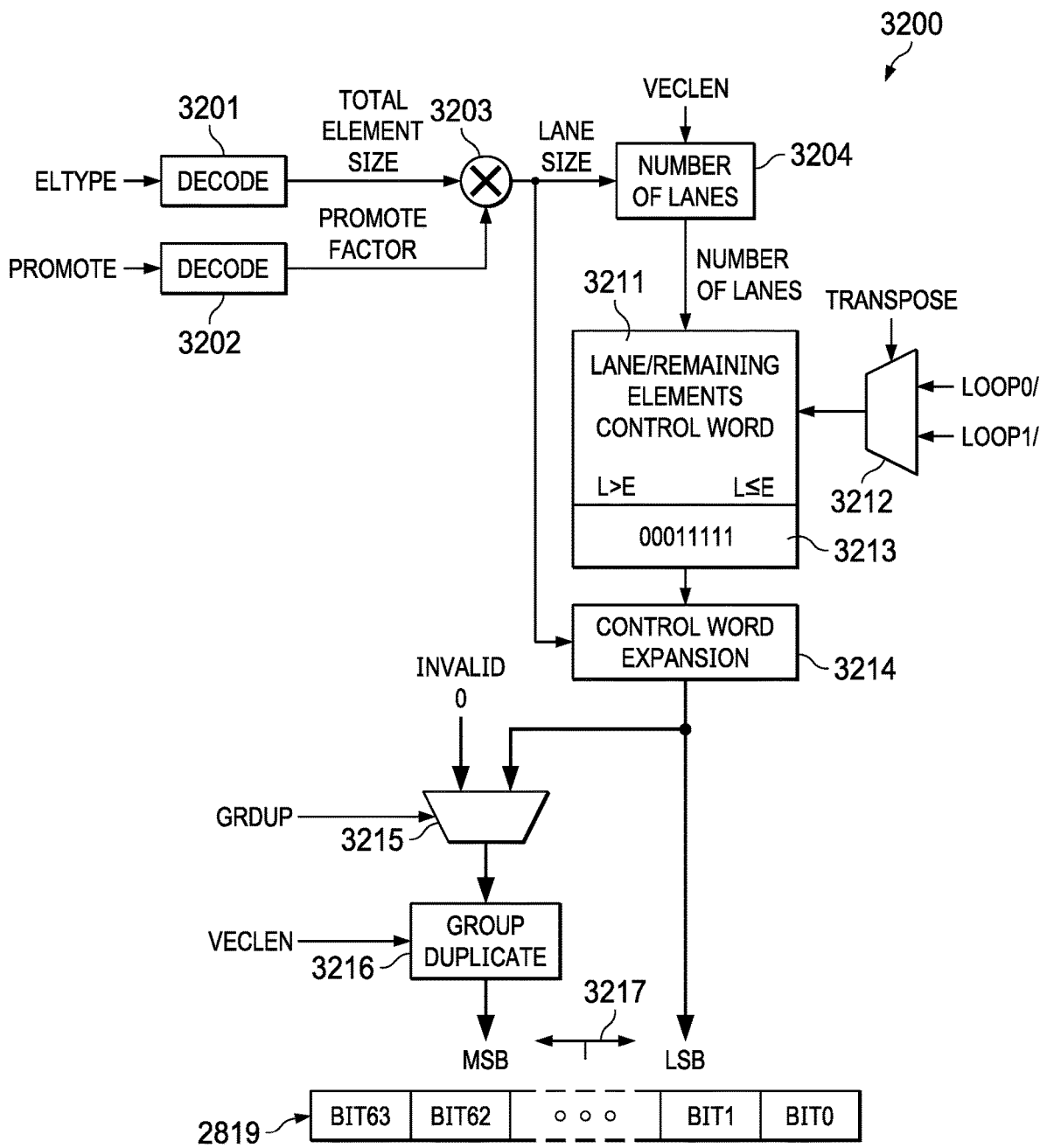
FIG. 32 is a partial schematic diagram of an example of the generation of the stream engine valid or invalid indication.

FIG. 32 illustrates example hardware 3200 to produce the valid/invalid indications stored in the valid register 2819 (FIG. 28). FIG. 32 illustrates hardware for stream 0; stream 1 includes corresponding hardware. Hardware 3200 operates to generate one valid word each time data is updated in stream head register 2818 (FIG. 28). A first input ELTYPE is supplied to decoder 3201. Decoder 3201 produces an output TOTAL ELEMENT SIZE corresponding to the minimum data size based upon the element size ELEM_BYTES and whether the elements are real numbers or complex numbers. The meanings of various codings of ELTYPE are shown in Table 9. Table 27 shows an example output of decoder 3201 in bytes for the various ELTYPE codings. Note Table 9 lists bits and Table 27 lists bytes. As shown in Table 27, TOTAL ELEMENT SIZE is 1, 2, 4 or 8 bytes if the element is real and 2, 4, 8 or 16 bytes if the element is complex.

TABLE 27

| ELTYPE | Real/Complex | Total Element Size Bytes |
|---|---|---|
| 0000 | Real | 1 |
| 0001 | Real | 2 |
| 0010 | Real | 4 |
| 0011 | Real | 8 |
| 0100 | Reserved | Reserved |
| 0101 | Reserved | Reserved |
| 0110 | Reserved | Reserved |
| 0110 | Reserved | Reserved |
| 1000 | Complex, Not Swapped | 2 |
| 1001 | Complex, Not Swapped | 4 |
| 1010 | Complex, Not Swapped | 8 |
| 1011 | Complex, Not Swapped | 16 |
| 1100 | Complex, Swapped | 2 |
| 1101 | Complex, Swapped | 4 |
| 1110 | Complex, Swapped | 8 |
| 1111 | Complex, Swapped | 16 |

A second input PROMOTE is supplied to decoder 3202. Decoder 3202 produces an output promotion factor corresponding to the PROMOTE input. The meaning of various codings of PROMOTE are shown in Table 28, which shows an example output of decoder 3202 in bytes for the various PROMOTE codings. The difference in extension type (zero extension or sign extension) is not relevant to decoder 3202.

TABLE 28

| PROMOTE | Promotion Factor |
|---|---|
| 000 | 1 |
| 001 | 2 |
| 010 | 4 |
| 011 | 8 |
| 100 | Reserved |
| 101 | 2 |
| 110 | 4 |
| 111 | 8 |

The outputs of decoders 3201 and 3202 are supplied to multiplier 3203. The product produced by multiplier 3203 is the lane size corresponding to the TOTAL ELEMENT SIZE and the promotion factor. Because the promotion factor is an integral power of 2 (2N), the multiplication can be achieved by corresponding shifting of the TOTAL ELEMENT SIZE, e.g., no shift for a promotion factor of 1, a one-bit shift for a promotion factor of 2, a two-bit shift for a promotion factor of 4, and a three-bit shift for a promotion factor of 8.

NUMBER OF LANES unit 3204 receives the vector length VECLEN and the LANE SIZE and generates the NUMBER OF LANES. Table 29 shows an example decoding of the number of lanes for lane size in bytes and the vector length VECLEN.

TABLE 29

| LANE SIZE | VECLEN | | | | | | |
|---|---|---|---|---|---|---|---|
| | 000 | 001 | 010 | 011 | 100 | 101 | 110 |
| 1 | 1 | 2 | 4 | 8 | 16 | 32 | 64 |
| 2 | — | 1 | 2 | 4 | 8 | 16 | 32 |
| 4 | — | — | 1 | 2 | 4 | 8 | 16 |
| 8 | — | — | — | 1 | 2 | 4 | 8 |
| 16 | — | — | — | — | 1 | 2 | 4 |
| 32 | — | — | — | — | — | 1 | 2 |
| 64 | — | — | — | — | — | — | 1 |

As previously stated, VECLEN must be greater than or equal to the product of the element size and the duplication factor. As shown in Table 29, VECLEN must also be greater than or equal to the product of the element size and the promotion factor. This means that VECLEN must be large enough to guarantee that an element cannot be separated from its extension produced by type promotion block 2022 (FIG. 20). The cells below the diagonal in Table 29 marked "-" indicate an unpermitted combination of parameters.

The NUMBER OF LANES output of unit 3204 serves as one input to LANE/REMAINING ELEMENTS CONTROL WORD unit 3211. A second input comes from multiplexer 3212. Multiplexer 3212 receives a Loop0 input and a Loop1 input. The Loop0 input and the Loop1 input represent the number of remaining elements in the current iteration of the corresponding loop.

Figure 33:
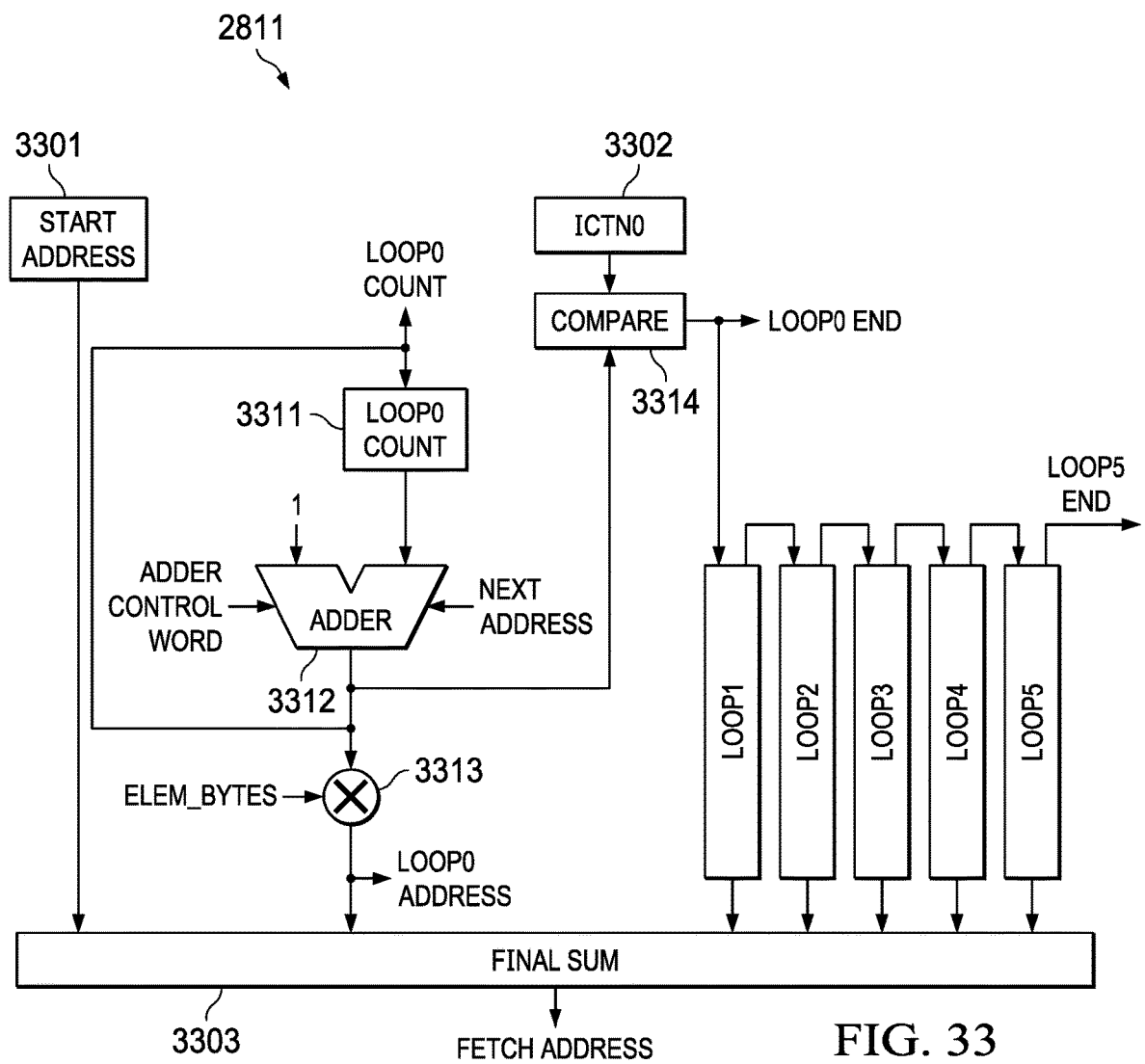
FIG. 33 is a partial schematic diagram of a streaming engine address generator illustrating generation of the loop address and loop count.

FIG. 33 illustrates a partial schematic view of address generator 2811 shown in FIG. 28. Address generator 2811 forms an address for fetching the next element in the defined stream of the corresponding streaming engine. Start address register 3301 stores a start address of the data stream. As previously described above, in this example, start address register 3301 is a scalar register in global scalar register file 211 designated by the SEOPEN instruction that opened the corresponding stream. The start address can be copied from the specified scalar register and stored locally at the respective address generator 2811/2821 by control logic included with address generator 2811. The first loop of the stream employs Loop0 count register 3311, adder 3312, multiplier 3313 and comparator 3314. Loop0 count register 3311 stores the working copy of the iteration count of the first loop (Loop0). For each iteration of Loop0, adder 3312, as triggered by the Next Address signal, adds 1 to the loop count, which is stored back in Loop0 count register 3311. Multiplier 3313 multiplies the current loop count and the quantity ELEM_BYTES. ELEM_BYTES is the size of each data element in loop0 in bytes. Loop0 traverses data elements physically contiguous in memory with an iteration step size of ELEM_BYTES.

Comparator 3314 compares the count stored in Loop0 count register 3311 (after incrementing by adder 3313) with the value of ICNT0 2901 (FIG. 29) from the corresponding stream template register 2900 (FIG. 29). When the output of adder 3312 equals the value of ICNT0 2901 of the stream template register 2900, an iteration of Loop0 is complete. Comparator 3314 generates an active Loop0 End signal. Loop0 count register 3311 is reset to 0 and an iteration of the next higher loop, in this case Loop1, is triggered.

Circuits for the higher loops (Loop1, Loop2, Loop3, Loop4 and Loop5) are similar to that illustrated in FIG. 33. Each loop includes a respective working loop count register, adder, multiplier and comparator. The adder of each loop is triggered by the loop end signal of the prior loop. The second input to each multiplier is the corresponding dimension DIM1, DIM2, DIM3, DIM4 and DIM5 from the corresponding stream template. The comparator of each loop compares the working loop register count with the corresponding iteration value ICNT1, ICNT2, ICNT3, ICNT4 and ICNT5 of the corresponding stream template register 2900. A loop end signal generates an iteration of the next higher loop. A loop end signal from Loop5 ends the stream.

FIG. 33 also illustrates the generation of Loop0 count. Loop0 count equals the updated data stored in the corresponding working count register 3311. Loop0 count is updated on each change of working Loop0 count register 3311. The loop counts for the higher loops (Loop1, Loop2, Loop3, Loop4 and Loop5) are similarly generated.

FIG. 33 also illustrates the generation of Loop0 address. Loop0 address equals the data output from multiplier 3313. Loop0 address is updated on each change of working Loop0 count register 3311. Similar circuits for Loop1, Loop2, Loop3, Loop4 and Loop5 produce corresponding loop addresses. In this example, Loop0 count register 3311 and the other loop count registers are implemented as count up registers. In another example, initialization and comparisons operate as count down circuits.

Referring again to FIG. 32, the value of the loop down count, such as Loop0/, is given by Loopx/=ICNTx−Loopx. That is, the loop down count is the difference between the initial iteration count specified in the stream template register and the loop up count produced as illustrated in FIG. 33.

LANE/REMAINING ELEMENTS CONTROL WORD unit 3211 (FIG. 32) generates a control word 3213 based upon the number of lanes from NUMBER OF LANES unit 3204 and the loop down count selected by multiplexer 3212. The control input to multiplexer 3212 is the TRANSPOSE signal from field 3002 of FIG. 30. If TRANSPOSE is disabled ("000"), multiplexer 3212 selects the Loop0 down count Loop0/. For all other legal values of TRANSPOSE ("001", "010", "011", "100", "101" and "110") multiplexer 3212 selects the Loop1 down count Loop1/. The streaming engine maps the innermost dimension to consecutive lanes in a vector. For normal streams this is Loop0. For transposed streams, this is Loop1, because transposition exchanges the two dimensions.

LANE/REMAINING ELEMENTS CONTROL WORD unit 3211 generates control word 3213 as follows. Control word 3213 has a number of bits equal to the number of lanes from unit 3204. If the remaining count of elements of the selected loop is greater than or equal to the number of lanes, then all lanes are valid. For this case, control word 3213 is all ones, indicating that all lanes within the vector length VECLEN are valid. If the remaining count of elements of the selected loop is nonzero and less than the number of lanes, then some lanes are valid and some are invalid. According to the lane allocation described above in conjunction with FIGS. 21 and 22, stream elements are allocated lanes starting with the least significant lanes. Under these circumstances, control word 3213 includes a number of least significant bits set to one equal to the number of the selected loop down count. All other bits of control word 3213 are set to zero. In the example illustrated in FIG. 32, the number of lanes equals eight and there are five valid (1) least significant bits followed by three invalid (0) most significant bits which corresponds to a loop having five elements remaining in the final iteration.

Control word expansion unit 3214 expands the control word 3213 based upon the magnitude of LANE SIZE. The expanded control word includes one bit for each minimally sized lane. In this example, the minimum stream element size, and thus the minimum lane size, is one byte (8 bits). In this example, the size of holding registers 2818/2828 equals the vector size of 64 bytes (512 bits). Thus, the expanded control word has 64 bits, one bit for each byte of stream holding registers 2818/2828. This expanded control word fills the least significant bits of the corresponding valid register 2819 and 2829 (FIG. 28).

For the case when VECLEN equals the vector length, the description is complete. The expanded control word includes bits for all places within respective valid register 2819/2829. There are some additional considerations when VECLEN does not equal the vector length. When VECLEN does not equal the vector length, the expanded control word does not have enough bits to fill the corresponding valid register 2819/2829. As illustrated in FIG. 32, the expanded control word fills the least significant bits of the corresponding valid register 2819/2829, thus providing the valid/invalid bits for lanes within the VECLEN width. Another mechanism is provided for lanes beyond the VECLEN width up to the data width of stream head register 2818.

Referring still to FIG. 32, multiplexer 3215 and group duplicate unit 3216 are illustrated to provide the needed additional valid/invalid bits. Referring to the description of VECLEN, if group duplication is not enabled (GRDUP=0), then the excess lanes are not valid. A first input of multiplexer 3215 is an INVALID 0 signal that includes multiple bits equal in number to VECLEN. When GRDUP=0, multiplexer 3215 selects this input. Group duplicate unit 3216 duplicates this input to all excess lanes of stream head register 2818. Thus, the most significant bits of valid register 2819 are set to zero indicating the corresponding bytes of stream head register 2818 are invalid. This occurs for vectors 1-8 of the example shown in Table 15, vectors 1-15 of the example shown in Table 16, and vectors 1-29 of the example shown in Table 17.

In another example, mux 3215 and group duplicate block 3216 are replaced with group duplicate logic that is similar to the group duplicate logic 2025 illustrated in FIG. 31.

As previously described, if group duplication is enabled (GRDUP=1), then the excess lanes of stream head register 2818 (FIG. 28) are filled with copies of the least significant bits. A second input of multiplexer 3215 is the expanded control word from control word expansion unit 3214. When GRDUP=1, multiplexer 3215 selects this input. Group duplicate unit 3216 duplicates this input to all excess lanes of stream head register 2818.

There are two possible outcomes. In one outcome, in most cases, all the lanes within VECLEN are valid and the bits from control word expansion unit 3214 are all ones. This occurs for vectors 1-7 of the group duplication example shown in Table 18 and vectors 1-14 of the group duplication example shown in Table 19. Under these conditions, all bits of the expanded control word from control word expansion unit 3214 are one and all lanes of stream head register 2818 are valid. Group duplicate unit 3216 thus fills all the excess lanes with ones. In the other outcome, the number of remaining stream data elements is less than the number of lanes within VECLEN. This occurs for vector 8 in the group duplication example shown in Table 18 and vector 15 in the group duplication example shown in Table 19. Under these conditions, some lanes within VECLEN are valid and some are invalid. Group duplicate unit 3216 fills the excess lanes with bits having the same pattern as the expanded control word bits. In either case, the excess lanes are filled corresponding to the expanded control bits.

Referring still to FIG. 32, a boundary 3217 is illustrated between the least significant bits and the most significant bits. The location of this boundary is set by the size of VECLEN relative to the size of stream head register 2818.

Figure 34:
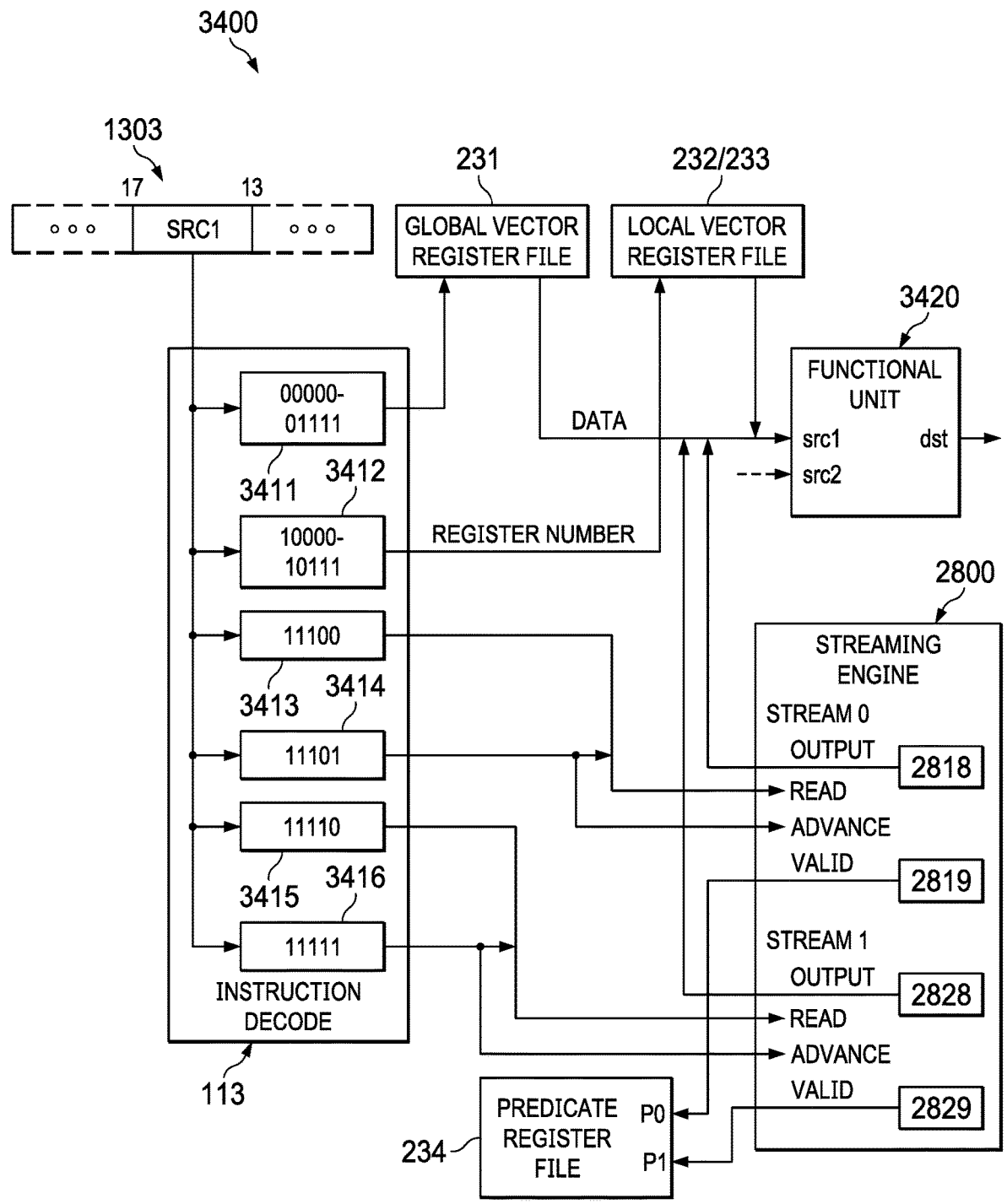
FIG. 34 illustrates a partial schematic diagram showing the streaming engine supply of data of this example.

FIG. 34 is a partial schematic diagram 3400 illustrating the stream input operand coding described above. FIG. 34 illustrates a portion of instruction decoder 113 (see FIG. 1) decoding src1 field 1303 of one instruction to control corresponding src1 input of functional unit 3420. These same or similar circuits are duplicated for src2/cst field 1302 of an instruction controlling functional unit 3420. In addition, these circuits are duplicated for each instruction within an execute packet capable of employing stream data as an operand that are dispatched simultaneously.

Instruction decoder 113 receives the src1 field 1303 of an instruction. The opcode field 1304 and the unit field 1305 specify a corresponding functional unit 3420 and the function to be performed. In this example, functional unit 3420 can be L2 unit 241, S2 unit 242, M2 unit 243, N2 unit 244 or C unit 245. The relevant part of instruction decoder 113 illustrated in FIG. 34 decodes src1 field 1303. Sub-decoder 3411 determines whether the src1 field 1303 is in the range from 00000 to 01111. If this is the case, sub-decoder 3411 supplies a corresponding register number to global vector register file 231. In this example, the register number is the four least significant bits of the src1 field 1303. Global vector register file 231 recalls data stored in the register corresponding to the register number and supplies the data to the src1 input of functional unit 3420.

Sub-decoder 3412 determines whether the src1 field 1303 is in the range from 10000 to 10111. If this is the case, sub-decoder 3412 supplies a corresponding register number to the corresponding local vector register file. If the instruction is directed to L2 unit 241 or S2 unit 242, the corresponding local vector register file is local vector register file 232. If the instruction is directed to M2 unit 243, N2 unit 244 or C unit 245, the corresponding local vector register file is local vector register file 233. In this example, the register number is the three least significant bits of the src1 field 1303. The corresponding local vector register file 232/233 recalls data stored in the register corresponding to the register number and supplies the data to the src1 input of functional unit 3420.

Sub-decoder 3413 determines whether the src1 field 1303 is 11100. If this is the case, sub-decoder 3413 supplies a stream 0 read signal to streaming engine 125. Streaming engine 125 then supplies stream 0 data stored in holding register 2818 to the src1 input of functional unit 3420.

Sub-decoder 3414 determines whether the src1 field 1303 is 11101. If this is the case, sub-decoder 3414 supplies a stream 0 read signal to streaming engine 125. Streaming engine 125 then supplies stream 0 data stored in holding register 2818 to the src1 input of functional unit 3420. Sub-decoder 3414 also supplies an advance signal to stream 0. As previously described, streaming engine 125 advances to store the next sequential vector of data elements of stream 0 in holding register 2818.

Supply of a stream 0 read signal to streaming engine 125 by either sub-decoder 3413 or sub-decoder 3414 triggers another data movement. Upon such a stream 0 read signal, streaming engine 125 supplies the data stored in valid register 2819 to predicate register file 234 for storage. In accordance with this example, this is a predetermined data register within predicate register file 234. In this example, data register P0 corresponds to stream 0.

Sub-decoder 3415 determines whether the src1 field 1303 is 11110. If this is the case, sub-decoder 3415 supplies a stream 1 read signal to streaming engine 125. Streaming engine 125 then supplies stream 1 data stored in holding register 2828 to the src1 input of functional unit 3420.

Sub-decoder 3416 determines whether the src1 field 1303 is 11111. If this is the case, sub-decoder 3416 supplies a stream 1 read signal to streaming engine 125. Streaming engine 125 then supplies stream 1 data stored in holding register 2828 to the src1 input of functional unit 3420. Sub-decoder 3414 also supplies an advance signal to stream 1. As previously described, streaming engine 125 advances to store the next sequential vector of data elements of stream 1 in holding register 2828.

Supply of a stream 1 read signal to streaming engine 125 by either sub-decoder 3415 or sub-decoder 3416 triggers another data movement. Upon such a stream 1 read signal, streaming engine 125 supplies the data stored in valid register 2829 to predicate register file 234 for storage. In accordance with this example, this is a predetermined data register within predicate register file 234. In this example, data register P1 corresponds to stream 1.

Similar circuits are used to select data supplied to src2 input of functional unit 3402 in response to the bit coding of src2/cst field 1302. The src2 input of functional unit 3420 can be supplied with a constant input in a manner described above. If instruction decoder 113 generates a read signal for stream 0 from either src1 field 1303 or src2/cst field 1302, streaming engine 125 supplies the data stored in valid register 2819 to predicate register P0 of predicate register file 234 for storage. If instruction decode 113 generates a read signal for stream 1 from either src1 field 1303 or src2/cst field 1302, streaming engine 125 supplies the data stored in valid register 2829 to predicate register P1 of predicate register file 234 for storage.

The exact number of instruction bits devoted to operand specification and the number of data registers and streams are design choices. In particular, the specification of a single global vector register file and omission of local vector register files is feasible. This example employs a bit coding of an input operand selection field to designate a stream read and another bit coding to designate a stream read and advancing the stream.

The process illustrated in FIG. 34 automatically transfers valid data into predicate register file 234 each time stream data is read. The transferred valid data can then be used by P unit 246 for further calculation of meta data. The transferred valid data can also be used as a mask or as an operand for other operations by one or more of vector data path side B 116 functional units including L2 unit 241, S2 unit 242, M2 unit 243, N2 unit 244 and C unit 245. There are numerous feasible compound logic operations employing this stream valid data.

Figure 35:
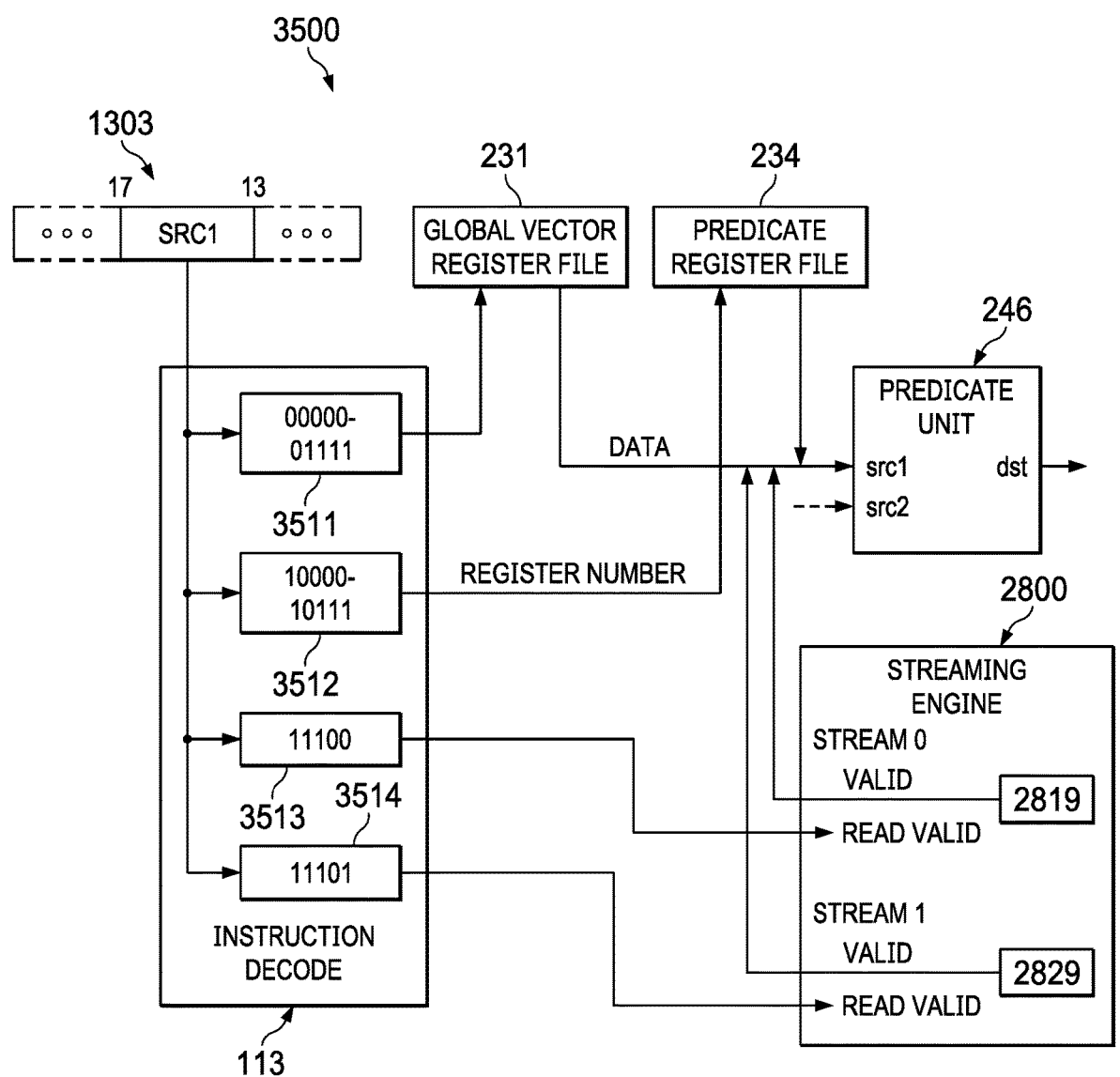
FIG. 35 illustrates a partial schematic diagram showing the streaming engine supply of valid data to the predicate unit.

FIG. 35 is a partial schematic diagram 3500 illustrating another example configuration for selecting operand sources. In this example, the respective stream valid register 2819/2829 need not be automatically loaded to a predetermined register in predicate register file 234. Instead, an explicit instruction to P unit 246 is used to move the data. FIG. 35 illustrates a portion of instruction decoder 113 (see FIG. 1) decoding src1 field 1303 of one instruction to control a corresponding src1 input of P unit 246. These same or similar circuits can be duplicated for src2/cst field 1302 (FIG. 13) of an instruction controlling P unit 246.

Instruction decoder 113 receives the src1 field 1303 of an instruction. The opcode field opcode field 1304 and the unit field 1305 specify P unit 246 and the function to be performed. The relevant part of instruction decoder 113 illustrated in FIG. 35 decodes the src1 field 1303. Sub-decoder 3511 determines whether the src1 field 1303 is in the range 00000 to 01111. If this is the case, sub-decoder 3511 supplies a corresponding register number to global vector register file 231. In this example, the register number is the four least significant bits of the src1 field 1303. Global vector register file 231 recalls data stored in the register corresponding to the register number and supplies the data to the src1 input of P unit 246.

Sub-decoder 3512 determines whether the src1 field 1303 is in the range 10000 to 10111. If this is the case, sub-decoder 3512 supplies a decoded register number to the predicate register file 234. In this example, the register number is the three least significant bits of the src1 field 1303. The predicate register file 234 recalls data stored in the register corresponding to the register number and supplies the data to the src1 input of predicate unit 246.

Sub-decoder 3513 determines whether the src1 field 1303 is 11100. If this is the case, sub-decoder 3513 supplies a stream 0 valid read signal to streaming engine 125. Streaming engine 125 then supplies valid data stored in valid register 2819 to the src1 input of P unit 246.

Sub-decoder 3514 determines whether the src1 field 1303 is 11101. If this is the case, sub-decoder 3514 supplies a stream 1 valid read signal to streaming engine 125. Streaming engine 125 then supplies stream 1 valid data stored in valid register 2829 to the src1 input of P unit 246.

The P unit 246 instruction employing the stream valid register 2819/2829 as an operand can be any P unit instruction previously described such as NEG, BITCNT, RMBD, DECIMATE, EXPAND, AND, NAND, OR, NOR, and XOR.

The special instructions noted above can be limited to P unit 242. Thus, the operations outlined in FIGS. 34 and 35 can be used together. If the functional unit specified by the instruction is L2 unit 241, S2 unit 242, M2 unit 243, N2 unit 244 or C unit 245, then the src1 field 1303 is interpreted as outlined with respect to FIG. 34. If the functional unit specified by the instruction is P unit 246, then the src1 field 1303 is interpreted as outlined with respect to FIG. 35. Alternatively, the automatic saving of the stream valid register to a predetermined predicate register illustrated in FIG. 34 can be implemented in one example and not implemented in another example.

In some examples of processing unit core 110, instructions for sorting of vector elements are provided. Some such instructions sort vector elements that are fixed point and/or some such instructions sort vector elements that are floating point. Variations of the sort instructions may include sorting elements in decreasing order, sorting elements in increasing order, and/or sorting half of a vector in one of increasing or decreasing order and sorting the other half in one of increasing or decreasing order. Other variations may include sort instructions that output a control input for a VPERM instruction, which performs the sort of the vector elements as per the control input.

Support for sorting of vector elements is provided, at least in part, because sorting is a common operation in, for example, signal processing and computer vision. There are many reasons to sort a data set. For example, median filters are used to remove certain types of noise. One way to find the median of a set of numbers is to sort the numbers and then take the middle one as the median.

In another example taken from typical processing in a communication system, the start of a frame of data is detected based on a known preamble. The preamble can arrive at a receiver at any time and needs to be located to establish the connection. To do so, the incoming data is sampled and compared to the expected known preamble at many different offsets in time. Each of these comparisons results in a score that will be highest when the presumed offset in time for that comparison has actually found the preamble. One way to find the maximum score is to sort the scores at the time offsets.

In another example, in multi-antenna and multi-path systems, some processing may be performed to identify the N largest peaks. Multi-path means that the signal bounces off obstacles in the environment and thus arrives at the receiver from different angles at different arrival times. One way to find the N largest peak is to sort the peak signal values.

In another example, in a machine learning system, scores are calculated for each possible analysis of an image to determine what the image might be from a variety of objects, e.g., a bird, a fish, a cat, etc., the system is trained to identify. One way to find the maximum score is to sort the analysis scores.

Some of the sort instructions provided are designed to accelerate the bitonic mergesort algorithm as this algorithm is a parallel algorithm for sorting that can be efficiently executed on a SIMD architecture such as that of processing unit core 110. The algorithm is briefly described herein. Additional description can be found, for example, in "Bitonic Sorter", Wikipedia, available at https://en.wikipedia.org/wiki/Bitonic_sorter, and K. E. Batcher, "Sorting Networks and Their Applications", Proceedings of AFIPS Spring Joint Computer Conference, 1968, Vol. 32, pp. 307-314.

The bitonic mergesort algorithm takes a data set as input and produces larger and larger groups of elements which have the property of being "bitonic". A bitonic sequence of numbers is a sequence in which the numbers start off either increasing or decreasing in value, and then change at some point from increasing to decreasing or from decreasing to increasing.

Figure 36:
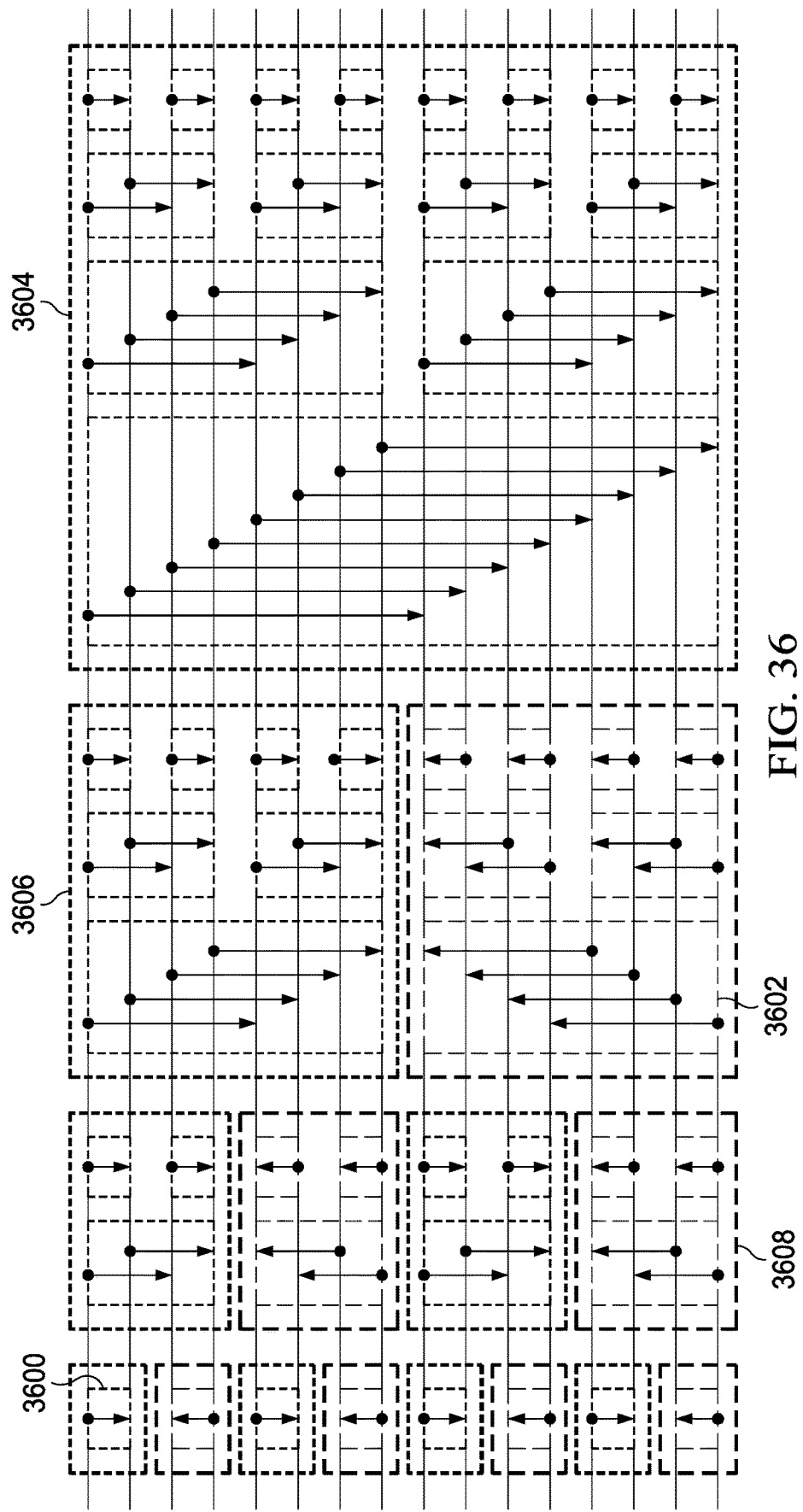
FIG. 36 illustrates a bitonic merge sort of sixteen elements.

FIG. 36 is an example taken from the above mentioned Wikipedia entry that illustrates a bitonic merge sort of sixteen elements. Beginning from the left side, the sixteen numbers "slide along" horizontal wires and exit at the right in sorted order. The network shown is designed to sort the numbers in increasing order, i.e., with the largest number coming out on the bottom horizontal wire. Each of the arrows is a comparator. When two numbers reach the ends of an arrow, the numbers are compared. If the arrow points toward the larger number, nothing changes. Otherwise, the two numbers are swapped so that the arrow points to the larger number.

In the boxes with arrows, e.g., boxes 3600, 3602, 3604, the arrow are either all pointing up or all pointing down, and each input in the top half of the box is compared to the corresponding input in the bottom half of the box. If the input numbers to a box form a bitonic sequence, i.e., a single nondecreasing sequence followed by a single nonincreasing one or vice versa, the output is two bitonic sequences. Both the top and bottom half of the output is bitonic, with every element of the top half less than or equal to every element of the bottom half for those boxes in which the arrows point down and vice versa for those boxes in which the arrows point up.

The boxes with arrows are combined to form larger boxes, e.g., boxes 3606, 3608, in which arrows in the smaller boxes either all point up or all point down. Each of the larger boxes has the same structure: an initial box of arrows is applied to the entire input sequence, then two smaller boxes of arrows are applied to each half of the result of the initial box, then two smaller boxes of arrows are applied to each half of the results of the two boxes, and so on until the final set of boxes each accepts only two inputs. This structure is known as a butterfly network. If the input to one of the larger boxes is bitonic, the output of the box is completely sorted in increasing order for those boxes in which the arrows in the smaller boxes all point down or in decreasing order for those boxes in which the arrow in the smaller boxes all point up. When a number enters a larger box, the first smaller box sorts it into the correct half of the list. The number then passes through a smaller box that sorts it into the correct quarter of the list within that half. This continues until the number is sorted into exactly the correct position. Thus, the output of the larger box is completely sorted.

The larger boxes combine to form the entire sorting network that can sort any arbitrary sequence of inputs correctly with the largest at the bottom. The output of each of the larger boxes will be a sorted sequence, so the output of each pair of adjacent outputs will be bitonic. Each column of larger boxes takes N sorted sequences and concatenates the sequences in pairs to form N/2 bitonic sequences, which are then sorted by the boxes in that column to form N/2 sorted sequences. This process starts with each input considered to be a sorted list of one element and continues through all the columns of boxes until the last column merges the inputs into a single, sorted list. Note that the sort order can be reversed by reversing the directions of the arrows in the smaller boxes.

Figure 37:
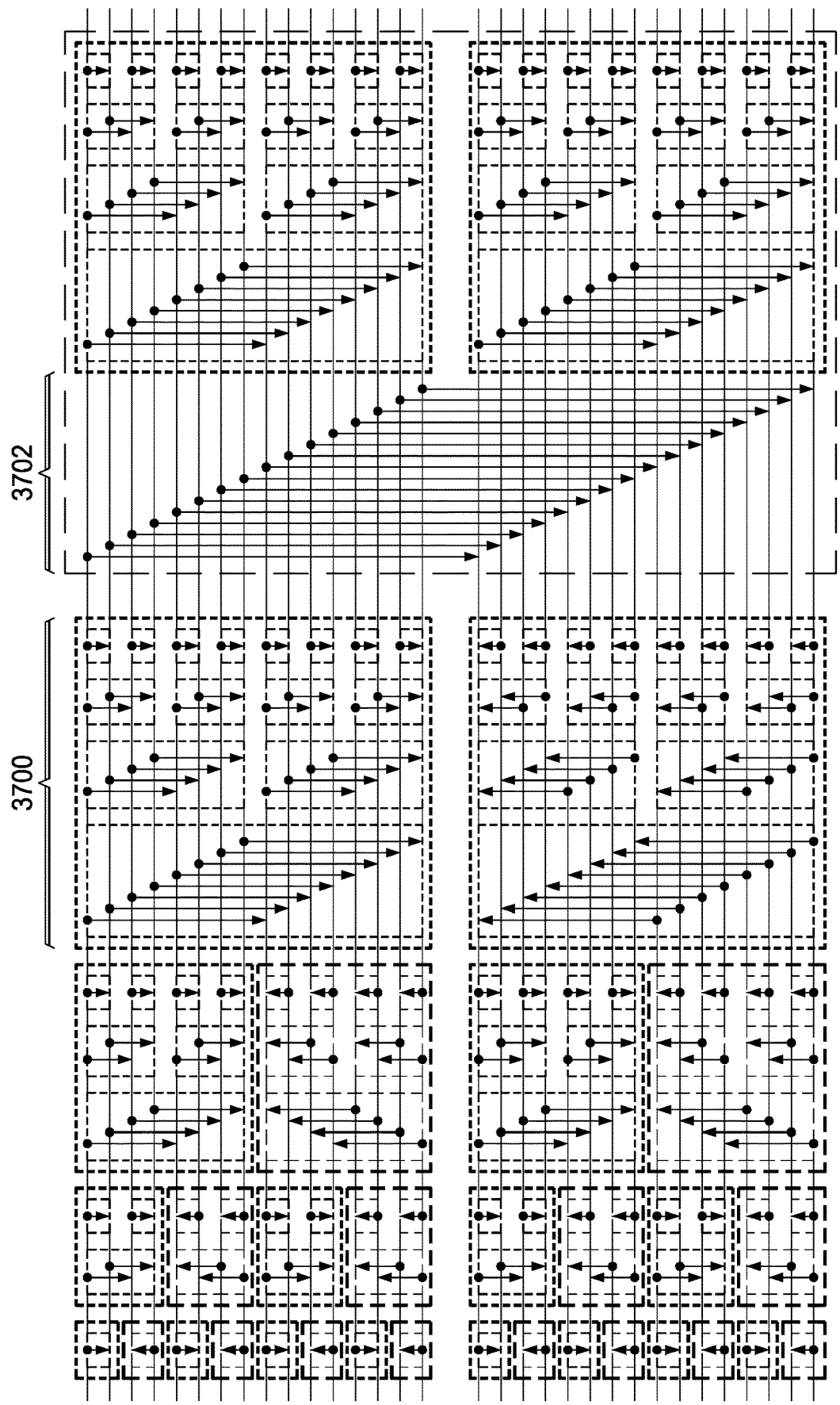
FIG. 37 is an example of a thirty-two element bitonic merge sort.

The processing unit core 110 implements instructions that can be used to sort groups of sixteen elements. These sixteen element sorts can be used in to implement bitonic merge sorts of larger sets of elements. FIG. 37 is an example of a thirty-two element bitonic merge sort. Note that at an interim stage 3700, there is a set of sixteen elements sorted in increasing order and a set of sixteen elements sorted in decreasing order. In the next stage 3702, there is a "swapping" of elements between the two sets of sixteen elements. The "swapping" stage 3702 is followed by sorting stages that sort each set of sixteen elements resulting from the stage 3702 in increasing order.

Figure 38:
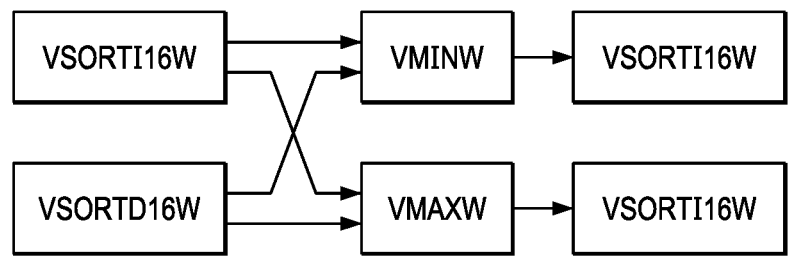
FIG. 38 illustrates implementing a thirty-two element bitonic merge sort using two sorts of sixteen 32-bit elements.

As illustrated in FIG. 38, the equivalent of the thirty-two element bitonic merge sort of FIG. 37 can be implemented using a sixteen element sort that sorts the elements in increasing order and a sixteen element sort that sorts the elements in decreasing order. In this figure, VSORTI16W sorts sixteen 32-bit elements in increasing order and VSORTD16W sorts sixteen 32-bit elements in decreasing order. The equivalent of the "swapping" stage 3702 is performed by parallel execution of vector min and vector max instructions, VMINW and VMAXW. VMAXW takes two operands as input, compares the values in corresponding SIMD lanes, and outputs the larger value for each lane. VMINW operates in a similar fashion, outputting the smaller value for each lane. Table 30 shows example pseudo code implementing the operations of FIG. 38. In this pseudo code, || indicates that the instruction is executed in parallel with the previous instruction.

TABLE 30

|   |                           |
|---|---------------------------|
|   | VLD16W .D1 *D0++ VB0      |
|   | VLD16W .D1 *D0 VB1        |
|   | VS0RTI16W .C2 VB0 VBM0    |
|   | VSORTD16W .C2 VB1 VBM1    |
|   | VMINW .L2 VBM0 VBM1 VBM0  |
| ‖ | VMAXW .S2 VBM0 VBM1 VBM1  |
|   | VSORTI16W .C2 VBM0 VB8    |
|   | VSORTI16W .C2 VBM1 VB9    |

In some examples, processing unit core 110 provides sort instructions for sorting a vector of sixteen 32-bit floating point numbers. The VSORTD16SP src, dst instruction sorts a vector of floating point numbers into SIMD lanes of the destination register in decreasing order in which the largest number is placed in the lowest SIMD lane and the smallest number is placed in the highest SIMD lane. The VSORTI16SP src, dst instruction sorts a vector of floating point numbers into SIMD lanes of the destination register in increasing order in which the smallest number is placed in the lowest SIMD lane and the largest number is placed in the highest SIMD lane. These instructions can be used in combination to sort a vector in increasing order and decreasing order as part of implementing a bitonic sorting algorithm.

In some examples, processing unit core 110 provides an instruction, VSORTDIRSP dir, src, dst, that sorts an input vector of sixteen floating point numbers in increasing or decreasing order depending on the value of the operand "dir". In some examples, processing unit core 110 provides sort instructions for sorting a vector of sixteen 32-bit signed and/or unsigned fixed point or integer numbers. The instructions, VSORTD16W, VSORTI16W, VSORTDU16W, and VSORTIU16W, where "I" and "D" in the instruction mnemonic indicate sort direction and "u" indicates unsigned, operate as described above for the floating point sort instructions.

In some examples, processing unit core 110 provides one or more dual sort instructions that sort thirty-two 16-bit data elements in a vector. Further, sorting of two groups of 16-bit data elements in a vector is provided. The instructions are VDSORTxy[U]16H instructions where x is either D or I and y is either D or I, H indicates a data element size of a half word or 16 bits, and the U, if present, indicates unsigned data. The x indicates whether the low sixteen elements in an input vector are to be sorted in decreasing or increasing order and the y indicates whether the upper sixteen elements in the input vector are to be sorted in decreasing or increasing order. The elements can be fixed point, half precision floating point, or integer numbers. When the sort is performed, the respective sorted upper sixteen elements of the input vector are placed in the upper sixteen lanes of the output, and the respective sorted lower sixteen elements of the input vector are placed in the lower sixteen lanes of the output.

Figure 39:
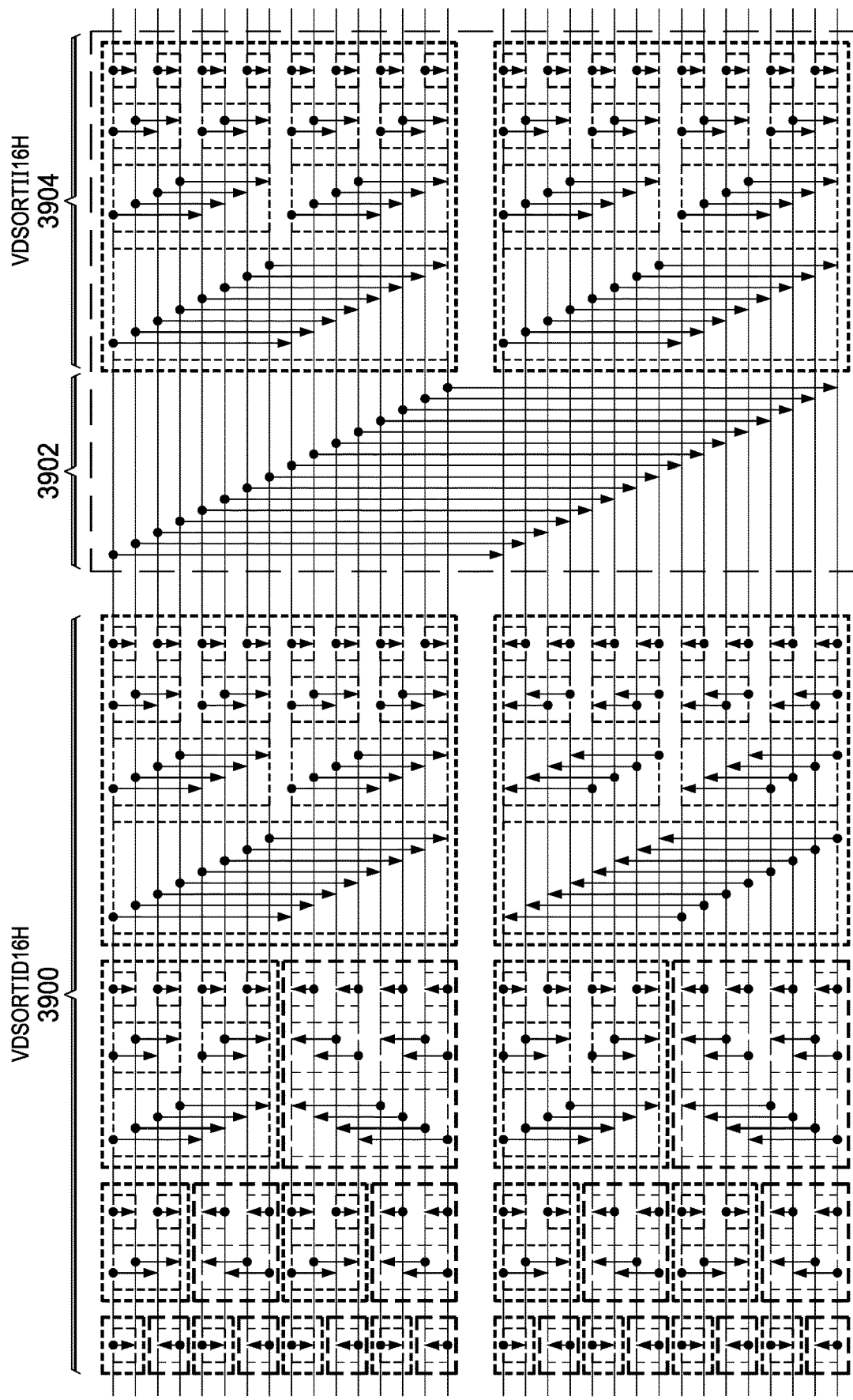
FIG. 39 illustrates implementing a thirty-two element bitonic merge sort using dual sort instructions.

As illustrated in FIG. 39, the VDSORTxy[U]16H instructions can be used to implement a thirty-two element bitonic sorting algorithm. This example illustrates sorting thirty-two 16-bit elements in increasing order with a sorting stage 3900 using VDSORTID16H followed by a "swapping" stage 3902 which is followed by another sorting stage 3904 using VDSORTII16H. Using VDSORTDI16H followed by VDSORTDD16H would yield a sort in decreasing order.

The equivalent of the "swapping" stage 3902 is performed by execution of vector min and vector max instructions, VMINW and VMAXW, and VxyMV instructions where x and y can be H and L, where H indicates the high half of a vector and L indicates the low half of the vector. A VLHMV instruction moves the low half of the vector specified by the first operand of the instruction to the high half of the output vector and moves the high half of a vector specified by the second operand to the low half of the output vector. A VHLMV instruction moves the high half of the vector specified by the first operand of the instruction to the high half of the output vector and moves the low half of a vector specified by the second operand to the low half of the output vector. Table 31 shows example pseudo code implementing the operations of FIG. 39.

TABLE 31

VDSORTID16H VB0, VB1
VLHMV VB1, VB1, VB2
VMINH VB1, VB2, VB8
VMAXH VB1, VB2, VB9
VHLMV VB9, VB8, VB10
VDSORTII16H VB10, VB11

In some examples, processing unit core 110 implements sort instructions in a "brute force" fashion in which more hardware comparisons are utilized than would otherwise be needed if a "smarter" sorting approach is used. In general, this "brute force" approach includes the following steps: 1) compare each element in a vector of elements to every other element in the vector; 2) based on the comparisons, for each element, count the number of elements in the vector that are less than the element; and 3) use the count for each element to determine the lane of the element in the output vector.

For example, assume the input elements are 3, 8, 2, 5 and the elements are to be sorted in increasing order. Performing the comparisons and counting how many elements are less than each element yields the following results: only one element, element 2, is less than element 3, three elements, element 3, 2, and 5, are less than element 8, no element is less than element 2, and two elements, 3 and 2, are less than element 5. Therefore, in the output vector, element 2 is placed in lane 0, element 3 is placed in lane 1, element 5 is placed in lane 3, and element 8 is placed in lane 4.

Note that the above approach does not work when an element value appears more than once in a vector of elements. For example, if the input elements are 3, 8, 3, 5, then both of the elements with the value of 3 will be placed in lane 0 and no element will be placed in lane 1. This can be remedied by making the element comparison "less than or equal to" rather than "less than" when the lane number of an element in the input vector is greater than the lane number of the element to which it is being compared. With this modification, the lane number of the second 3 in the input vector is greater than the lane number of the first 3 and thus the count for the second 3 will be one rather than zero.

Figure 40:
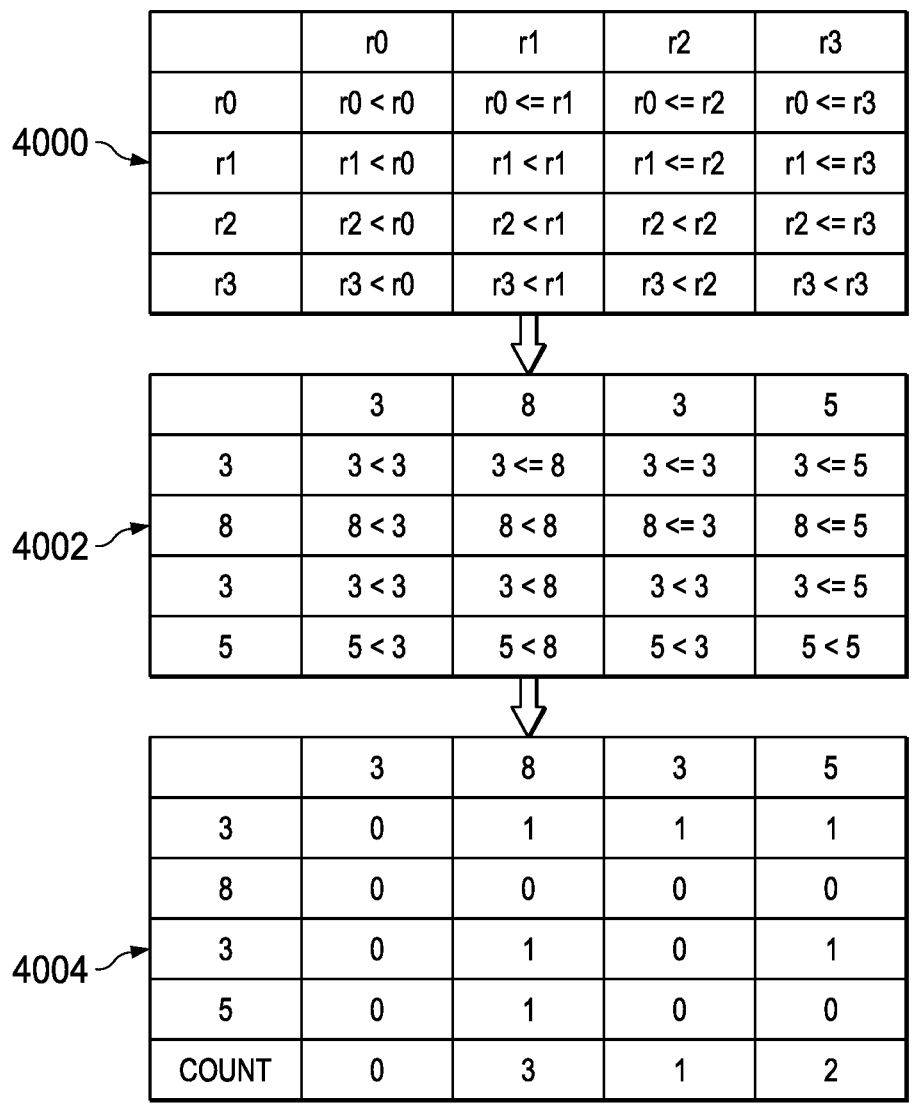

FIG. 40 illustrates the comparisons that are made for this modified approach. Table 4000 shows generically which elements are compared using "less than" and which are compared using "less than or equal to". Table 4002 shows the result of substituting the numbers from the example into table 4000. Table 4004 shows the counts resulting from the comparisons in table 4002. Note that when a comparison in table 4002 is true, a one is placed in the corresponding position in table 4004; otherwise, a zero is placed in the corresponding position. The values in each column in table 4004 are added to determine the count for each input element.

The "brute force" approach can be further simplified to reduce the number of comparisons. As can be seen from table 4000 of FIG. 40, all the comparisons on the diagonal are rn<rn, i.e., the elements are being compared to themselves. These comparisons are never true and can be eliminated. Further, each pair of numbers is compared twice. For example, in the table 4000, there is both a comparison "r1<r0" and a comparison "r0r1". Changing the second comparison to "r1r0" is the same as saying that r1 is not less than r0, "r1r0" is equivalent to !(r1<r0). Thus, as shown in the table 4100 of FIG. 41, for the four input elements, only six actual comparisons are needed. In general, for N input elements, the total number of comparisons needed is $(N^2-N)/2$.

Figure 42:
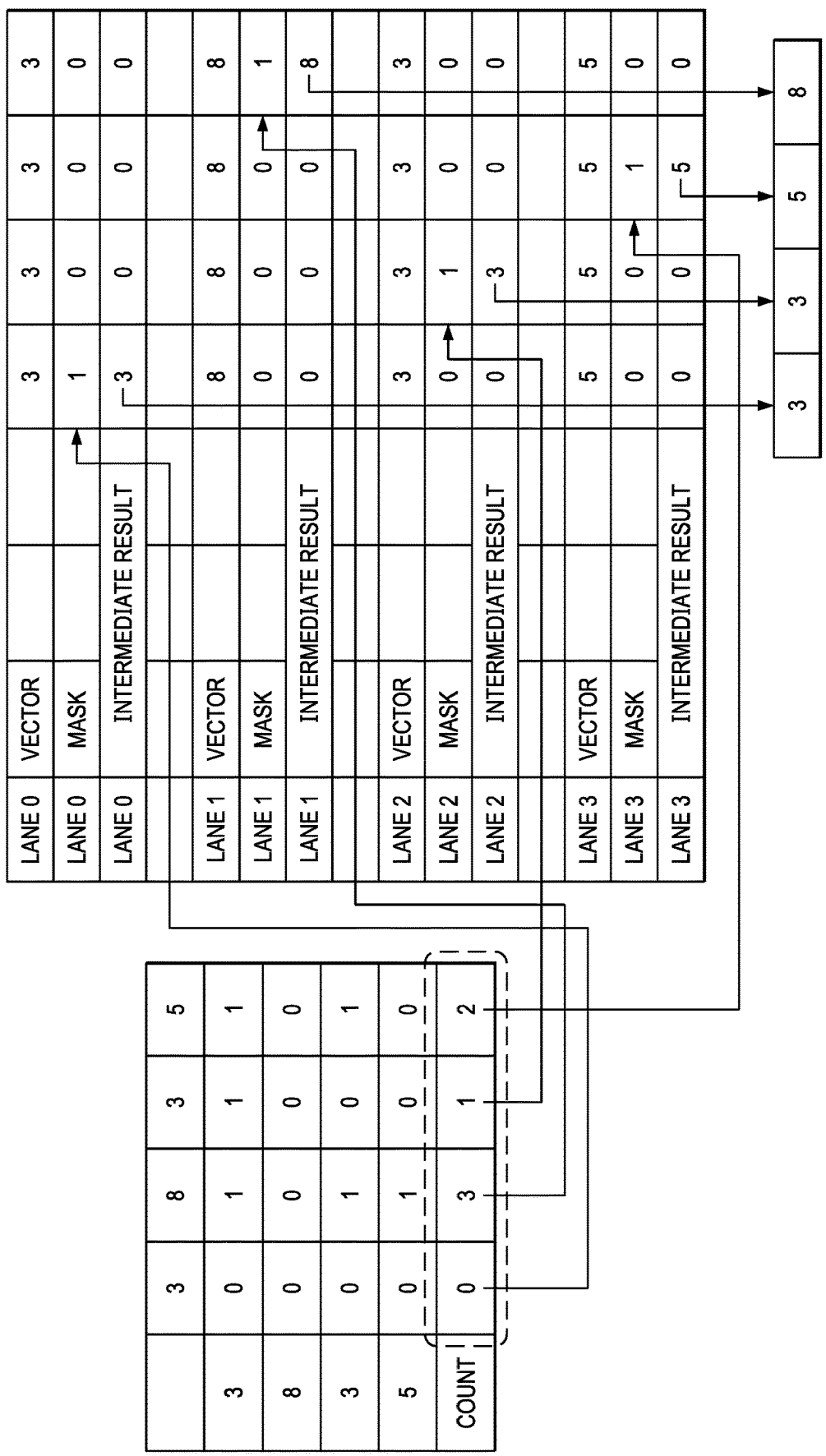
FIG. 42 illustrates a masking approach for placing sorted vector elements in output vector lanes.

Once the lanes are determined, the final step of the sort is to move the input elements into the identified lanes in the output vector. In some examples, a masking approach is used to place the elements in the output lanes. This approach is illustrated in the example of FIG. 42. For each element in the input vector, the element is duplicated across all vector lanes in a vector and a mask based on the lane position in the output vector is applied to the vector of duplicated elements to generate an intermediate vector with the element in the desired lane position and zeros in all other lane positions. The intermediate vectors are then OR'd together to produce the output vector of sorted elements.

Vector permutation logic, e.g., a permute network, if available, can also be used to move the input elements into the identified lanes of the output vector. In some examples, processing unit core 116 includes vector permutation logic that can be configured to perform any arbitrary rearrangement of any byte from any byte vector lane of a specified vector to any byte vector lane of a specified output vector responsive to control input specifying the permutation to be performed. Each byte of the vector to be permuted is controlled by a corresponding byte of the control input. In each byte of the control input, six bits referred to as byte selection bits are used to indicate which byte of the input vector should be routed to the SIMD lane corresponding to the control byte and two additional bits referred to as option control bits are used to indicate other options. Additional description of examples of such vector permutation logic can be found in commonly owned U.S. patent application Ser. No. 16/551,587, entitled "Method and Apparatus for Vector Permutation", filed Aug. 26, 2019, which is incorporated by reference herein in its entirety.

Figure 43:
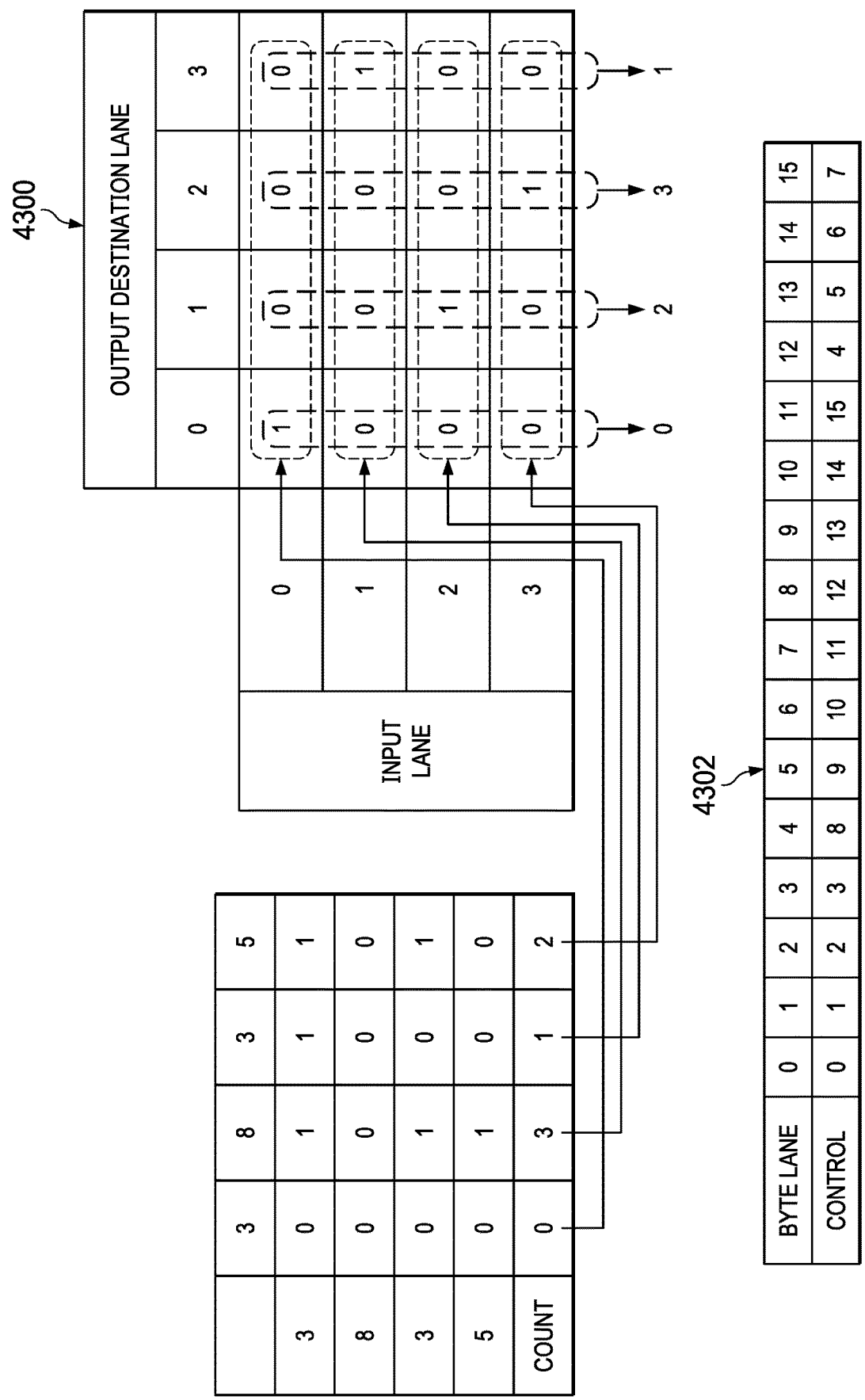
FIG. 43 illustrates a permutation approach for placing sorted vector elements in output vector lanes.

To use the vector permutation logic to generate the sorted vector, control input for a permute network is generated based on the identified output lanes for each element of the input vector. Note that the identified output lanes provide a mapping of each input lane to an output lane while the control input for the permute network needs the opposite information, i.e., the mapping of each output lane to an input lane. One solution, as illustrated in the example of FIG. 43, is to create a matrix 4300 of the mapping each input lane to the identified output lane and then take the transpose of the matrix 4300 (as indicated by the vertical ovals) to generate the mapping of each output lane to an input lane. To generate the matrix 4300, the identified output lane for each input lane is changed from an integer to a 1 hot bit vector. Each vertical oval is re-encoded to an integer indicating the mapping of the corresponding output lane to an input lane. The control input for the permute network is then created based on these integers.

Note that the example vector permutation logic operates on byte lanes. Thus, if the input and output vector lanes are larger, multiple consecutive byte lanes in the control input are encoded for each larger vector lane. For example, if the input and output vector lanes are thirty-two bits, then four consecutive byte lanes of the control input are encoded for each lane of the output vector. The table 4302 in FIG. 43 shows the resulting control input for the permute network assuming the input elements are thirty-two bits.

Note that the above described sort in increasing order can be changed to decreasing order by taking the 1's complement of the "count" for each input element, i.e., by inverting every bit of the 2's complement number. For the examples using a permute network to generate the sorted output vector, the least significant bits that describe the byte position are not inverted as the relative byte position for each byte in a word is constant.

In some examples, processing unit core 110 provides sort instructions that take as input a vector of 32-bit elements, compare the elements in the vector to determine their relationship to each other, e.g., greater than or less than, and then output a control word derived based on the results of the comparisons. The control word, when supplied as a control input to a vector permutation instruction, e.g., a VPERM instruction such as that described in the aforementioned U.S. patent application Ser. No. 16/551,587, produces the desired sorted outputs. In some examples, a VPERM instruction can be configured to perform any arbitrary rearrangement of any byte from any byte vector lane on the input to any byte vector lane on the output based on control input.

The sort instructions that output a control word are referred to as VSORTPxxx instructions where xxx is the set of combinations previously mentioned (I vs D, 16SP vs 16W vs U16W). The control word is generated as previously described here and stored in an output location specified by the instruction. Execution of VSORTPxxx input, tmp followed by VPERM tmp, input, output is the same as execution of VSORTxxx input, output. Such instructions are useful, for example, when the input vector is associated with some other pointer/property/data, Consider the example in Table 32. Assume that "input" is a vector that contains all the scores for preamble detection for each time offset, and that "related_data" contains the time offset or "guess" where the preamble starts. To the find the best candidate for the preamble, the instruction sequence shown can be performed with the result that "sorted_related_data" will contain the closest N time-offsets in that vector.

TABLE 32

Figure 44:
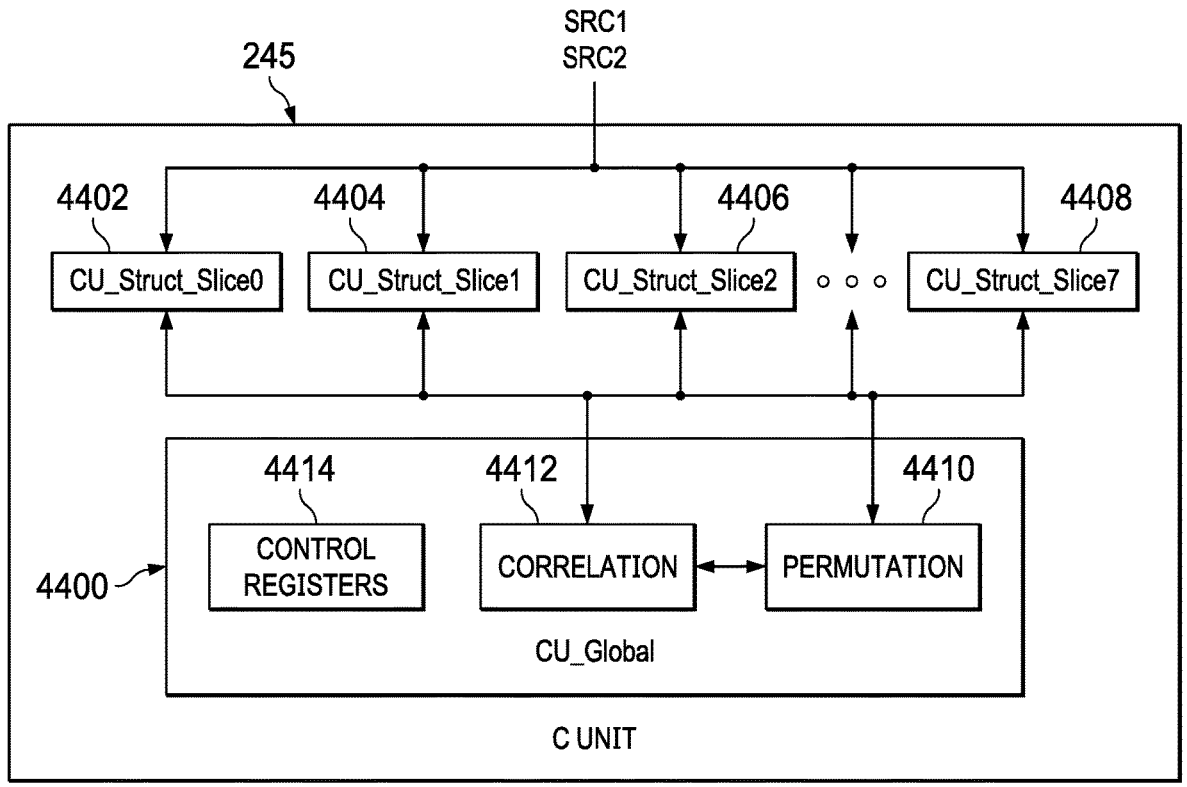
FIG. 44 illustrates a block diagram of an example C unit.

VSORTPxxx input, tmp
VPERM tmp, input, output
VPERM tmp, related_data, sorted_related_data Vector sort instructions are executed on the C unit 245 (FIG. 2), which includes sort logic for performing one or more of the above described instruction variations and permute network logic that can be used for performing vector permutation as per a control input. FIG. 44 is a block diagram of an example C unit 245. The example processing unit core 110 includes a 512-bit vector processing architecture divided into eight 64-bit vector slices. Each slice includes identical processing logic and takes a respective 64 bits of a 512-bit vector as input. The C unit 245 includes eight slice processing components 4402-4408 configured to perform operations on respective 64-bit slices of input vectors. Mux logic (not shown) routes each slice of the src1 and src2 input vectors to the respective slice processing component 4002-4008. Each slice processing component 4402-4408 includes logic to perform arithmetic operations, floating point operations, etc. on the respective 64 bits of the input vectors.

Each slice processing component 4402-4408 also includes logic to pass the respective 64-bits of the src1 and src2 input vectors to a global processing component 4400 for certain instructions such as the vector sort instructions. Components in the global processing component 4400 operate on full 512-bit vectors rather than 64-bit quantities. The global processing component 4400 includes the vector control registers CUCR0-CUCR3 4414, a correlation component 4412, and a permutation component 4410.

The permutation component 4410 is configured to perform a vector permutation instruction and any variations thereof. As is described in more detail in the previously cited U.S. patent application Ser. No. 16/551,587, the permutation component 4410 includes vector permutation logic. The vector permutation logic can be used to generate sorted output vectors based on control input generated as previously described herein.

The correlation component 4412 is configured to perform operations such as sum-of-absolute-differences (SAD), rake and search, and vector sort instructions. The correlation component 4412 includes logic that implements a class of instructions supporting SAD computation. Detailed descriptions of examples of such logic for 8-bit and 32-bit elements are provided in commonly owned U.S. Pat. No. 9,788,011, issued Oct. 10, 2017, which is incorporated by reference herein in its entirety.

Figure 45:
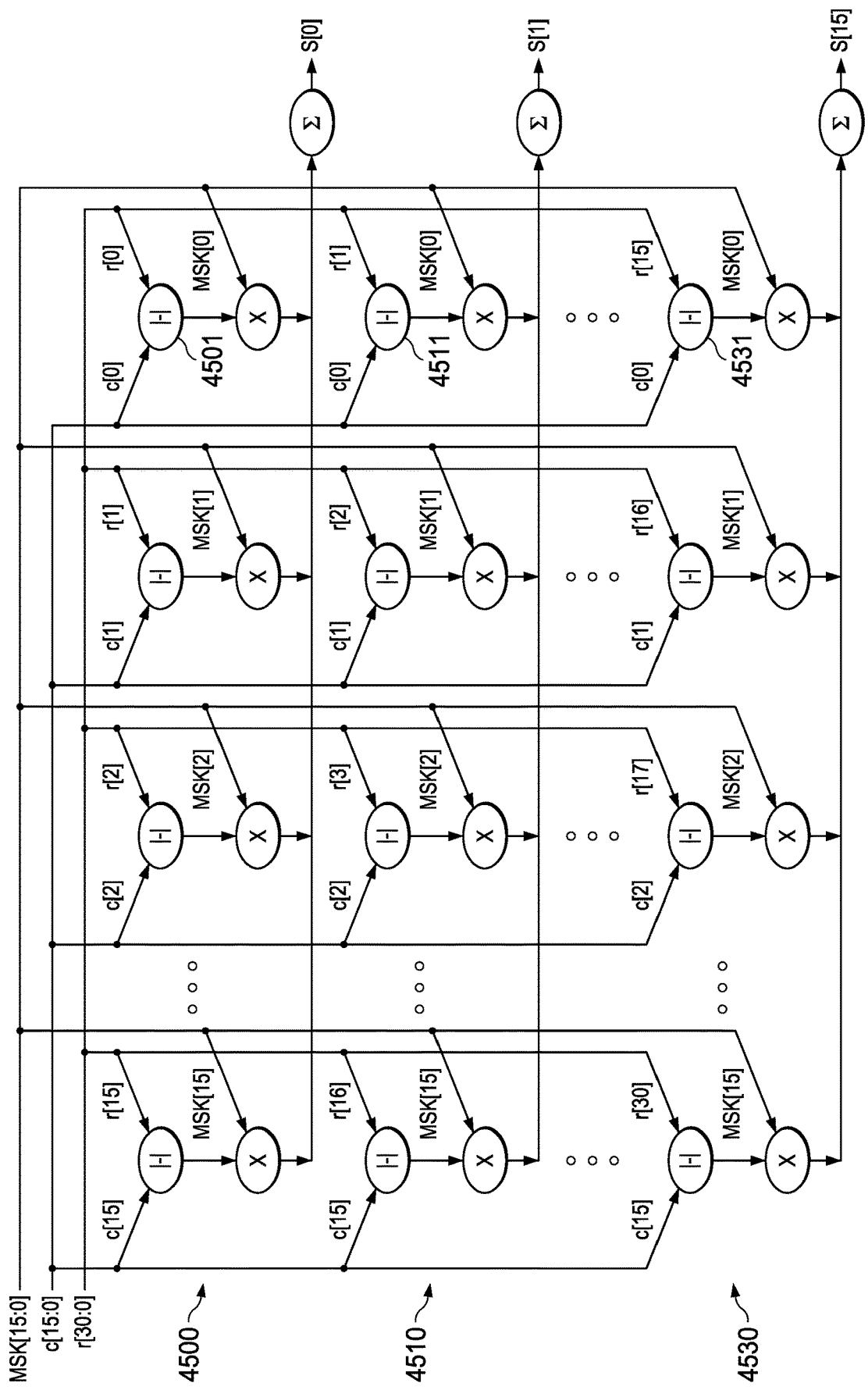
FIG. 45 illustrates example sum-of-absolute-differences (SAD) logic in the example C unit of FIG. 44.

In some examples, the "brute force" comparisons of the various sort instructions are performed using a portion of the SAD logic included in the correlation component 4412. FIG. 45 illustrates example SAD logic that operates on 16-bit elements. The SAD logic includes an array of absolute difference elements, e.g., elements 4501, 4511, 4531. Each absolute difference element performs a subtraction operation between pairs of elements of two input vectors, c and r, followed by taking the absolute value of the result of the subtraction operation. For example, absolute value difference element 4501 takes as input vector elements c[0] and r[0], subtracts c[0] from r[0], and outputs the absolute value of the result. In addition, as can be seen in the "columns" of absolute difference elements, the input element c[0] is also subtracted from elements r[1] to r[15], input element c[1] is subtracted from elements r[1] to r[16], input element c[2] is subtracted from elements r[2] to r[17], etc. In this example, the SAD logic array has sixteen rows of absolute difference elements, e.g., rows 4500, 4510, 4530, and each row has sixteen absolute difference elements.

Figure 46:
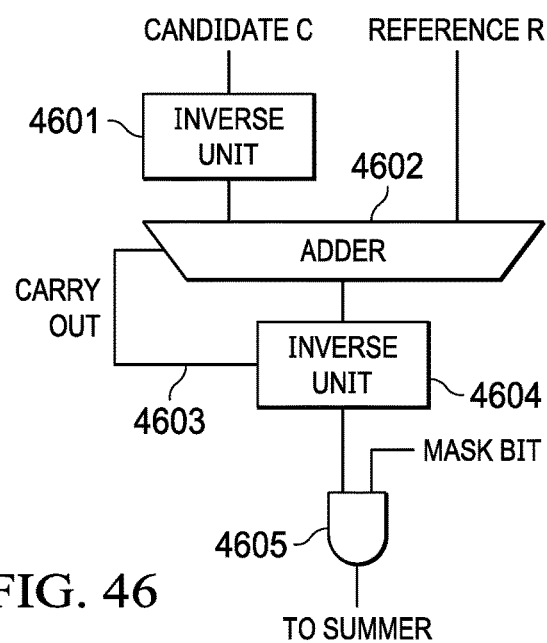
FIG. 46 illustrates an example implementation of the absolute difference elements and corresponding multipliers of the SAD logic of FIG. 45.

FIG. 46 illustrates an example implementation of the absolute difference elements and corresponding multipliers of FIG. 45. Inverse unit 4601 forms the arithmetic inverse of the input element from the c vector, e.g., by inverting the number and adding one. The addition of one is accomplished by asserting a carry input (not shown) to the lowest bit of the adder 4602. The adder 4602 adds the output of the inverse unit 4601 to the input element from the vector r and generates an active carry output 4603 if the difference between the two inputs is negative. The difference will be negative if the input element from the c vector is greater than the input element from the r vector. Inverse unit 4604 forms the arithmetic inverse the output of adder 4602 if the adder 4602 generates an active carry output 4603; otherwise inverse unit 4604 does nothing to the input. The multiplier corresponding to an absolute difference element is implemented by the AND gate 4605 as the mask input is a single bit. If the mask is one, then the absolute value is unchanged. If the mask value is zero, the absolute value is set to all zeroes. The output of the AND gate 4605 is supplied to an input of the summer of the corresponding row in FIG. 45.

For the sort operations, the array of absolute difference elements, e.g., elements 4501, 4511, 4531, are used for the needed comparisons. To perform the comparisons between elements of a vector to be sorted, the c vector and the r vector are set to elements of the same vector. The carry output 4603 is used to determine whether or not the one vector element input is less than the other vector element input. The logic in 4604 may be different depending on whether the data is signed or unsigned and may also take in to account the signs of the inputs.

Figure 47:
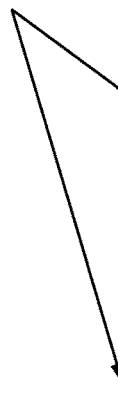
FIG. 47 illustrates the default combinations of inputs for the SAD logic of FIG. 45.

FIG. 47 illustrates the default combinations of inputs for the SAD logic of FIG. 45. Row 0 in the grid of FIG. 47 represents row 4500 of FIG. 45, row 1 in the grid represents row 4510, etc. ending with row 15 representing row 4530. The top row of the grid depicts the r vector element inputs for each column of the SAD array and the entries in the grid are the corresponding c vector element inputs for each row of the SAD array that are to be subtracted from the r vector element. For example, consider row 6. This row indicates that the first subtraction in the row is subtracting c0 from r6, the next subtraction in the row is between c1 and r7, etc.

As previously described, the VDSORTxy[U]16H instructions sort one half of the input vector according to the "x" designation and the other half according to the "y" designation. To achieve the desired comparisons for these instructions, the inputs to the array of absolute difference elements are modified as illustrated in FIG. 48. Because there is only one input operand, the vector to be sorted, "c" is replaced with "r" in this figure. The comparisons in columns r0 through r15 are the comparisons between all unique pairs of the elements r0 to r15 and the comparisons in columns r16 through r30 are the comparisons between all unique pairs of the elements r17 to r31.

Figure 49:
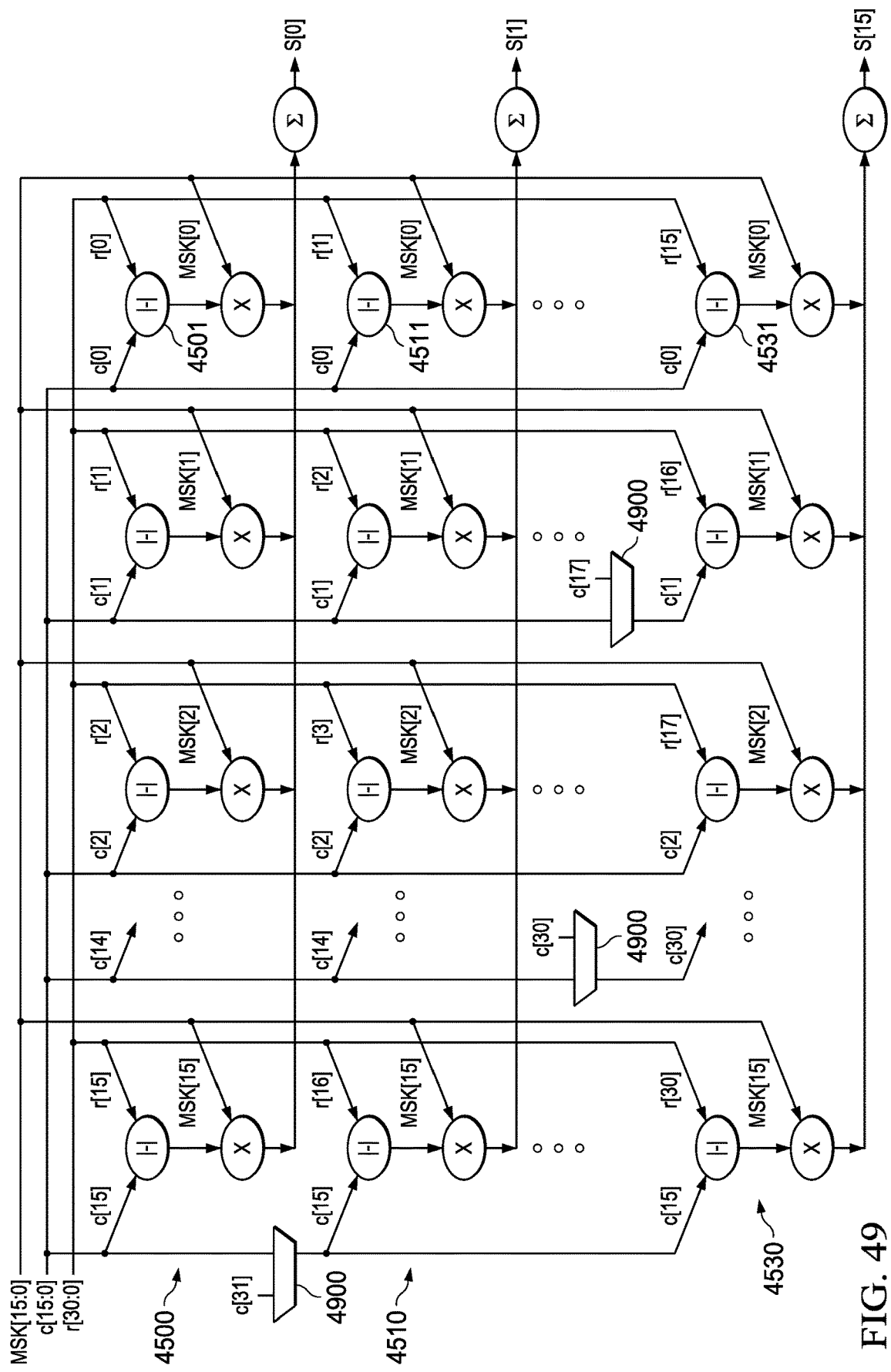
FIG. 49 illustrates a modification to the SAD logic of FIG. 45 to achieve the inputs of FIG. 48.

As illustrated in FIG. 49, a single multiplexor 4900 on the internal "Cx" operand is used to select on the internal buses inside the array of absolute difference elements. The output of the mux 4900 is broadcast to the down-stream absolute difference elements (comparators). The single multiplexor 4900 muxes between the elements r1 to r15 versus element r17 through r3I to select the inputs for each absolute difference element. In FIG. 49, the single multiplexor 4900 is represented by several small multiplexors labelled with the same reference number in order to illustrate the connectivity to the absolute difference elements.

Figure 50:
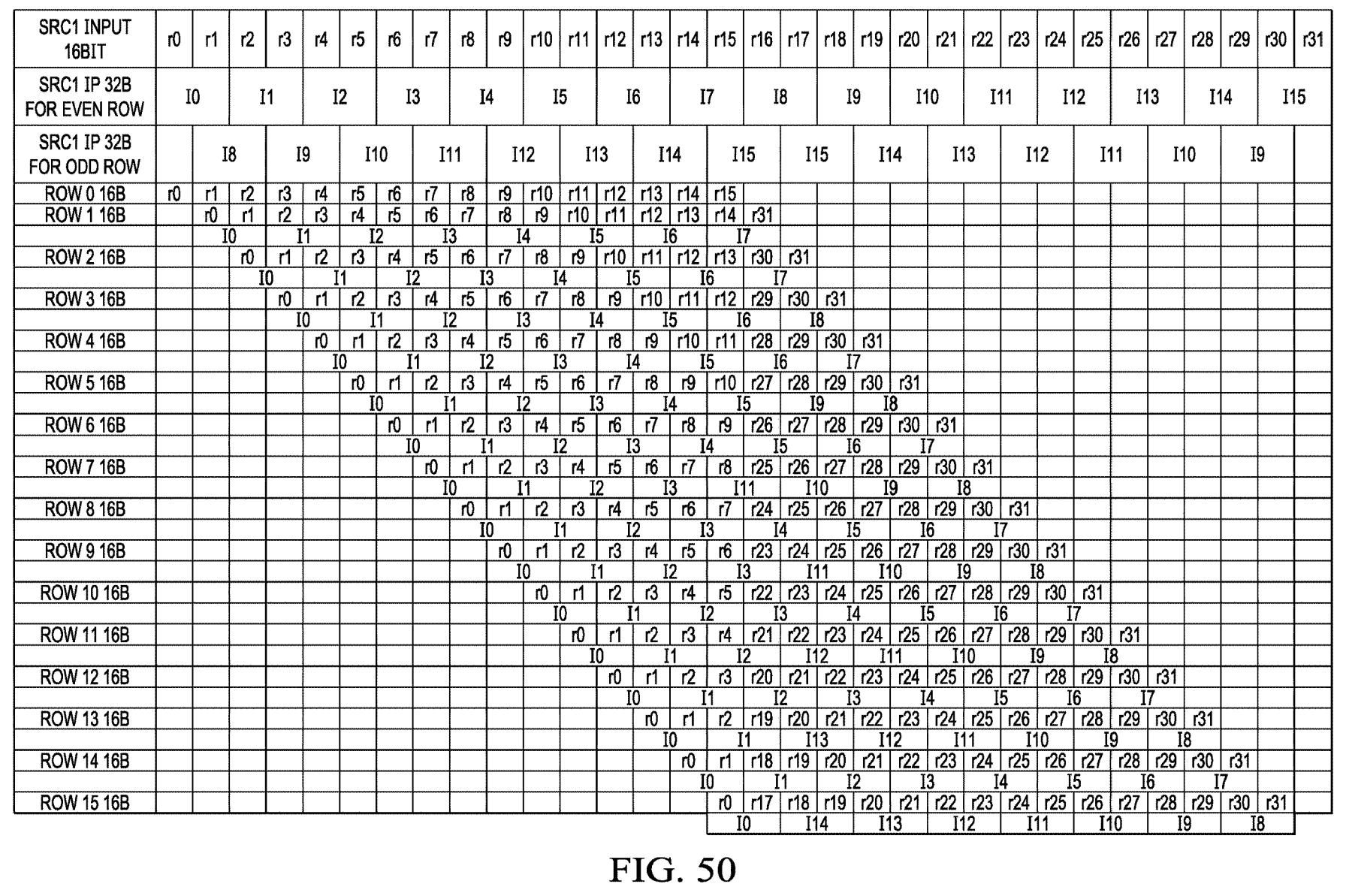

As previously described, the sort instructions other than the VDSORTxy[U]16H instructions operate on 32-bit elements. FIG. 50 illustrates the inputs to the array of absolute difference elements if the elements are 32-bit quantities. Two adjacent 16-bit comparisons are used to construct a 32-bit compare, e.g., the comparison of a pair of half-words of the 32-bit elements (r0,r1) to (r2, r3) provides the information needed to compare I0 and I1, where I0 and I1 are the 32-bit quantities given by the sets of half-words. The adjacent compares in the "odd" rows are not useful, e.g., the comparison of (r0,r1) to (r1,r2) does not have any meaning since (r1,r2) has the high half of 10 in r1, and the low half of 11 in r2. The odd rows are removed and replaced with other needed comparisons. The thirty-two bit elements corresponding to each of the labeled rows are shown in unlabeled rows immediately below each labeled row.

Figure 51:
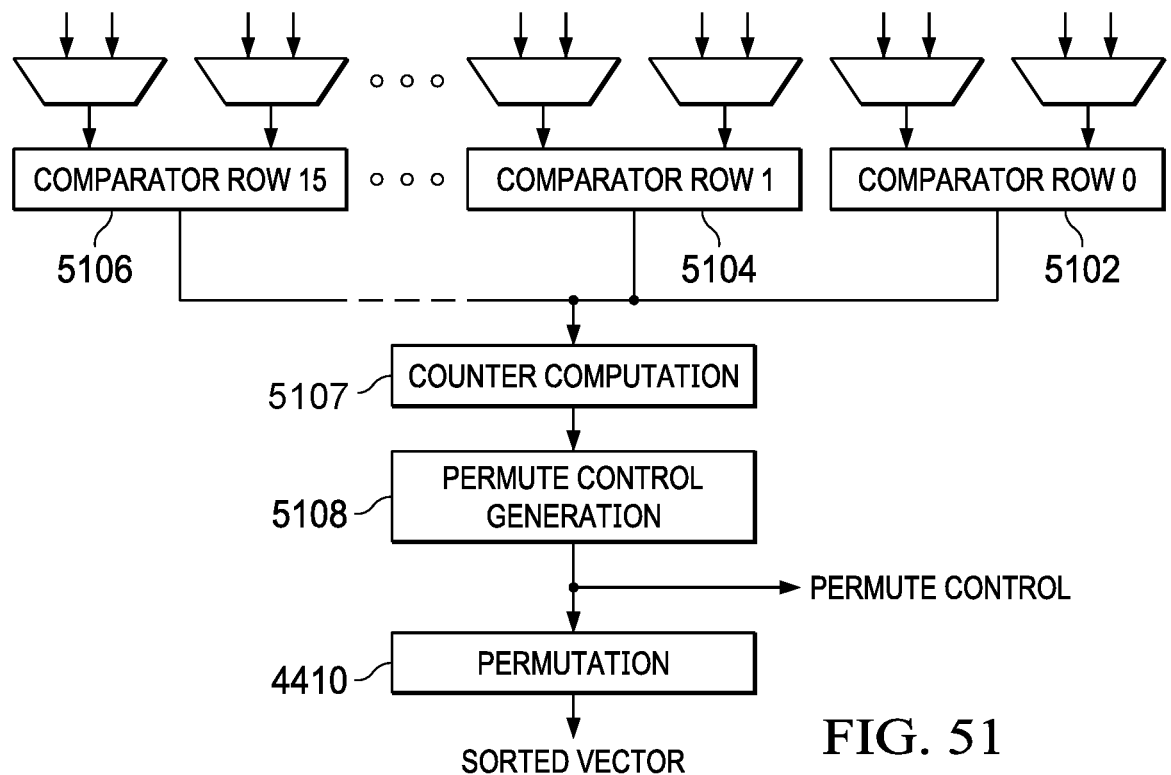
FIG. 51 illustrates a block diagram of implementation of one or more of the vector sort instructions in the global processing component of the C unit of FIG. 44.

FIG. 51 illustrates a block diagram of an example implementation of one or more of the aforementioned sort instructions in the global processing component 4400. Sixteen comparator rows 5102, 5104, 5106, e.g., comparator logic, are configured to receive vector elements to be compared via respective muxes. Each comparator row 5102, 5104, 5106 is a row of absolute difference elements in the SAD logic of FIG. 49, e.g., comparator row 0 5102 is row 4500, comparator row 1 is row 4510, etc. The muxes are configured to select the vector elements for the respective comparator rows 5102, 5104, 5106 in accordance with FIG. 48 for 16-bit elements and with FIG. 50 for 32-bit elements. The results of the comparisons performed by the comparator rows 5102, 5104, 5106 are provided to vector sort logic that includes a counter computation component 5107, a permute control generation component 5108, and a permutation component 4410.

The counter computation component 5107 is configured to receive results of the comparisons performed by the comparator rows 5102, 5104, 5106 and to use the results to determine a count for each vector element. Determining a count for each vector element given the comparison results from the comparator rows 5102, 5104, 5106 is previously described herein in reference to FIGS. 40 and 41. As previously described herein, the count for an input vector element is the lane number for the vector element in the output vector.

The permute control generation component 5108 is configured to generate control input for a permute network based on the identified output lane number for each input vector element. Generation of control input given the lane numbers is previously described herein in reference to FIG. 43. The permute control generation component 5108 is further configured to output the control input as the output vector if the sort instruction being executed is a VSORTPxxx instruction. The permute control generation component 5108 is also configured to provide the control input and the input vector to the permutation component 4410 for other sort instructions. The permutation component 4410 is configured to generate the sorted output vector based on the control input.

Figure 52:
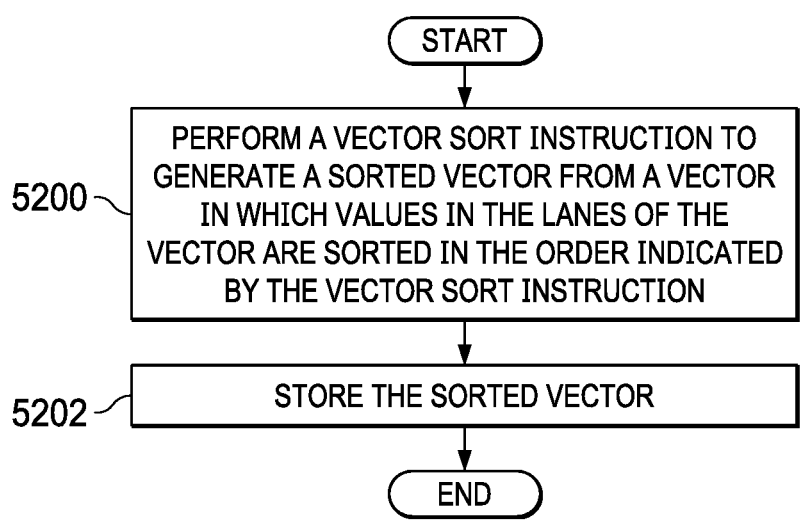
FIGS. 52, 53, and 54 are methods for vector sorting.

FIG. 52 is a flow diagram of a method for sorting of a vector that can be performed by a processor, e.g., processing unit core 110. In this method, a vector sort instruction is performed 5200 by the processor to generate a sorted vector from a vector in which values in the lanes of the vector are sorted in an order indicated by the vector sort instruction. The sorted vector is then stored 5202 in a location specified by the vector sort instruction. Examples of such vector sort instructions are previously described herein.

Figure 53:
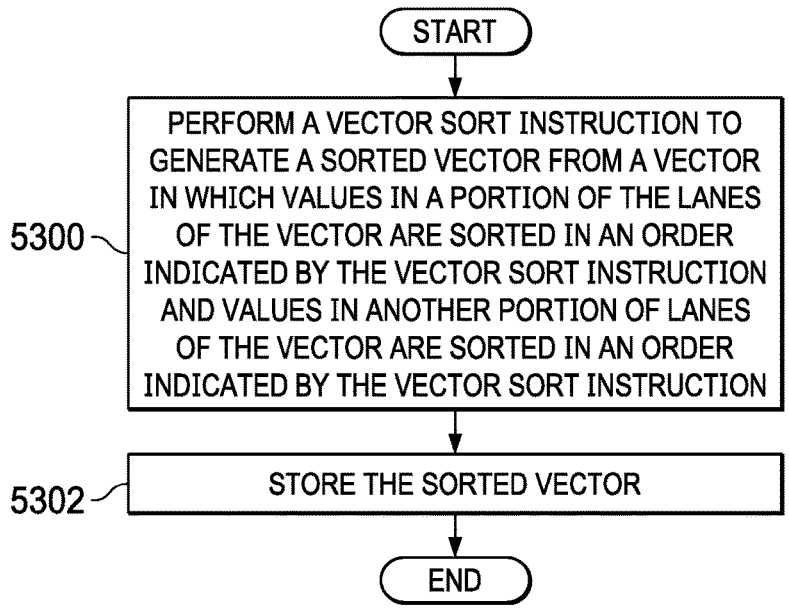

FIG. 53 is a flow diagram of a method for sorting of a vector that can be performed by a processor, e.g., processing unit core 110. In this method, a vector sort instruction is performed 5300 by the processor to generate a sorted vector from a vector in which values in a portion of the lanes of the vector are sorted in an order indicated by the vector sort instruction and values in another portion of the lanes of the vector are sorted in an order indicated by the vector sort instruction. The sorted vector is then stored 5302 in a location specified by the vector sort instruction. Examples of such vector sort instructions are previously described herein.

Figure 54:
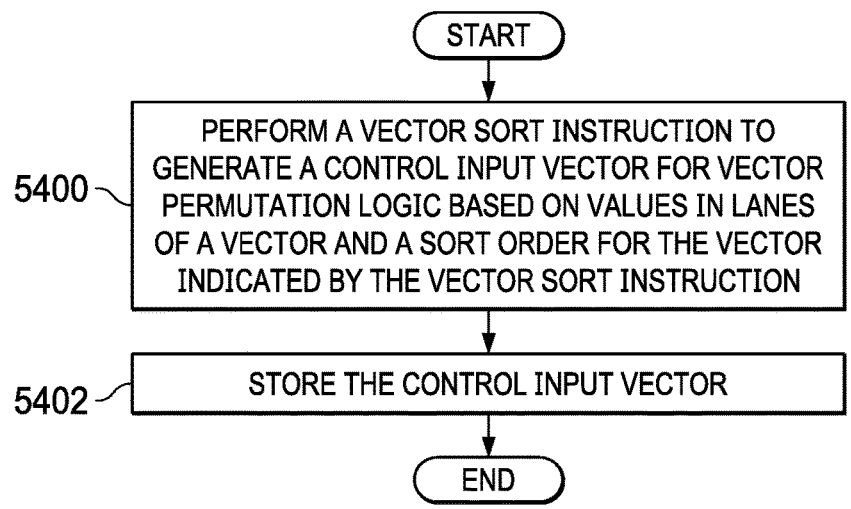

FIG. 54 is a flow diagram of a method for sorting of a vector that can be performed by a processor, e.g., processing unit core 110. In this method, a vector sort instruction is performed 5400 by the processor to generate a control input vector for vector permutation logic based on values in the lanes of a vector and a sort order for the vector indicated by the vector sort instruction. The control input vector is then stored 5402 in a location specified by the vector sort instruction. Examples of such vector sort instructions are previously described herein.

Figure 55:
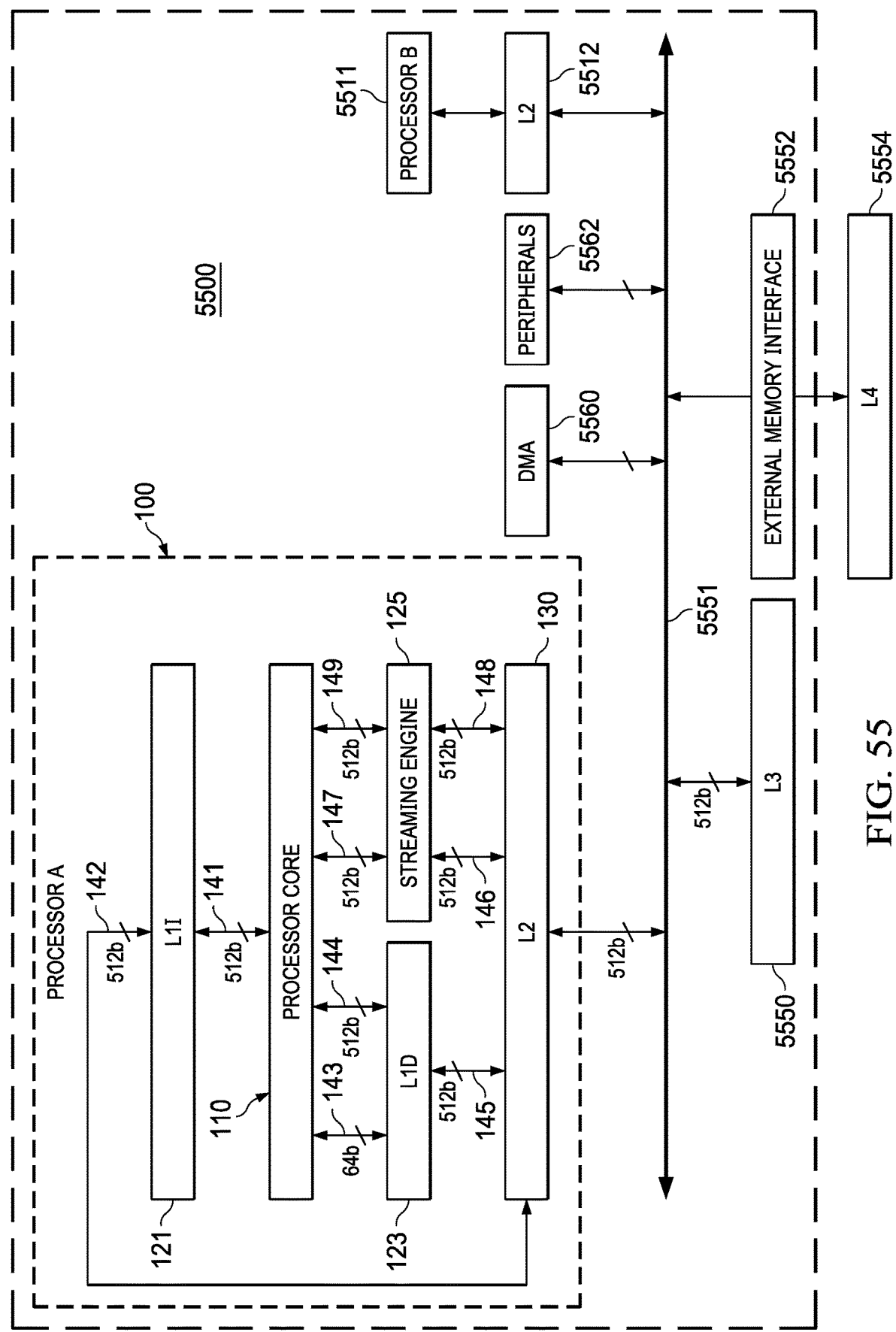
FIG. 55 is a block diagram of a multiprocessor system.

FIG. 55 illustrates an example multiprocessor system. In this example, SoC 5500 includes processor 100 (FIG. 1) (referred to as "processor A") and it is combined with a second processor 5511 (referred to as "processor B"). Each processor is coupled to a block of shared level three (L3) memory 5550 via bus 5551. Processor B includes a block of unshared level two memory 5512. A direct memory access (DMA) engine 5560 may be programmed to transfer blocks of data/instructions from L3 memory to L2 memory 130 or L2 memory 5512 using known or later developed DMA techniques. Various types of peripherals 5562 are also coupled to memory bus 5551, such as wireless and/or wired communication controllers, etc.

In this example, processor A, processor B, L3 memory 5550 are all included in a SoC 5500 that may be encapsulated to form a package that may be mounted on a substrate such as a printed circuit board (PCB) using known or later developed packaging techniques. For example, SoC 5500 may be encapsulated in a ball grid array (BGA) package. In this example, external memory interface (EMI) 5552 allows additional external bulk memory 5554 to be accessed by processor A and/or processor B.

In this example, processor B is an ARM® processor that may be used for scalar processing and control functions. In other examples, various types of known or later developed processors may be combined with DSP 100. While two processors are illustrated in this example, in another example, multiple copies of DSP 100 and/or multiple copies of processor B may be included within an SoC, in which the DSP 100 copies include support for one or more of the vector sort instructions described herein.

OTHER EMBODIMENTS

While the disclosure has been described with respect to a limited number of embodiments, other embodiments can be devised which do not depart from the scope of the disclosure herein.

For example, instructions have been described herein in which two halves of a vector are sorted independently, e.g., VDSORTxy[U]16H. In other examples, the independent sort regions in the vector may be different sizes and/or there may be more than two independent sort regions.

In another example, examples of sort instructions are described herein assuming 512-bit vectors and either 16-bit or 32-bit elements/lanes. In other examples, the vectors may be smaller or larger and/or the size of the elements may be larger or smaller.

It is therefore contemplated that the appended claims will cover any such modifications of the embodiments as fall within the true scope of the disclosure.

What is claimed is:

1. A method comprising:
loading, by a processor in response to a first vector load instruction, a first set of vector values in a first global vector register, wherein the first set of vector values is received over a first bus from a first data stream of a streaming engine coupled to the processor;
loading, by the processor in response to a second vector load instruction, a second set of vector values in a second global vector register, wherein the second set of vector values is received over a second bus from a second data stream of the streaming engine coupled to the processor, wherein loading the first set of vector values and loading the second set of vector values occurs in parallel;
performing, by the processor in response to a first vector sort instruction, a first sorting of values stored in lanes of the first global vector register to generate a first set of values having a first order, the first set of values stored in a first local vector register;
performing, by the processor in response to a second vector sort instruction, a second sorting of values stored in lanes of the second global vector register to generate a second set of values having a second order, the second set of values stored in a second local vector register;
performing, by the processor, a swapping function that includes:
performing, in response to a first comparison instruction, a first set of comparisons of each lane of the first local vector register with a corresponding lane of the second local vector register to determine a third set of values having the smaller value between each respective lane comparison of the first set of comparisons, wherein the third set of values is stored in the first local vector register; and
performing, in response to a second comparison instruction, a second set of comparisons of each lane of the first local vector register with a corresponding lane of the second local vector register to determine a fourth set of values having the larger value between each respective lane comparison of the second set of comparisons, wherein the fourth set of values is stored in the second local vector register;
wherein the first set of comparisons and the second set of comparisons are performed in parallel;
performing a third sorting, by the processor in response to a third vector sort instruction, of the third set of values in increasing order to generate a fifth set of values;
performing a fourth sorting, by the processor in response to a fourth vector sort instruction, of the fourth set of values in increasing order to generate a sixth set of values;
storing, by the processor, the fifth set of values in a third global vector register; and
storing, by the processor, the sixth set of values in a fourth global vector register.

2. The method of claim 1, where the first order and the second order are different.

3. The method of claim 1, wherein the first sorting of values and the second sorting further comprises sorting values selected from half precision floating point numbers, fixed point numbers, and integers.

4. The method of claim 1, wherein each value in the first, second, third, fourth, fifth, and sixth sets of values is a 16-bit value.

5. The method of claim 1, wherein the first vector sort instruction and the second vector sort instruction indicate by an operand a register to store a result of the first vector sort instruction or the second vector sort instruction.

6. The method of claim 1, wherein the first set of comparisons and the second set of comparisons include using comparator logic comprised in the processor.

7. The method of claim 6, wherein the first set of comparisons and the second set of comparisons include determining a count for each value based on results of the first set of comparisons and the second set of comparisons and converting each count to a lane number, wherein the count associated with the first set of comparisons corresponds to lane numbers of the first local vector register, and the count associated with the second set of comparisons corresponds to lane numbers of the second local vector register.

8. The method of claim 7, further comprising converting the lane numbers into control input for vector permutation logic comprised in the processor, wherein the vector permutation logic generates a sorted vector based on the control input.

9. The method of claim 6, wherein the comparator logic comprises an array of absolute difference elements.

10. The method of claim 9, wherein the array of absolute difference elements are configured to be used for sum of absolute difference computations and for comparison computations.

11. A processor comprising:
in response to a first vector load instruction, a first global vector register configured to storea first set of vector values received over a first bus from a first data stream of a streaming engine coupled to the processor;
in response to a second vector load instruction, a second global vector register configured to store a second set of vector values received over a second bus from a second data stream of the streaming engine coupled wherein the first set of vector values and the second set of vector values are loaded in parallel;
first vector sorting logic configured to:
perform, in response to a first vector sort instruction, a first sorting of values stored in lanes of the first global vector register to generate a first set of values having a first order, the first set of values stored in a first local vector register; and
perform, in response to a second vector sort instruction, a second sorting of values stored in lanes of the second global vector register to generate a second set of values having a second order, the second set of values stored in a second local vector register;
comparator logic configured to compare values in lanes of a vector responsive to a vector sort instruction;
vector swap logic configured to:
perform, in response to a first comparison instruction, a first set of comparisons of each lane of the first local vector register with a corresponding lane of the second local vector register to determine a third set of values having the smaller value between each respective lane comparison of the first set of comparisons, wherein the third set of values stored in the first local vector register; and
perform, in response to a second comparison instruction, a second set of comparisons of each lane of the first local vector register with a corresponding lane of the second local vector register to determine a fourth set of values having the larger value between each respective lane comparison of the second set of comparisons, wherein the fourth set of values is stored in the second local vector register;
second vector sorting logic configure to:
perform, in response to a third vector sort instruction, a third sorting of the third set of values in increasing order to generate a fifth set of values; and
perform, in response to a fourth vector sort instruction, a fourth sorting of the fourth set of values in increasing order to generate a sixth set of values;
wherein the fifth set of values is stored in a third global vector register, and the sixth set of values is stored in a fourth global vector register.

12. The processor of claim 11, where the first order and the second order are different.

13. The processor of claim 11, wherein the first vector sorting logic is further configured to sort at one selected from half precision floating point numbers, fixed point numbers, and integers.

14. The processor of claim 11, wherein each of the first, second, third, fourth, fifth, and sixth values are 16-bit values.

15. The processor of claim 11, wherein the first vector sorting logic and the second vector sorting logic is further configured to determine a count for each value based on results of comparisons and to convert each count to an associated lane number of one of the first local vector register, the second local vector register, the third global vector register, and the fourth global vector register.

16. The processor of claim 15, further comprising vector permutation logic configured to generate a sorted vector based on control input and wherein the first vector sorting logic is further configured to convert the lane numbers into the control input.

17. The processor of claim 11, wherein the comparator logic comprises an array of absolute difference elements.

18. The processor of claim 17, wherein the array of absolute difference elements are configured to be used for sum of absolute difference computations and for comparison computations.

* * * * *